(12) United States Patent
Owada

(10) Patent No.: US 9,685,453 B2
(45) Date of Patent: Jun. 20, 2017

(54) METHOD OF MANUFACTURING A NONVOLATILE MEMORY CELL AND A FIELD EFFECT TRANSISTOR

(71) Applicant: Renesas Electronics Corporation, Koutou-ku, Tokyo (JP)

(72) Inventor: Fukuo Owada, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/201,609

(22) Filed: Jul. 4, 2016

(65) Prior Publication Data

US 2016/0315093 A1 Oct. 27, 2016

Related U.S. Application Data

(63) Continuation of application No. 14/828,046, filed on Aug. 17, 2015, now abandoned.

(30) Foreign Application Priority Data

Aug. 27, 2014 (JP) ................................. 2014-172680

(51) Int. Cl.
| | | |
|---|---|---|
| *H01L 21/8238* | (2006.01) | |
| *H01L 27/11575* | (2017.01) | |
| *H01L 29/66* | (2006.01) | |
| *H01L 21/265* | (2006.01) | |
| *H01L 21/266* | (2006.01) | |
| *H01L 21/311* | (2006.01) | |
| *H01L 27/1157* | (2017.01) | |
| H01L 27/11573 | (2017.01) | |
| *H01L 23/525* | (2006.01) | |
| *H01L 27/112* | (2006.01) | |
| *H01L 27/11568* | (2017.01) | |

(52) U.S. Cl.
CPC ...... *H01L 27/11575* (2013.01); *H01L 21/265* (2013.01); *H01L 21/266* (2013.01); *H01L 21/31111* (2013.01); *H01L 21/31116* (2013.01); *H01L 23/5256* (2013.01); *H01L 27/1157* (2013.01); *H01L 27/11206* (2013.01); *H01L 27/11568* (2013.01); *H01L 27/11573* (2013.01); *H01L 29/66833* (2013.01)

(58) Field of Classification Search
CPC ... H01L 21/105; H01L 27/105; H01L 27/115; H01L 27/11521; H01L 27/11526; H01L 27/11206; H01L 27/11568; H01L 27/11573
See application file for complete search history.

(56) References Cited

U.S. PATENT DOCUMENTS

| | | |
|---|---|---|
| 7,601,581 B2 | 10/2009 | Taniguchi et al. |
| 2015/0249145 A1 | 9/2015 | Yoshimori |

FOREIGN PATENT DOCUMENTS

JP 2007-234861 A 9/2007

*Primary Examiner* — Hoai V Pham
(74) *Attorney, Agent, or Firm* — Shapiro, Gabor and Rosenberger, PLLC

(57) ABSTRACT

To provide a semiconductor device having mix-loaded therein a nonvolatile memory cell and a field effect transistor at a reduced cost. A method of manufacturing a semiconductor device includes pattering a conductor film by using an additional mask that covers a gate electrode formation region of a memory formation region and exposes a main circuit formation region (field effect transistor formation region) and thereby forming a gate electrode of a nonvolatile memory cell in the memory formation region and then forming an n⁻ type semiconductor region of the nonvolatile memory cell in a semiconductor substrate by ion implantation using the above-mentioned additional mask without changing it to another one.

17 Claims, 66 Drawing Sheets

FIG. 7
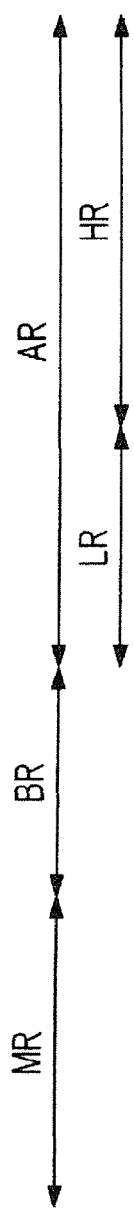
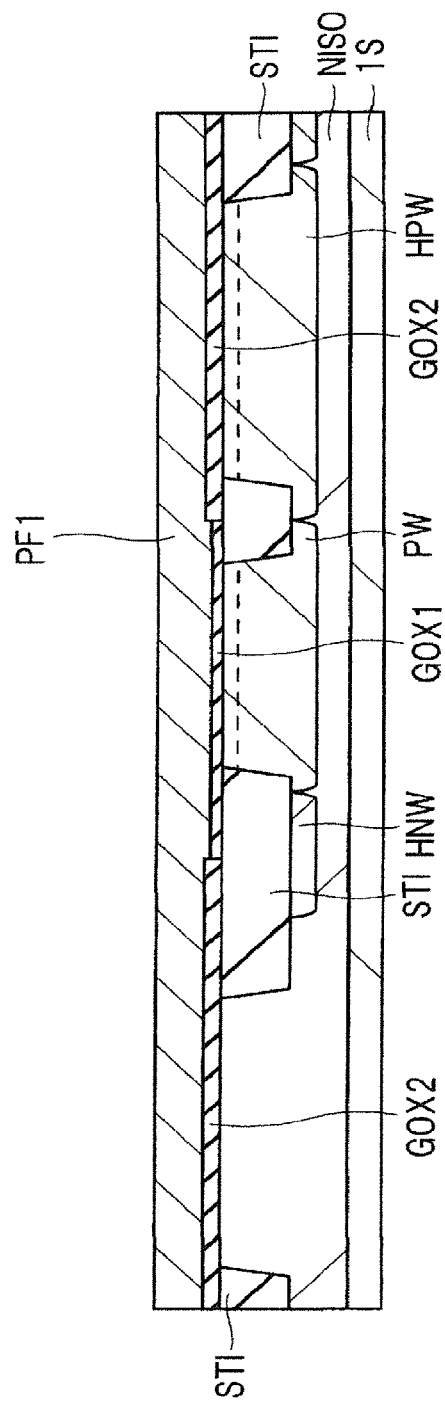

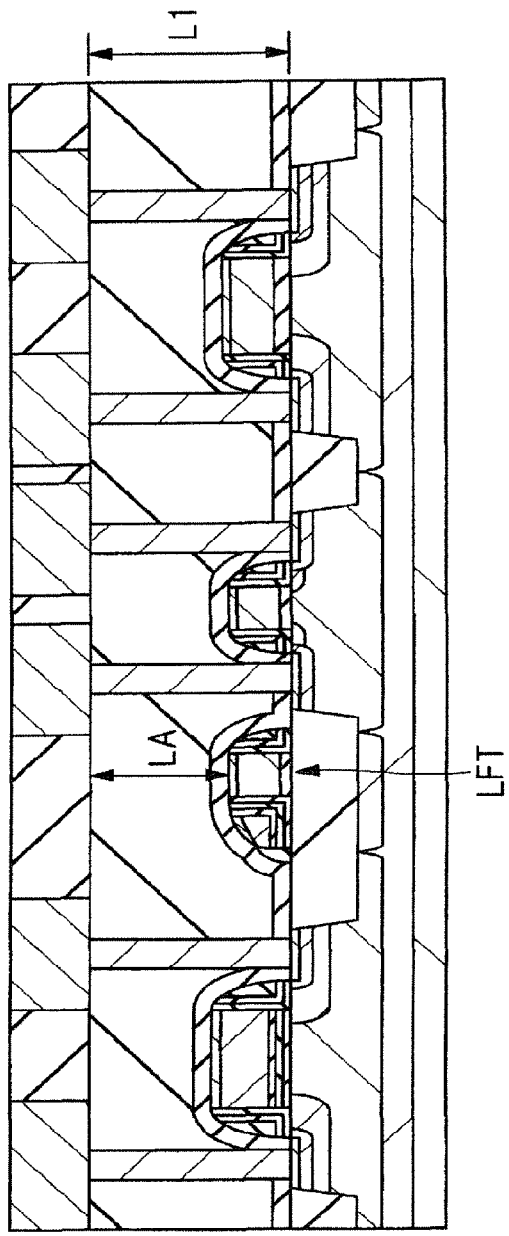
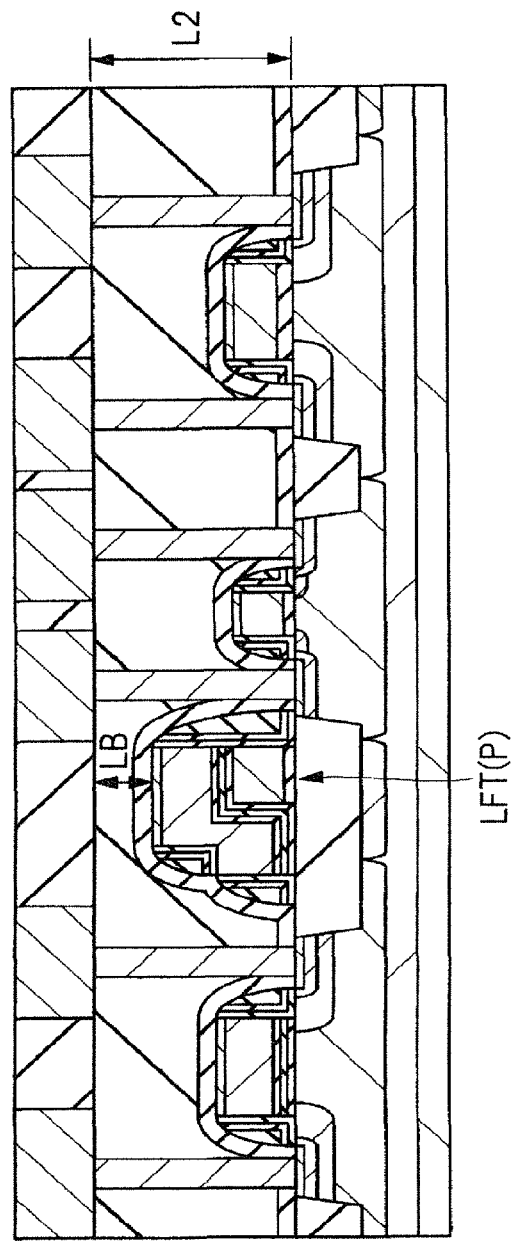
FIG. 21A
FIG. 21B

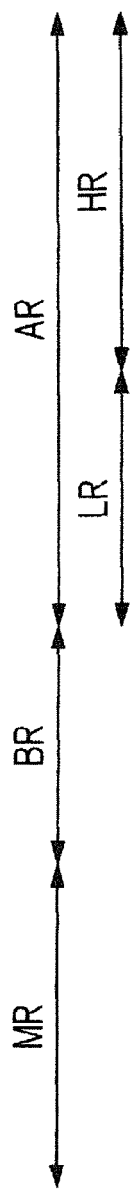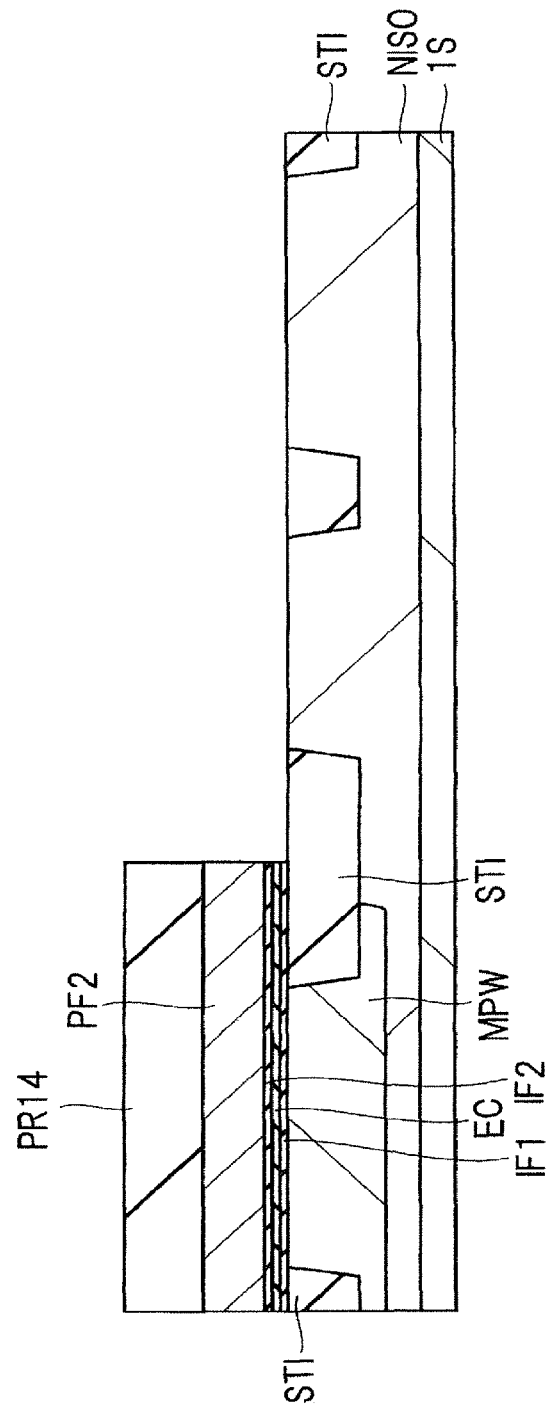
FIG. 53

METHOD OF MANUFACTURING A NONVOLATILE MEMORY CELL AND A FIELD EFFECT TRANSISTOR

CROSS-REFERENCE TO RELATED APPLICATIONS

The disclosure of Japanese Patent Application No. 2014-172680 filed on Aug. 27, 2014 including the specification, drawings, and abstract is incorporated herein by reference in its entirety.

BACKGROUND

The present invention relates to a manufacturing technology of a semiconductor device, for example, a technology effective when applied to a manufacturing technology of a semiconductor device having a main circuit including a field effect transistor and a nonvolatile memory as an add-on circuit.

Japanese Unexamined Patent Application Publication No. 2007-234861 (Patent Document 1) describes a technology of manufacturing a semiconductor device by forming a gate electrode of a field effect transistor and a gate electrode of a nonvolatile memory cell by respectively different steps, in which the field effect transistor and the nonvolatile memory cell can have improved reliability.
[Patent Document 1] Japanese Unexamined Patent Application Publication No. 2007-234861

SUMMARY

Semiconductor devices having a main circuit including a field effect transistor sometimes have, in addition to the main circuit for achieving the main function of the semiconductor device, an addition circuit (add-on circuit) to be added to the main circuit. Examples of the addition circuit include electronic fuses to be used for trimming or relief of the main circuit and memories for storing trimming information.

Now, one of the most popular electronic fuses is an OTP (one time program) type electronic fuse that achieves [0]/[1] by the application of a large current to a polysilicon film to physically fuse it. In recent years, there has been an increasing demand for an MTP (multi time program) type electronic fuse that can be adjusted in repetition by making use of a rewritable nonvolatile memory.

Now, as a memory for storing trimming information, used is a nonvolatile memory (NV memory) having a floating gate structure and suited for mix-loading with a field effect transistor included in a main circuit. Using such a nonvolatile memory increases the size of a memory cell so that a shift to a nonvolatile memory capable of downsizing a memory cell is under investigation.

Under such a situation, using a nonvolatile memory having a MONOS (metal oxide nitride oxide semiconductor) structure as an addition circuit has been studied. When the nonvolatile memory having a MONOS structure is used as an addition circuit, a manufacturing step of a main circuit including a field effect transistor should incorporate therein a manufacturing step of the nonvolatile memory having a MONOS structure. This may raise a manufacturing cost of a semiconductor device. More specifically, mix-loading of the nonvolatile memory having a MONOS structure with the field effect transistor of the main circuit increases the number of masks. There is therefore a demand for reducing the number of masks to be added and thereby reducing the manufacturing cost of the semiconductor device.

Another problem and novel features will be apparent from the description herein and accompanying drawings.

In a method of manufacturing a semiconductor device according to one embodiment, a gate electrode of a nonvolatile memory cell is formed in a memory formation region by patterning a conductor film with a mask that covers a gate electrode formation region of the memory formation region and exposes an MISFET formation region (field effect transistor formation region); and then, an n⁻ type semiconductor region of the nonvolatile memory cell is formed in a semiconductor substrate by ion implantation using the above-mentioned mask without changing it to another one.

In a method of manufacturing a semiconductor device according to another embodiment, a gate electrode of a nonvolatile memory cell is formed in a memory formation region by patterning a conductor film with a mask that covers a gate electrode formation region of the memory formation region and exposes an MISFET formation region; and then, an n⁻ type semiconductor region of the nonvolatile memory cell is formed in a semiconductor substrate by ion implantation using, as a mask, the gate electrode of the nonvolatile memory cell exposed by removing the above-mentioned mask.

According to the above-mentioned embodiments, a semiconductor device having both a nonvolatile memory cell and a field effect transistor can be manufactured at a reduced cost.

BRIEF DESCRIPTION OF THE DRAWINGS

FIG. 7 is a cross-sectional view showing a manufacturing step of the semiconductor device of First Embodiment;

FIG. 21A shows a residue pattern formed in a boundary region in First Embodiment and FIG. 21B shows a technology of leaving a resist film in a boundary region and intentionally forming a large residue pattern;

FIG. 53 is a cross-sectional view showing a manufacturing step of the semiconductor device following that of FIG. 52;

Figure 1:
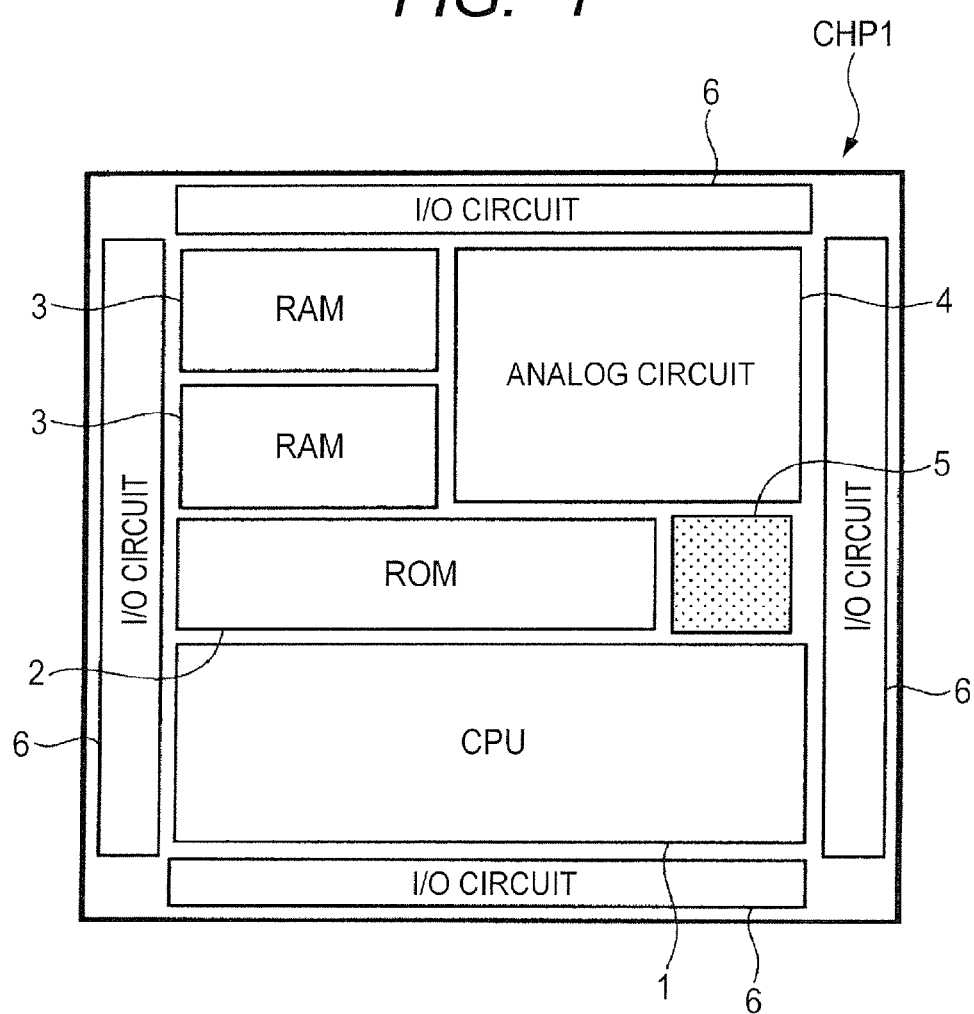
FIG. 1 shows a layout configuration example of a semiconductor chip of First Embodiment.

In the following embodiments, a description may be made after divided in a plurality of sections or embodiments if necessary for the sake of convenience. These sections or embodiments are not independent from each other unless otherwise particularly specified, but one of them may be a modification example, detailed description, complementary description, or the like of a part or whole of the other one.

In the following embodiments, when a reference is made to the number of elements (including the number, value, amount, range, or the like), the number is not limited to a specific number but may be more or less than the specific number, unless otherwise particularly specified or principally apparent that the number is limited to the specific number.

Further, it is needless to say that in the following embodiments, the constituent component (including component step or the like) is not always essential unless otherwise particularly specified or principally apparent that it is essential.

Similarly, in the following embodiments, when a reference is made to the shape, positional relationship, or the like of the constituent component, that substantially approximate or analogous to it is also embraced unless otherwise particularly specified or principally apparent that it is not. This also applies to the above-mentioned number or range.

In all the drawings for describing the embodiments, members having the same function will be identified by the same reference numerals and overlapping descriptions will be omitted. Even a plan view may be hatched to facilitate understanding of it.

FIRST EMBODIMENT

The technical concept in First Embodiment is a technical concept on a semiconductor device having, in one semiconductor chip, a main circuit for achieving a main function of the semiconductor chip and an addition circuit to be added to the main circuit and called "add-on circuit" and having, as the add-on circuit, a MONOS type rewritable nonvolatile memory.

For example, SOC (system on chip) has, as a main circuit, a memory circuit such as DRAM (dynamic random access memory) or SRAM (static random access memory), a logic circuit such as CPU (central processing unit) or MPU (micro processing unit), or a mixed circuit of such a memory circuit and a logic circuit. On the other hand, examples of the add-on circuit include a storage circuit for storing relatively small capacity information relating to the main circuit and an electronic fuse to be used for relief of a circuit. Examples of the relatively small capacity information include location address information of an element to be used for trimming in a semiconductor chip, location address information of a memory cell to be used for relief of a memory circuit, and product number of a semiconductor device. Examples of the relatively small capacity information when the semiconductor chip is an LCD (liquid crystal display) driver include trimming tap information of an adjusting voltage to be used for LCD image adjustment.

<Layout Configuration Example of Semiconductor Chip>

First Embodiment will next be described using a semiconductor chip having a system for achieving a main function as an example. The semiconductor chip in First Embodiment includes a low breakdown voltage MISFET (metal insulator semiconductor field effect transistor) that is driven at a relatively low voltage, a high breakdown voltage MISFET that is driven at a relatively high voltage to enable high-voltage driving, and a rewritable nonvolatile memory cell.

The term "breakdown voltage" to be used for describing the MISFET means a pn junction breakdown voltage generated at a boundary of the MISFET between a source region and a semiconductor substrate (well) or between a drain region and the semiconductor substrate (well) or dielectric breakdown voltage of a gate insulating film. In First Embodiment, a semiconductor substrate has thereon a high breakdown voltage MISFET having a relatively high breakdown voltage and a low breakdown voltage MISFET having a relatively low breakdown voltage.

FIG. 1 shows a layout configuration example of a semiconductor chip CHP1 of First Embodiment. In FIG. 1, the semiconductor chip CHP1 has a CPU 1, a ROM (read only memory) 2, a RAM 3, an analog circuit 4, a nonvolatile memory 5, and an I/O (input/output) circuit 6.

The CPU 1 is also called a central processing unit and is the heart of a computer. This CPU 1 reads and decodes instructions from a memory device and based on them, performs a variety of operations or controls. It is required to have high-speed processing properties. An MISFET configuring the CPU 1 needs, among the elements formed over the semiconductor chip CHP1, a relatively high current driving force capability. This means that the CPU 1 is comprised of a low breakdown voltage MISFET.

The ROM 2 is a memory in which memory information is unchangeably fixed and is called a read only memory. The ROM 2 has two types of configuration, that is, an NAND type in which MISFETs are coupled in series and an NOR type in which MISFETs are coupled in parallel. The NAND type and NOR type are often used for integration degree-oriented purpose and operation rate-oriented purpose, respectively. The ROM 2 is also required to have high speed operability so that MISFETs configuring the ROM 2 need relatively high current driving force capability. This means that the ROM 2 is comprised of low breakdown voltage MISFETs.

The RAM 3 is a memory capable of reading the stored information at random, which means reading the stored information at any time, or capable of writing the stored information newly. It is also called a random access memory. The RAM 3 as an IC memory has two types, that is, a DRAM (dynamic RAM) using a dynamic circuit and a SRAM (static RAM) using a static circuit. The DRAM is a random access memory which needs memory retaining operation, while the SRAM is a random access memory which does not need memory retaining operation. Since the RAM 3 needs high speed operability, the MISFETs configuring the RAM 3 need relatively high current driving force capability. This means that the RAM 3 is comprised of low breakdown voltage MISFETs.

The analog circuit 4 is a circuit handling signals of a voltage or current which show a continuous time-dependent change, that is, analog signals. It is composed of, for example, an amplification circuit, conversion circuit, modulation circuit, oscillation circuit and power supply circuit. Such an analog circuit 4 uses, among elements formed over the semiconductor chip CHP1, a high breakdown voltage MISFET having a relatively high breakdown voltage.

The nonvolatile memory 5 is one of nonvolatile memories capable of electrically rewriting both write operation and erase operation and is also called "electrically erasable programmable read only memory". In First Embodiment, this nonvolatile memory 5 is comprised of a MONOS transistor. The MONOS transistor makes use of, for example, the Fowler-Nordheim tunneling phenomenon for its write operation and erase operation. It can also make use of hot electrons or hot holes for its write operation or erase operation.

When the nonvolatile memory 5 performs write operation, a high potential difference (about 12V) is applied to the MONOS transistor so that a transistor having a relatively high breakdown voltage is necessary as the MONOS transistor.

The I/O circuit 6 is an input/output circuit and is a circuit for outputting data from the semiconductor chip CHP1 to an apparatus coupled to the outside of the semiconductor chip CHP1 or inputting data from the apparatus coupled to the outside of the semiconductor chip CHP1 to the semiconductor chip CHP1. This I/O circuit 6 is comprised of a high breakdown voltage MISFET having a relatively high breakdown voltage.

In the present embodiment, the main circuit is comprised of the CPU 1, the ROM 2, the RAM 3, and the analog circuit 4, while the add-on circuit is comprised of the nonvolatile memory 5. This means that the semiconductor chip CHP1 of First Embodiment has the main circuit for achieving a main function and the add-on circuit to be added to the main circuit. First Embodiment is different from the related art in that a MONOS transistor is used as the add-on circuit. Due to this difference, the present embodiment provides the following advantages.

For example, when the add-on circuit includes an electronic fuse and this electronic fuse is comprised of a MONOS transistor which is a rewritable nonvolatile memory, a MTP (multi time program) type electronic fuse that can be adjusted repeatedly in a wafer form or package form can be achieved (first advantage).

A nonvolatile memory (NV memory) having a floating gate structure and suited for mix-loading with a field effect transistor included in the main circuit has been used as a memory for storing trimming information, but it increases the size of the memory cell. By using a MONOS transistor instead of the nonvolatile memory (NV memory), the memory cell can be downsized. In addition to this advantage, the MONOS transistor enables rewriting of data at a constant current and low power consumption, because it uses an FN tunneling current for rewriting of data.

Thus, the difference of First Embodiment from the related art is in that in the semiconductor device equipped with the main circuit and the add-on circuit, a MONOS transistor is used as the add-on circuit. In realizing the configuration of this semiconductor device, some measures are taken for a manufacturing technology of the semiconductor device. These measures taken in First Embodiment are those relating to the technology of mix-loading the MONOS transistor which is a constituent component of the add-on circuit with the low breakdown voltage MISFET and the high breakdown voltage MISFET which are constituent components of the main circuit. These measures will be described later.

<Constitution of Circuit Block of Nonvolatile Memory>

Figure 2:
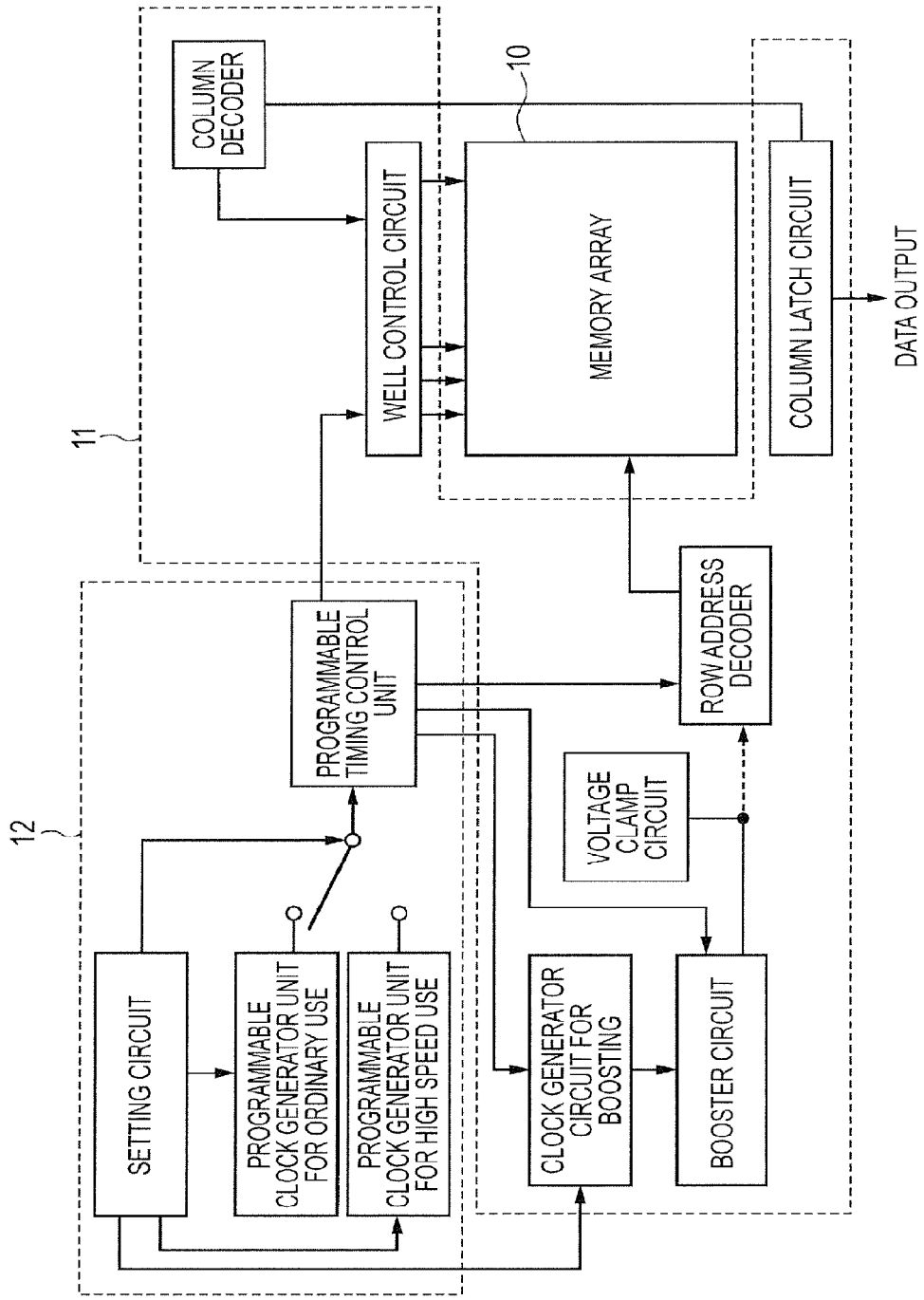
FIG. 2 shows one example of a circuit block configuration of a nonvolatile memory.

Next, FIG. 2 shows one example of the circuit block configuration of the nonvolatile memory 5. In FIG. 2, the nonvolatile memory 5 has a memory array 10 and as a drive circuit for driving the memory array 10, a direct peripheral circuit portion 11 and an indirect peripheral circuit portion 12 for the memory array 10.

The memory array 10 is a memory portion of the nonvolatile memory 5, and it has a number of memory cells arranged two-dimensionally in rows and columns (in array form). Each memory cell is a circuit for storing 1 bit as a unit of information and it is comprised of an MONOS transistor which is a memory portion.

The drive circuit is a circuit for driving the memory array 10 and it has, as the direct peripheral circuit portion 11, for example, a booster circuit for boosting a voltage level by several times from a power supply voltage, a clock generator circuit for boosting, a voltage clamp circuit, a column decoder or row address decoder for selecting a column or row, a column latch circuit, a WELL control circuit, and the like. MISFETs configuring the direct peripheral circuit portion 11 are comprised of high breakdown voltage MISFETs that require a relatively high breakdown voltage among the elements which the semiconductor chip CHP1 has.

As the indirect peripheral circuit portion 12, formed is a programmable control circuit of the memory array, and it is comprised of a setting circuit and circuits having a programmable clock generator unit for ordinary use, a programmable clock generator unit for high speed use, a programmable timing control unit, and the like, respectively. MISFETs configuring the indirect peripheral circuit portion 12 are comprised of low breakdown voltage MISFETs which can be driven at a relatively low voltage and can be operated at high speed, among the elements which the semiconductor chip CHP1 has.

<Device Structure of Semiconductor Chip>

Figure 3:
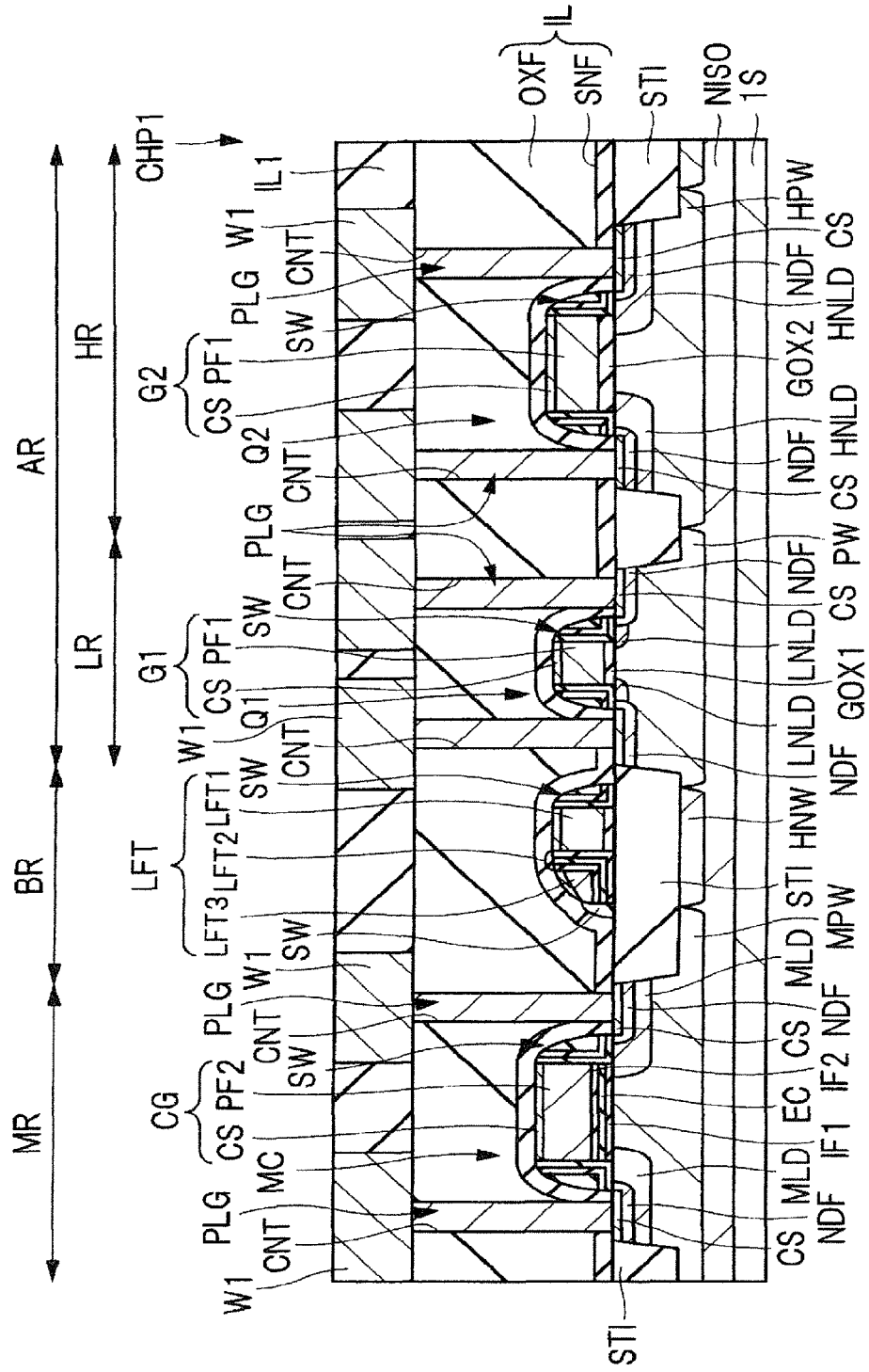
FIG. 3 is a cross-sectional view showing a device structure example of the semiconductor chip of First Embodiment.

FIG. 3 is a cross-sectional view showing a device structure example of the semiconductor chip CHP1 of First Embodiment. In FIG. 3, shown are a memory formation region MR, a main circuit formation region AR, and a boundary region BR sandwiched between the memory formation region MR and the main circuit formation region AR and the main circuit formation region AR is comprised of a low breakdown voltage MISFET formation region LR and a high breakdown voltage MISFET formation region HR.

The memory formation region MR has therein a memory cell of the nonvolatile memory 5 shown in FIG. 1 and this memory cell is comprised of a MONOS transistor MC. The low breakdown voltage MISFET formation region LR has therein a low breakdown voltage MISFETQ1 that requires large current driving force capability for enabling high-speed operation. Such a low breakdown voltage MISFETQ1 can be formed, for example, in the formation region of the CPU 1, the ROM 2, or the RAM 3. The low breakdown voltage MISFETQ1 operates at a power supply voltage of, for example, about 1.5V. The high breakdown voltage MISFET formation region HR has therein a high breakdown voltage MISFETQ2 and such a high breakdown voltage MISFETQ2 can be formed, for example, in the formation region of the analog circuit 4 or the I/O circuit 6. This high breakdown voltage MISFETQ2 operates at a power supply voltage of, for example, about 5V.

As shown in FIG. 3, the semiconductor substrate 1S has therein an element isolation region STI for isolating elements and active regions isolated by the element isolation region STI are the memory formation region MR, the low breakdown voltage MISFET formation region LR, and the high breakdown voltage MISFET formation region HR, respectively. The semiconductor substrate 1S of the memory formation region MR, the low breakdown voltage MISFET formation region LR, and the high breakdown voltage MISFET formation region HR has therein a well isolation layer NISO and the well isolation layer NISO has thereon a well. For example, in the memory formation region MR, the well isolation layer NISO has thereon a p well MPW. Similarly, in the low breakdown voltage MISFET formation region LR, the well isolation layer NISO has thereon a p well PW and in the high breakdown voltage MISFET formation region HR, the well isolation layer NISO has thereon a p well HPW. In the boundary region BR, the well isolation layer NISO has thereon an isolation layer HNW.

In First Embodiment, an n channel MISFET is illustrated and described as an MISFET formed in each of the low breakdown voltage MISFET formation region LR and the high breakdown voltage MISFET formation region HR, but these regions each have therein a p channel MISFET.

Next, the configuration of the MONOS transistor MC shown in FIG. 3 will be described.

The MONOS transistor MC formed in the memory formation region MR has the following configuration. Described specifically, the p well MPW formed in the semiconductor substrate 1S has thereon an insulating film (potential barrier film) IF1 and the insulating film IF1 has thereon a charge storage film EC. This charge storage film EC has thereon an insulating film (potential barrier film) IF2. The insulating film IF2 has thereon a gate electrode CG made of a conductive film. The gate electrode CG is comprised of a stacked film of, for example, a polysilicon film PF2 and a silicide film CS in order to lower the resistance. The gate electrode CG has, on both side walls thereof, a side wall SW made of, for example, an insulating film to form an LDD (lightly doped drain) structure.

The semiconductor substrate 1S below the side wall SW has therein, as a semiconductor region, an n⁻ type semiconductor region MLD and an n⁺ type semiconductor region NDF. The p well MPW has therein a channel region just below the insulating film IF1.

In the MONOS transistor MC having such a configuration, the insulating film IF1 functioning as a gate insulating film is made of, for example, a silicon oxide film and it also functions as a tunnel insulating film. This MONOS transistor MC stores or erases data by injecting electrons into the charge storage film EC from the semiconductor substrate 1S via the insulating film IF1 or ejecting electrons stored in the charge storage film EC to the semiconductor substrate 1S so that insulating film IF1 functions as a tunnel insulating film.

The charge storage film EC is a film provided for storing charges contributing to data memory and it is made of, for example, a silicon nitride film.

A polysilicon film has conventionally been used mainly as the charge storage film EC. When a polysilicon film is used as the charge storage film EC and an oxide film surrounding the charge storage film EC has, in a portion thereof, a defect, all the charges stored in the charge storage film EC may escape due to abnormal leakage because the charge storage film EC is a conductor.

As described above, a silicon nitride film which is an insulator has come to be used as the charge storage film EC. In this case, charges contributing to the data memory are stored in a discrete trap level (trap level) present in the silicon nitride film. Even if a defect appears in a portion of the oxide film surrounding the charge storage film EC, all the charges do not escape from the charge storage film EC because charges are stored in the discrete trap level of the charge storage film EC. The reliability of data retention can therefore be improved.

Because of the above-mentioned reasons, the reliability of data retention can be improved by using, as the charge storage film EC, not only a silicon nitride film but also a film containing a discrete trap level.

The side wall SW is formed to obtain a source region and a drain region, which are semiconductor regions of the MONOS transistor MC, having an LDD structure. Described specifically, the source region and the drain region of the MONOS transistor MC are each made of an n⁻ type semiconductor region MLD and an n⁺ type semiconductor region NDF. Electric field concentration below the end portion of the gate electrode CG can be suppressed by forming the source region and the drain region below the gate electrode CG from the n-type semiconductor region MLD.

The configuration of the low breakdown voltage MISFETQ1 will next be described. In the low breakdown voltage MISFETQ1, the p well PW formed in the semiconductor substrate 1S has thereon a gate insulating film GOX1. This gate insulating film GOX1 has thereon a gate electrode G1. The gate insulating film GOX1 is made of, for example, a silicon oxide film and the gate electrode G1 is made of, for example, a stacked film of a polysilicon film PF1 and a silicon film CS in order to have a reduced resistance. The gate electrode G1 has, on both side walls thereof, a side wall SW and the semiconductor substrate 1S below this side wall SW has therein, as a semiconductor region, an n⁻ type semiconductor region LNLD and an n⁺ type semiconductor region NDF. The P well PW just below the gate insulating film GOX1 has therein a channel region.

Next, the configuration of the high breakdown voltage MISFETQ2 will be described. In the high breakdown voltage MISFETQ2, the p well HPW formed in the semiconductor substrate 1S has thereon a gate insulating film GOX2 and this gate insulating film GOX2 has thereon a gate electrode G2. The gate insulating film GOX2 is made of, for example, a silicon oxide film and the gate electrode G2 is made of, for example, a stacked film of a polysilicon film PF1 and a silicide film CS in order to have a reduced resistance.

The gate electrode G2 has, on both side walls thereof, a side wall SW and the semiconductor substrate 1S below the side wall SW has therein, as a semiconductor region, an n⁻ type semiconductor region HNLD and an n⁺ type semiconductor region NDF. The p well HPW just below the gate insulating film GOX2 has therein a channel region.

Next, a difference between the low breakdown voltage MISFETQ1 and the high breakdown voltage MISFETQ2 will next be described. A gate length of the gate electrode G2 of the high breakdown voltage MISFETQ2 is set longer than that of the gate length G1 of the low breakdown voltage MISFETQ1. In the low breakdown voltage MISFETQ1, by decreasing the gate length of the gate electrode G1 and thereby reducing the resistance between the source region and the drain region, current driving force capability should be improved. On the other hand, in the high breakdown voltage MISFETQ2, a relatively high potential is applied so that a decrease in gate length may cause punch-through between the source region and the drain region.

Further, a voltage applied to the high breakdown voltage MISFETQ2 is higher than that applied to the low breakdown voltage MISFETQ1 so that the gate insulating film GOX2 is thicker than the gate insulating film GOX1 of the low breakdown voltage MISFETQ1. As a result, the gate insulating film GOX2 of the high breakdown voltage MISFETQ2 has improved insulation resistance tolerance.

The boundary region BR has therein a residue pattern LFT which is a trace of a manufacturing step. More specifically, the residue pattern LFT in First Embodiment is, as shown in FIG. 3, comprised of a residue portion LFT3 which is a residue of the polysilicon film PF2, a residue portion LFT2 which is a residue of a stacked insulating film comprised of the insulating film IF1, the charge storage film EC, and the insulating film IF2, and a residue portion LFT1 which is a residue of the polysilicon film PF1. The residue portion LFT3 is formed in sidewall form on the side surface of the residue portion LFT1 via the residue portion LFT2.

<Operation of Nonvolatile Memory>

The semiconductor device of First Embodiment has a configuration as described above. The operation of the memory cell (nonvolatile memory cell) included in the semiconductor device will next be described.

Figure 4:
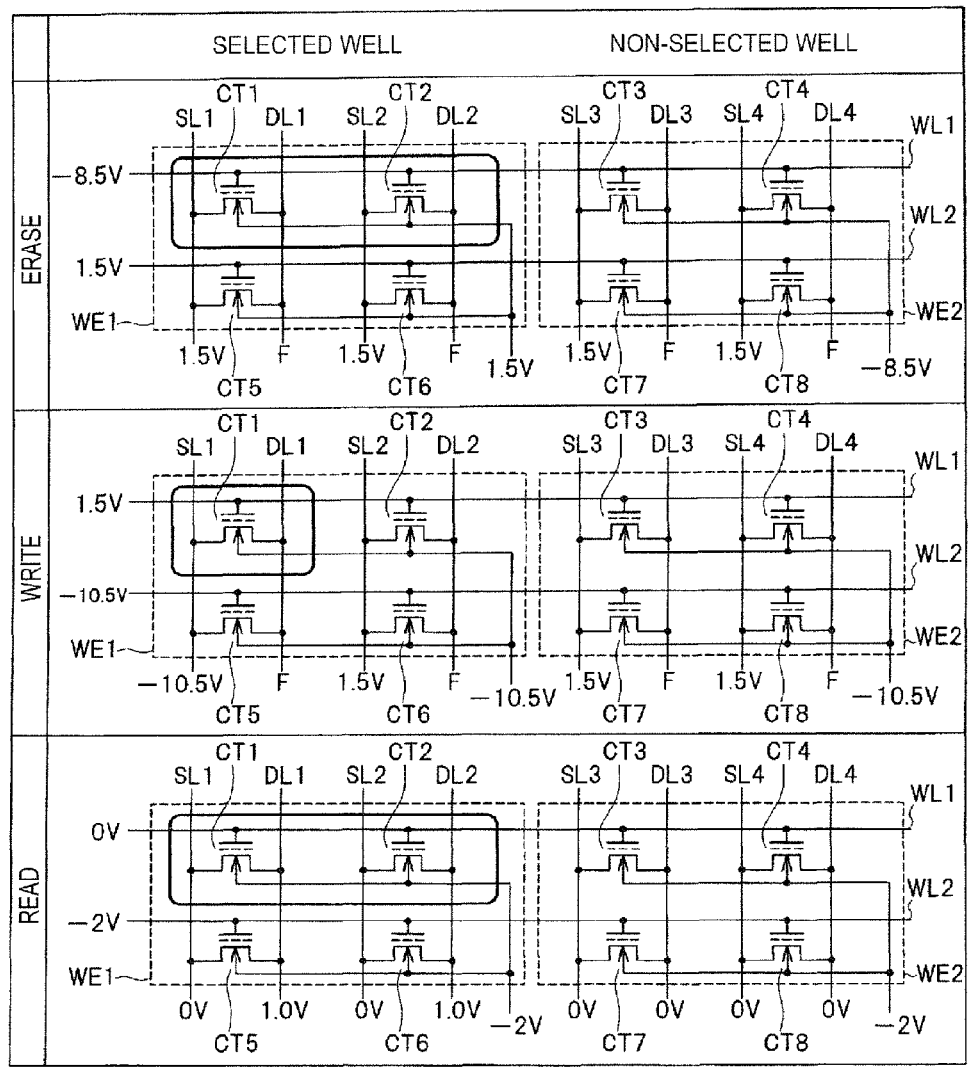
FIG. 4 is an explanatory view showing one example of the memory array structure and operation conditions of the nonvolatile memory.

FIG. 4 is an explanatory view showing one example of the memory array structure and operation conditions (1 cell/1 transistor) of the nonvolatile memory 5 shown in FIG. 1. Cell transistors CT1 to CT8 in FIG. 4 each correspond to a memory cell comprised of the MONOS transistor MC shown in FIG. 3. The gate electrodes of the cell transistors CT1 to CT8 are coupled to word lines WL1 to WL2 and their source regions are coupled to source lines SL1 to SL4. Their drain regions are coupled to data lines DL1 to DL4. The back gates of the cell transistors CT1, CT2, CT5 and CT6 are coupled to a well WE1, while the back gates of the cell transistors CT3, CT4, CT7 and CT8 are coupled to a well WE2.

To simplify the description, memory cells are arranged in two rows and four columns in FIG. 4, but they are not limited thereto. In practice, more memory cells are arranged in matrix form and configure a memory array. In FIG. 4, the memory cell arrangement which shares the same well and the same word line is two-column configuration of, for example, the cell transistors CT1 and CT2. In an 8-bit (1 byte) configuration, eight columns of cell transistors share the same well. In this case, the erase and write operations of the memory cell are performed one byte at a time.

Next, referring to FIG. 4, erase, write, and read operations of a 1 cell/1 transistor type memory cell will next be described.

First, the erase operation will be described. For example, supposing that data stored in the cell transistors CT1 and CT2 as a memory cell whose data are to be erased (selected memory cell) are erased. The potentials of the selected well WE1, word line WL1, source lines SL1 and SL2, and data lines DL1 and DL2 are set at 1.5V, −8.5V, 1.5V, and floating potential, respectively. The charges stored in the charge storage film of the cell transistors CT1 and CT2 are then withdrawn to the semiconductor substrate side and the data are erased. With regard to the cell transistors CT3 to CT8 of the other memory cells whose data are not erased (non-selected memory cells), the potentials of the non-selected well WE2, word line WL2, source lines SL3 and SL4, and data lines DL3 and DL4 are set at −8.5V, 1.5V, 1.5V, and floating potential, respectively. Escape of the charges stored in the charge storage film of the cell transistors CT3 to CT8 is thus prevented, whereby the data are not erased.

Next, the write operation will be described. For example, supposing that data are written in the cell transistor CT1 as the memory cell in which the data are to be written (selected memory cell). The potentials of the selected well WE1, word line WL1, source line SL1, and data line DL1 are set at −10.5V, 1.5V, −10.5V, and floating potential, respectively. The charges are then injected into the charge storage film of the cell transistors CT1 and the data are written therein. With regard to the cell other transistors CT2 to CT8 in which data are not written (non-selected memory cells), the potentials of the non-selected well WE2, word line WL2, source lines SL2 to SL4, and data lines DL2 to DL4 are set at −10.5V, −10.5V, 1.5V, and floating potential, respectively. Injection of charges into the charge storage film of the cell transistors CT2 to CT8 is thus prevented.

Next, read operation will be described. For example, supposing that writing of data "1" in the cell transistor CT1 has increased the threshold voltage of the transistor, while data "0" in the cell transistor CT2 has lowered the threshold voltage of the transistor. When the data are read out from the cell transistors CT1 and CT2, the potentials of the selected well WE1, word line WL1, source lines SL1 and SL2, and data lines DL1 and DL2 are set at −2V, 0V, 0V and 1V, respectively. In such a manner, the data are read out from the cell transistors CT1 and CT2. In this case, since the threshold voltage of the cell transistor CT1 is high and that of the cell transistor CT2 is low, the potential of the data line DL2 lowers without a change in the potential of the data line DL1. With regard to the other memory cells CT3 to CT8 from which no data are read out, the potentials of the non-selected well WE2, word line WL2, source lines SL3 and SL4, and data lines DL3 and DL4 are set at −2V, −2V, 0V and 0V, respectively, whereby the cell transistors CT3 to CT8 are prevented from turning on. By decreasing the back gate potential of the non-selected memory cell during read operation, the memory cell does not need a selected transistor.

<Room for Improvement>

The semiconductor device of First Embodiment has a main circuit for realizing a main function and an add-on circuit to be added to the main circuit. In First Embodiment, a MONOS transistor is used for the add-on circuit from the standpoint of incorporation of an MTP type electronic fuse in the add-on circuit or downsizing of the nonvolatile memory cell.

When the MONOS transistor is used as the add-on circuit, however, a manufacturing step of the nonvolatile memory having a MONOS structure must be incorporated in a manufacturing step of the main circuit having a field effect transistor, which may increase a manufacturing cost of the semiconductor device. This means that desired is a manufacturing process capable of mix-loading the MONOS transistor as the add-on circuit while minimizing a change in the manufacturing process of a base product having therein the main circuit. More specifically, mix-loading of the MONOS transistor with the electric field transistor of the main circuit increases the number of masks so that it is desired to reduce the number of masks added due to the mix-loading and thereby reduce the manufacturing cost of the semiconductor device. First, a related technology on mix-loading of a field effect transistor which is a constituent component of a main circuit and a MONOS transistor which is a constituent component of an add-on circuit will be described and then, room for improvement of this technology will be described.

Figure 5:
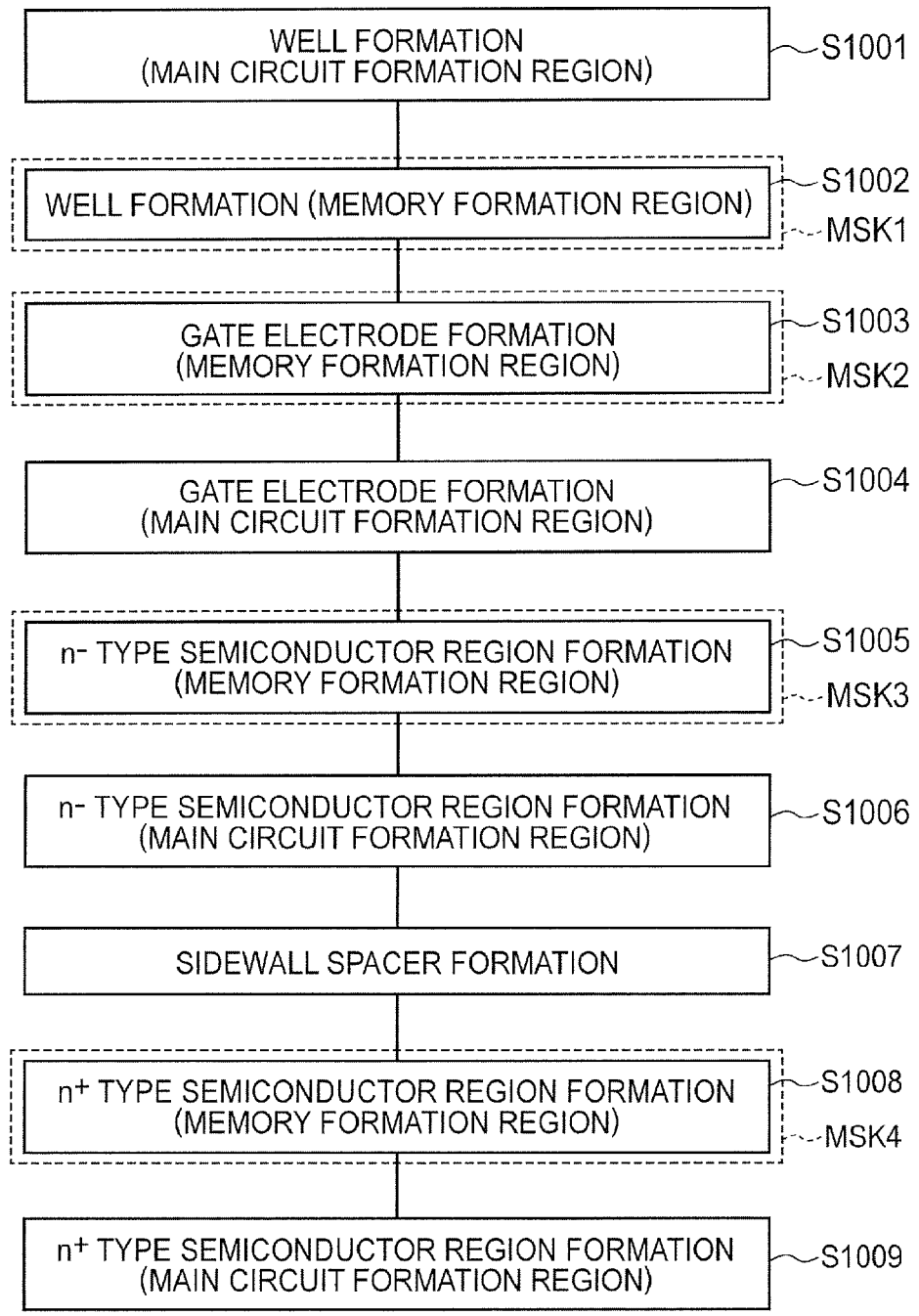
FIG. 5 is a flow chart showing the flow of manufacturing steps of a semiconductor device in related technology.

FIG. 5 is a flow chart showing, in the related technology, the flow of manufacturing steps for mix-loading of a field effect transistor which is a constituent component of a main circuit and a MONOS transistor which is a constituent component of an add-on circuit. In the flow chart shown in FIG. 5, a step requiring an additional mask for mix-loading of the MONOS transistor is surrounded with a broken line.

As shown in FIG. 5, first, a well is formed in a main circuit formation region (S1001). Then, a well is formed in a memory formation region (S1002). At this time, an additional mask MSK1 that covers the main circuit formation region and exposes the memory formation region is used. This means that the additional mask MSK1 becomes necessary for the formation of the well of the MONOS transistor in the memory formation region.

Next, a gate electrode is formed in the memory formation region (S1003). At this time, an additional mask MSK2 becomes necessary for the formation of the gate electrode of the MONOS transistor in the memory formation region. Then, a gate electrode of the field effect transistor is formed in the main circuit formation region (S1004).

Next, an $n^-$ type semiconductor region (extension region) is formed in the memory formation region (S1005). At this time, an additional mask MSK3 becomes necessary for the formation of the $n^-$ type semiconductor region of the MONOS transistor in the memory formation region. Then, an $n^-$ type semiconductor region of the field effect transistor is formed in the main circuit formation region (S1006).

Then, a sidewall spacer is formed on each of the side wall of the gate electrode of the MONOS transistor and the side wall of the gate electrode of the field effect transistor (S1007). Then, an $n^+$ type semiconductor region (diffusion layer) is formed in the memory formation region (S1008). At this time, an additional mask MSK4 becomes necessary for the formation of the $n^+$ type semiconductor region of the MONOS transistor in the memory formation region. Then, an $n^+$ type semiconductor region of the field effect transistor is formed in the main circuit formation region (S1009).

Steps after that do not need an additional mask so that description on them is omitted. In the related technology, the field effect transistor which is a constituent component of a main circuit and the MONOS transistor which is a main constituent component of an add-on circuit can thus be mix-loaded. As shown in FIG. 5, the manufacturing steps of a semiconductor device in the related technology needs four additional masks MSK1 to MSK4 for mix-loading of the MONOS transistor (add-on circuit) with the base product (main circuit). In this point, it is desired to reduce the number of masks necessary for mix-loading of the MONOS transistor and thereby reduce the manufacturing cost of the semiconductor device. A further reduction in the number of additional masks (four masks) used in the related technology is desired. In First Embodiment, therefore, a measure is taken to make the number of masks added for mix-loading of a MONOS transistor smaller than that in the related technology. The technical concept of First Embodiment which employs this measure will next be described.

<Basic Concept in First Embodiment>

Figure 6:
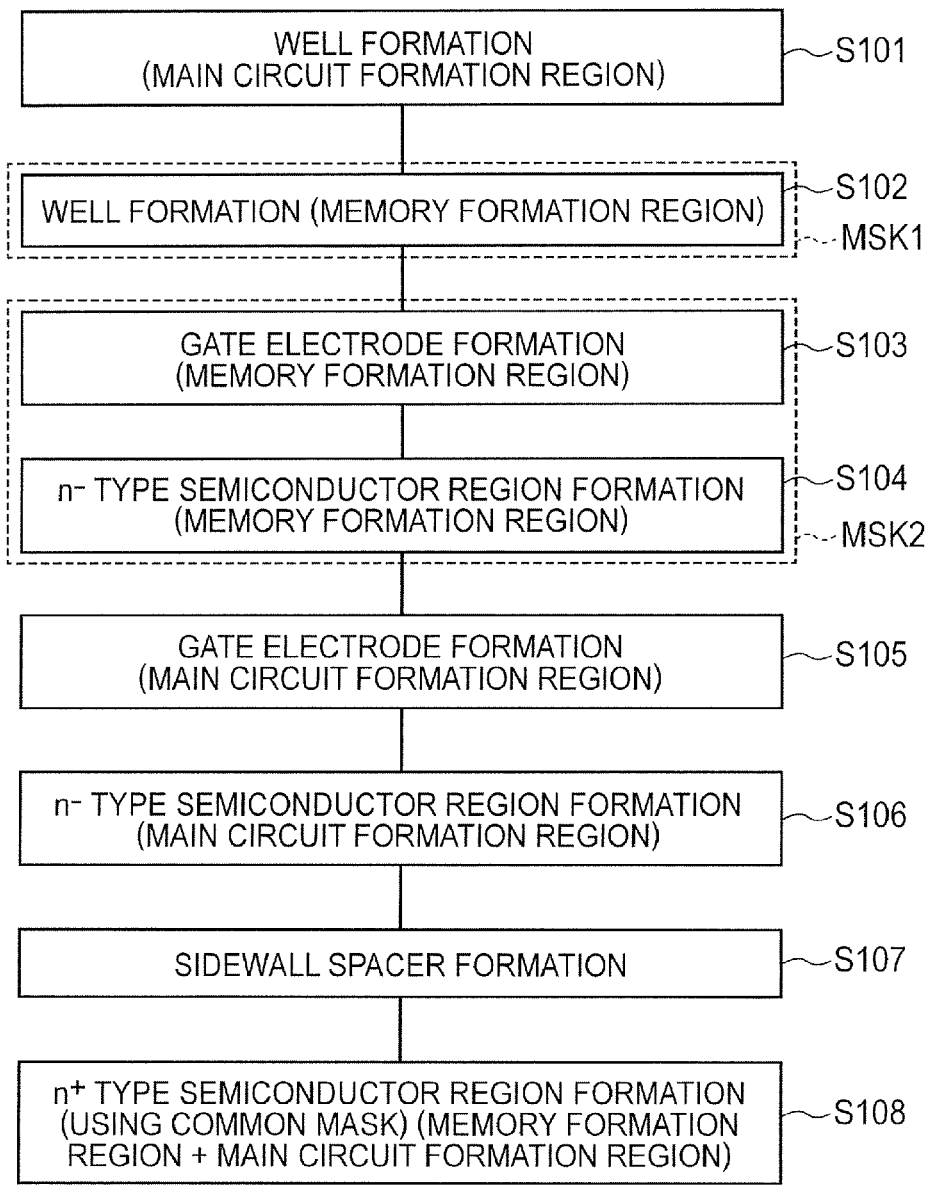
FIG. 6 is a flow chart showing the flow of manufacturing steps of a semiconductor device of First Embodiment.

FIG. 6 is a flow chart showing the flow of manufacturing steps for mix-loading of a field effect transistor which is a constituent component of a main circuit and a MONOS transistor which is a constituent component of an add-on circuit. In the flow chart shown in FIG. 6, steps requiring an additional mask for mix-loading of the MONOS transistor are surrounded with a broken line.

As shown in FIG. 6, a well is formed in a main circuit formation region (S101). Then, a well is formed in a memory formation region (S102). At this time, an additional mask MSK1 that covers the main circuit formation region and at the same time, exposes the memory formation region is used. This means that the additional mask MSK1 becomes necessary for the formation of the well of the MONOS transistor in the memory formation region.

Next, a gate electrode is formed in the memory formation region (S103). At this time, an additional mask MSK2 becomes necessary for the formation of a gate electrode of the MONOS transistor in the memory formation region. Then, in First Embodiment, by using the additional mask used for the formation of the gate electrode of the MONOS transistor in the memory formation region without changing it to another one, an $n^-$ type semiconductor region (extension region) is formed in the memory formation region (S104). This means that in First Embodiment, the $n^-$ type semiconductor region is formed in alignment with the gate electrode of the MONOS transistor by ion implantation using the additional mask used in patterning for the formation of the gate electrode of the MONOS transistor without changing it to another one. In other words, in First Embodiment, a mask is shared between processing for the formation of the gate electrode of the MONOS transistor and ion implantation for the formation of the $n^-$ type semiconductor region in alignment with the gate electrode of the MONOS transistor. First Embodiment therefore makes it possible to reduce the number of masks added for mix-loading of the MONOS transistor (first mask reduction effect).

Next, a gate electrode of the field effect transistor is formed in the main circuit formation region (S105). Then, an $n^-$ type semiconductor region of the field effect transistor is formed in the main circuit formation region (S106). Next, a sidewall spacer is formed on each of the side wall of the gate electrode of the MONOS transistor and the side wall of the gate electrode of the field effect transistor (S107). Then, an $n^+$ type semiconductor region (diffusion layer) of the MONOS transistor is formed in the memory formation region and at the same time, an $n^+$ type semiconductor region (diffusion layer) of the field effect transistor is formed in the main circuit formation region (S108). This means that in First Embodiment, the $n^+$ type semiconductor region of the MONOS transistor and the $n^+$ type semiconductor region of the field effect transistor are formed simultaneously. In other words, in First Embodiment, the $n^+$ type semiconductor region of the MONOS transistor and the $n^+$ type semiconductor region of the field effect transistor are formed simultaneously by ion implantation using a common mask.

In First Embodiment, as a result, no additional mask is necessary for the formation of the $n^+$ type semiconductor region of the MONOS transistor. In First Embodiment, therefore, the MONOS transistor can be mix-loaded while reducing the number of additional masks (second mask reduction effect).

In First Embodiment, therefore, due to the first mask reduction effect and the second mask reduction effect, the number of masks to be added for mix loading of the MONOS transistor can be made smaller than that of the related technology. Described specifically, four additional masks MSK 1 to MSK 4 become necessary for mix-loading of the MONOS transistor (add-on circuit) is mix-loaded with a base product (main circuit) in the related technology. In First Embodiment, on the other hand, mix-loading of the MONOS transistor (add-on circuit) with the base product (main circuit) can be achieved using two additional masks MSK 1 and MSK 2. In the semiconductor device of First Embodiment, the MONOS transistor can be mix-loaded as an add-on circuit to be added to the main circuit while minimizing a change in the manufacturing process of the base product having therein a main circuit. As a result, a manufacturing cost of the semiconductor device can be reduced.

<Method of Manufacturing Semiconductor Device in First Embodiment> (Monos Last)

A method of manufacturing a semiconductor device in First Embodiment will hereinafter be described specifically referring to some drawings. The method of manufacturing a semiconductor device in First Embodiment is called "MONOS LAST". This "MONOS LAST" is a method of forming, first, a conductor film (first conductor film) to be processed into a gate electrode of a field effect transistor which will be a constituent component of a main circuit and then forming a conductor film (second conductor film) to be processed in to a gate electrode of a MONOS transistor which will be a constituent component of an add-on circuit. The manufacturing method called "MONOS LAST" is advantageous in that the influence of a heat load, which is applied at the time of forming the field effect transistor of the main circuit, on the MONOS transistor of the add-on circuit can be suppressed. The manufacturing method called "MONOS LAST" is therefore a useful manufacturing method from the standpoint of suppressing application of an excessive heat load to the MONOS transistor and thereby reducing variation in characteristics of the MONOS transistor which will be a constituent component of the add-on circuit.

First, as shown in FIG. 7, provided is a semiconductor substrate 1S made of a silicon single crystal implanted with a p type impurity such as boron (B). The semiconductor substrate 1S at this time is a semiconductor wafer having a substantially disk shape. An element isolation region STI is formed in the semiconductor substrate 1S. The element isolation region STI is provided in order to prevent interference between elements. This element isolation region STI can be formed, for example, by STI (shallow trench isolation). In the STI method, the element isolation region STI is formed in the following manner. Described specifically, an element isolation trench is formed in the semiconductor substrate 1S by photolithography and etching. An insulating film (silicon oxide film or the like) is formed on the semiconductor substrate 1S so as to fill the element isolation trench. Then, an unnecessary portion of the silicon oxide film on the semiconductor substrate 1S is removed by chemical mechanical polishing (CMP). The element isolation region STI is thus formed by filling only the element isolation trench with the insulating film (silicon oxide film or the like). As shown in FIG. 7, by the element isolation region STI, a memory formation region MR and a main circuit formation region AR are separated from each other via a barrier region BR and the main circuit formation region AR is separated into a low breakdown voltage MISFET formation region LR and a high breakdown voltage MISFET formation region HR.

Then, a well isolation layer NISO made of an n type semiconductor region is formed in the semiconductor substrate 1S by implantation of an n type impurity such as phosphorus (P) or arsenic (As) into the semiconductor substrate 1S. Then, by photolithography and ion implantation, a p well PW is formed in the semiconductor substrate 1S of the low breakdown voltage MISFET formation region LR and a p well HPW is formed in the semiconductor substrate 1S of the high breakdown voltage MISFET formation region HR. An isolation layer HNW is formed below the element isolation region STI formed in the boundary region BR. Then, in the low breakdown voltage MISFET formation region LR, a conductivity impurity is implanted into a channel region of the p well PW by ion implantation in order to adjust the threshold voltage of the low breakdown voltage MISFET. At the same time, in the high breakdown voltage MISFET formation region HR, a conductivity type impurity is implanted into a channel region of the p well HPW by ion implantation in order to adjust the threshold voltage of the high breakdown voltage MISFET.

Next, after washing the surface of the semiconductor substrate 1S with hydrofluoric acid or the like, a gate insulating film GOX1 is formed on the semiconductor substrate 1S of the low breakdown voltage MISFET formation region LR and a gate insulating film GOX2 is formed on the semiconductor substrate 1S of the high breakdown voltage MISFET formation region HR and the memory formation region MR. The gate insulating film GOX1 and the gate insulating film GOX2 are each made of, for example, a silicon oxide film and the thickness of the gate insulating film GOX1 is smaller than that of the gate insulating film GOX2.

Figure 8:
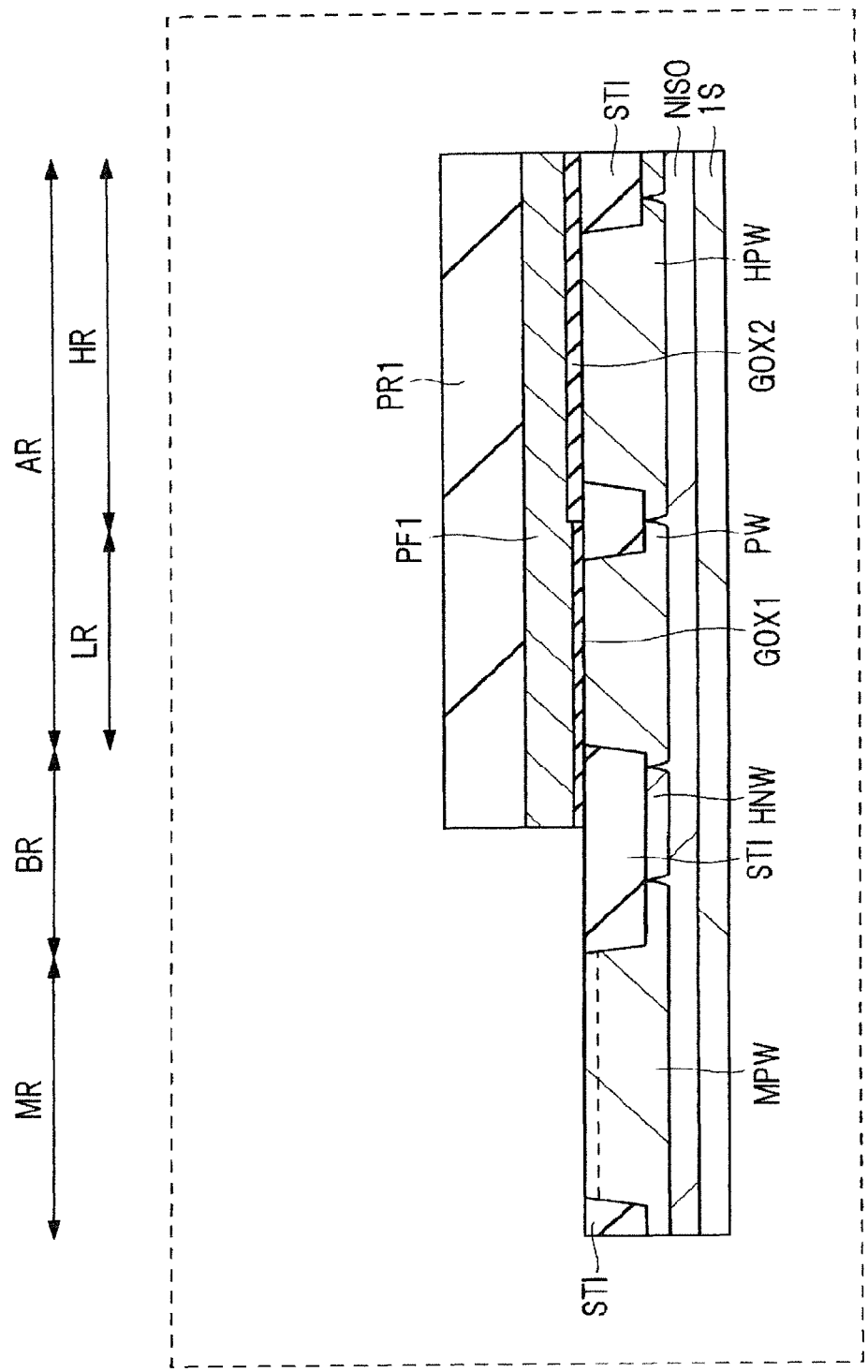
FIG. 8 is a cross-sectional view showing a manufacturing step of the semiconductor device following that of FIG. 7.

Next, a polysilicon film (polycrystalline silicon film) PF1 is formed on the entire main surface of the semiconductor substrate 1S. As shown in FIG. 8, after formation of a resist film PR1 on the polysilicon film PF1 by application, the resist film PR1 is patterned by photolithography. Patterning of the resist film PR1 is performed so as to cover the main circuit formation region AR and expose the memory formation region MR. The patterned resist film PR1 serves as an additional mask MSK1 shown in the flow chart of FIG. 6. By etching with the patterned resist film PR1 as a mask, the polysilicon film PF1 and the gate insulating film GOX2 formed in the memory formation region MR are removed. Then, by ion implantation with the patterned resist film PR1 as a mask, a p well MPW is formed in the semiconductor substrate 1S of the memory formation region MR. Further, in the memory formation region MR, a conductivity type impurity is implanted into a channel region in the p well MPW by ion implantation in order to adjust the threshold voltage of the MONOS transistor.

Figure 9:
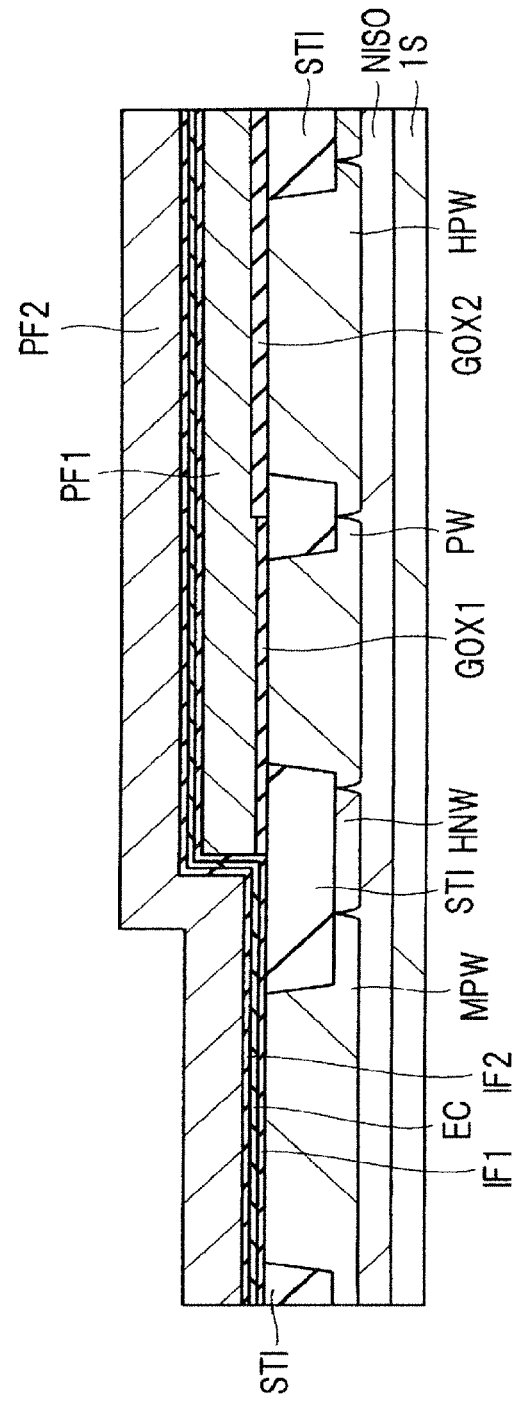
FIG. 9 is a cross-sectional view showing a manufacturing step of the semiconductor device following that of FIG. 8.

Next, as shown in FIG. 9, an insulating film IF1 is formed on the semiconductor substrate 1S and the polysilicon film PF1, followed by the formation of a charge storage film EC on the insulating film IF1. Then, an insulating film IF2 is formed on the charge storage film EC and then, a polysilicon film PF2 is formed on the insulating film IF2. The insulating film IF1 is made of, for example, a silicon oxide film and for the formation of it, ISSG oxidation capable of forming a dense silicon oxide film with good film quality can be used. The insulating film IF1 has a thickness of about 4 nm. The charge storage film EC is made of a silicon nitride film and can be formed, for example, by CVD. The charge storage film EC has a thickness of about 10 nm. The insulating film IF2 is made of a silicon oxide film and for the formation of it, HTO (high temperature oxide) capable of forming a dense silicon oxide film with good film quality can be used. The insulating film IF2 has a thickness of about 5 nm. The polysilicon film PF2 can be formed using, for example, CVD. In such a manner, a stacked insulating film (ONO film) which is dense, is excellent in insulation resistance tolerance, and has a good film quality can be formed.

Figure 10:
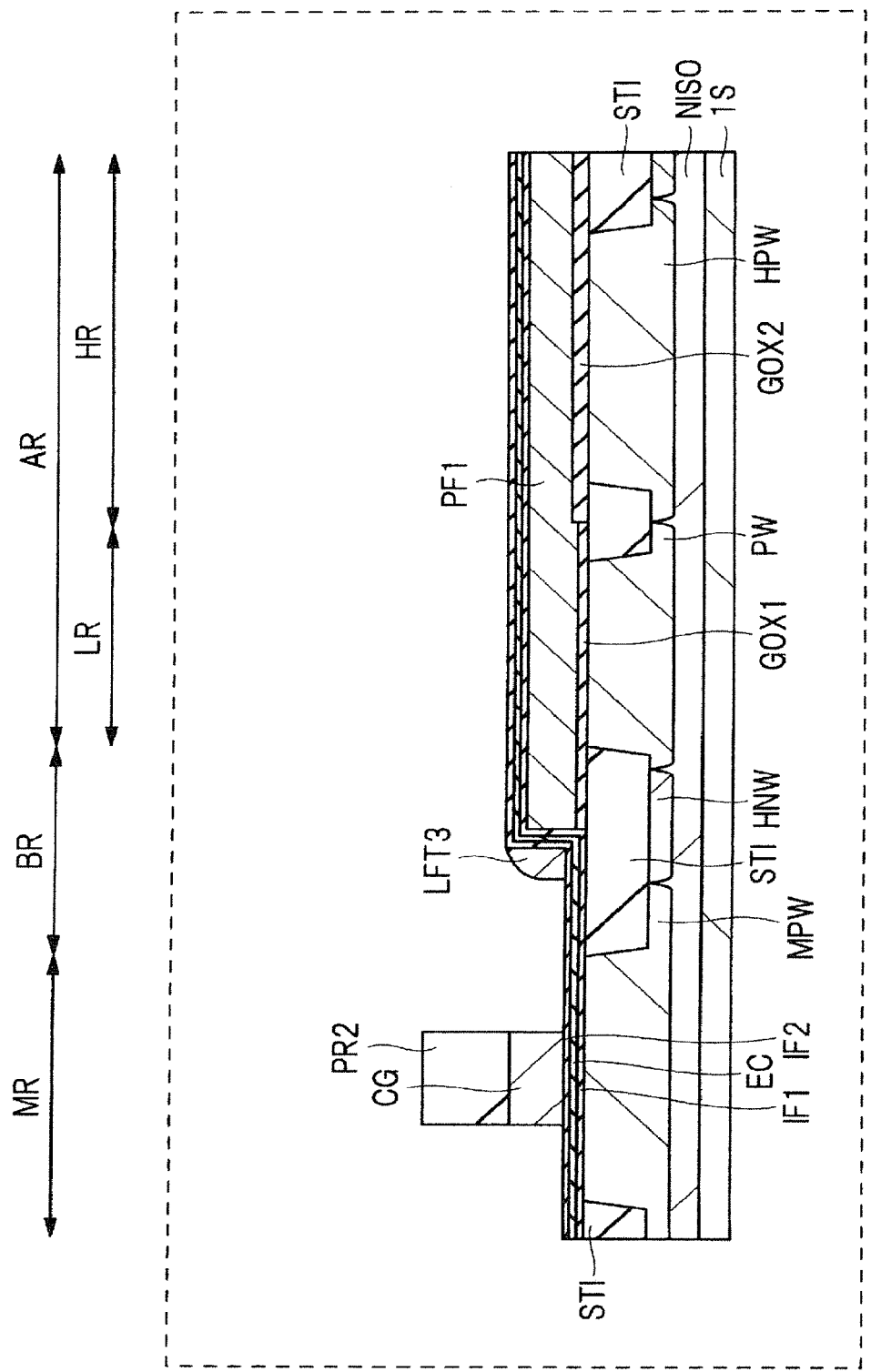
FIG. 10 is a cross-sectional view showing a manufacturing step of the semiconductor device following that of FIG. 9.
Figure 11:
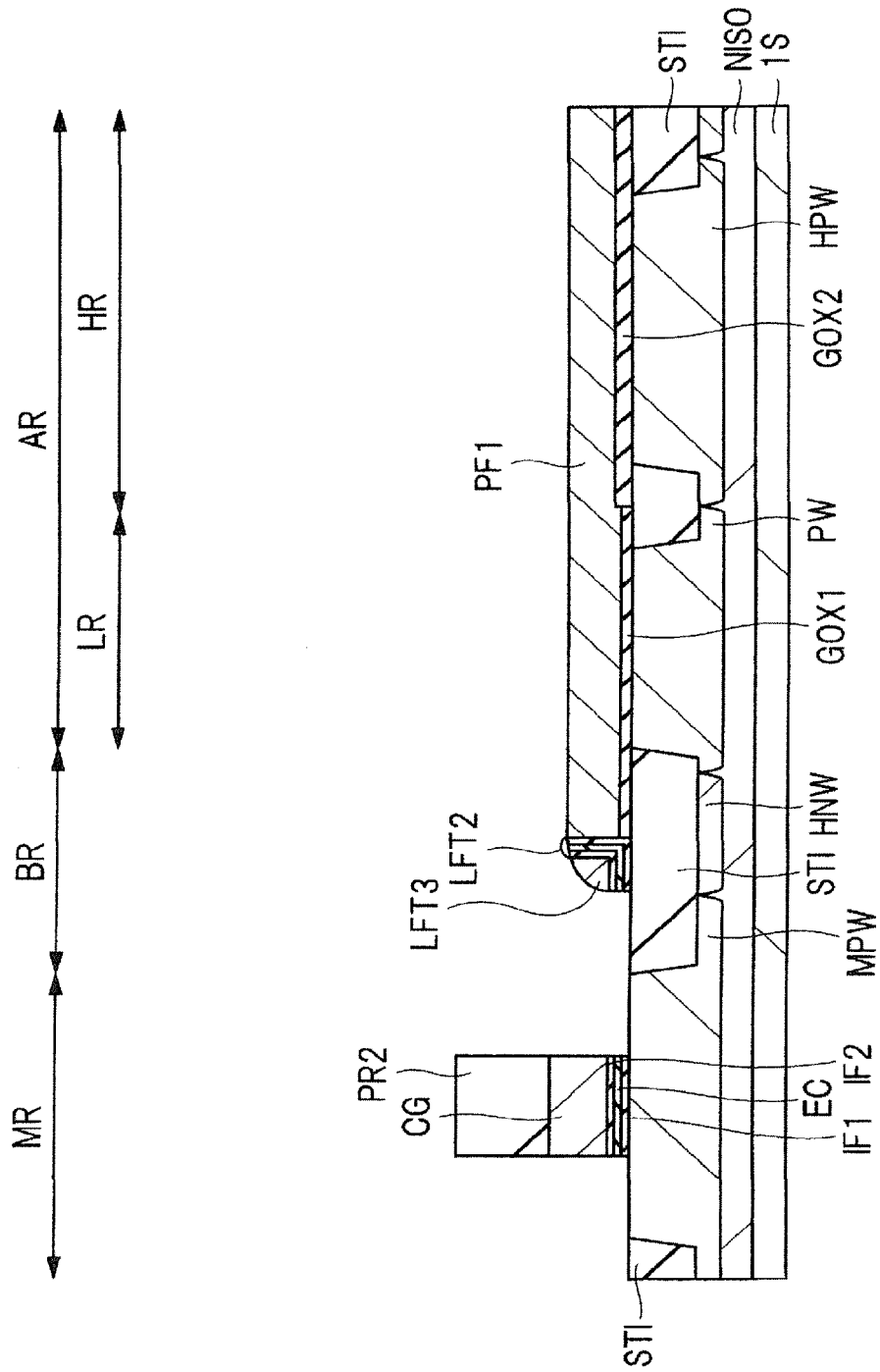
FIG. 11 is a cross-sectional view showing a manufacturing step of the semiconductor device following that of FIG. 10.

Next, as shown in FIG. 10, after formation of a resist film PR2 on the polysilicon film PF2 by application, the resist film PR2 is patterned by photolithography. Patterning of the resist film PR2 is performed so as to cover a gate electrode formation region of the memory formation region MR and expose the main circuit formation region AR. The patterned resist film PR2 thus obtained becomes an additional mask MSK2 shown in the flow chart of FIG. 6. A gate electrode CG is then formed in the memory formation region MR by patterning the polysilicon film PR2 by using etching with the patterned resist film PR2 as a mask. At this time, as shown in FIG. 10, in the boundary region BR, a residue portion LFT3 of the polysilicon film PF2 is formed in sidewall form. Then, as shown in FIG. 11, the exposed insulating film IF2, charge storage film EC, and insulating film IF1 are removed using, for example, dry etching. As a result, the stacked insulating film comprised of the insulating film IF1, the charge storage film EC, and the insulating film IF2 remains below the gate electrode CG formed in the memory formation region MR, while a residue portion LFT2 comprised of the insulating film IF2, the charge storage film EC, and the insulating film IF1 is formed in a portion of the boundary region BR covered with the residue portion LFT3.

Then, an n⁻ type semiconductor region (extension region or lightly doped impurity diffusion region) MLD is formed in the semiconductor substrate 1S of the memory formation region MR in alignment with the gate electrode CG by ion implantation using the mask made of the patterned resist film PR2 without changing it to another one. This means that in First Embodiment, a mask is shared between processing for the formation of the gate electrode CG of the MONOS transistor and ion implantation for the formation of the n⁻ type semiconductor region MLD in alignment with the gate electrode CG of the MONOS transistor. According to First Embodiment, therefore, the number of additional masks necessary for mix-loading of the MONOS transistor can be reduced.

Figure 12:
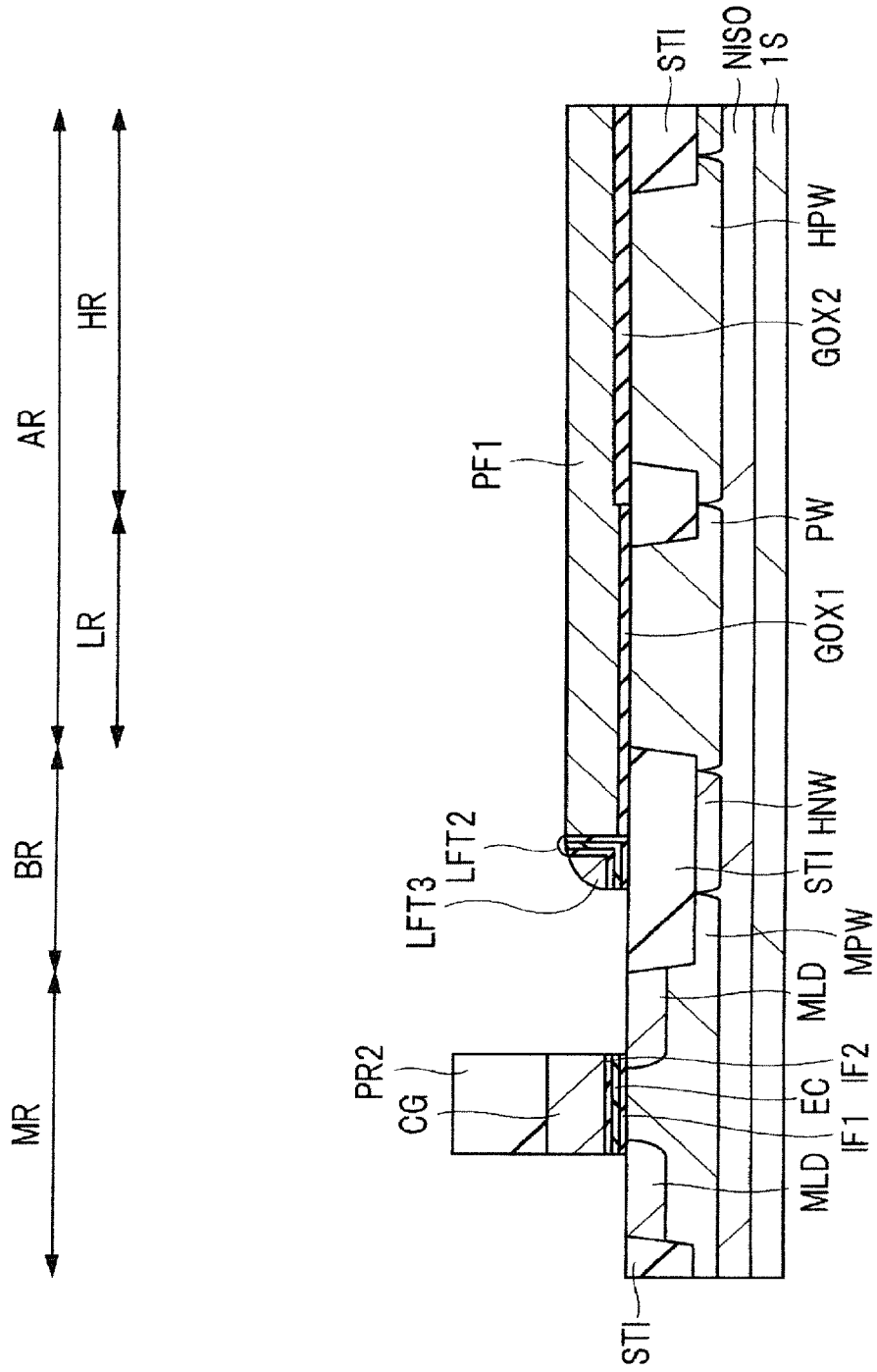
FIG. 12 is a cross-sectional view showing a manufacturing step of the semiconductor device following that of FIG. 11.

In the ion implantation step shown in FIG. 12, since the polysilicon film PF1 formed in the main circuit formation region AR is exposed, an n type impurity is also implanted in this polysilicon film PF1. Also in this case, however, an n type impurity can be prevented from penetrating through the polysilicon film PF1 and being implanted into the semiconductor substrate 1S of the main circuit formation region AR by controlling the implantation energy in the ion implantation step.

Since in order to secure conductivity of the polysilicon film PF1, an n type impurity has been implanted into the polysilicon film PF1 at a concentration higher by several orders of magnitude greater than that in the ion implantation step shown in FIG. 12, implantation of the n type impurity into the polysilicon film PF1 by the ion implantation step shown in FIG. 12 does not pose any problem. In the main circuit formation region AR, not only an n channel type field effect transistor but also a p channel type field effect transistor are formed and a p type impurity is implanted into the polysilicon film PF1 in the p channel type field effect transistor formation region. The concentration of the p type impurity is however also high so that implantation of the n type impurity in the ion implantation step shown in FIG. 12 does not pose any problem.

Figure 13:
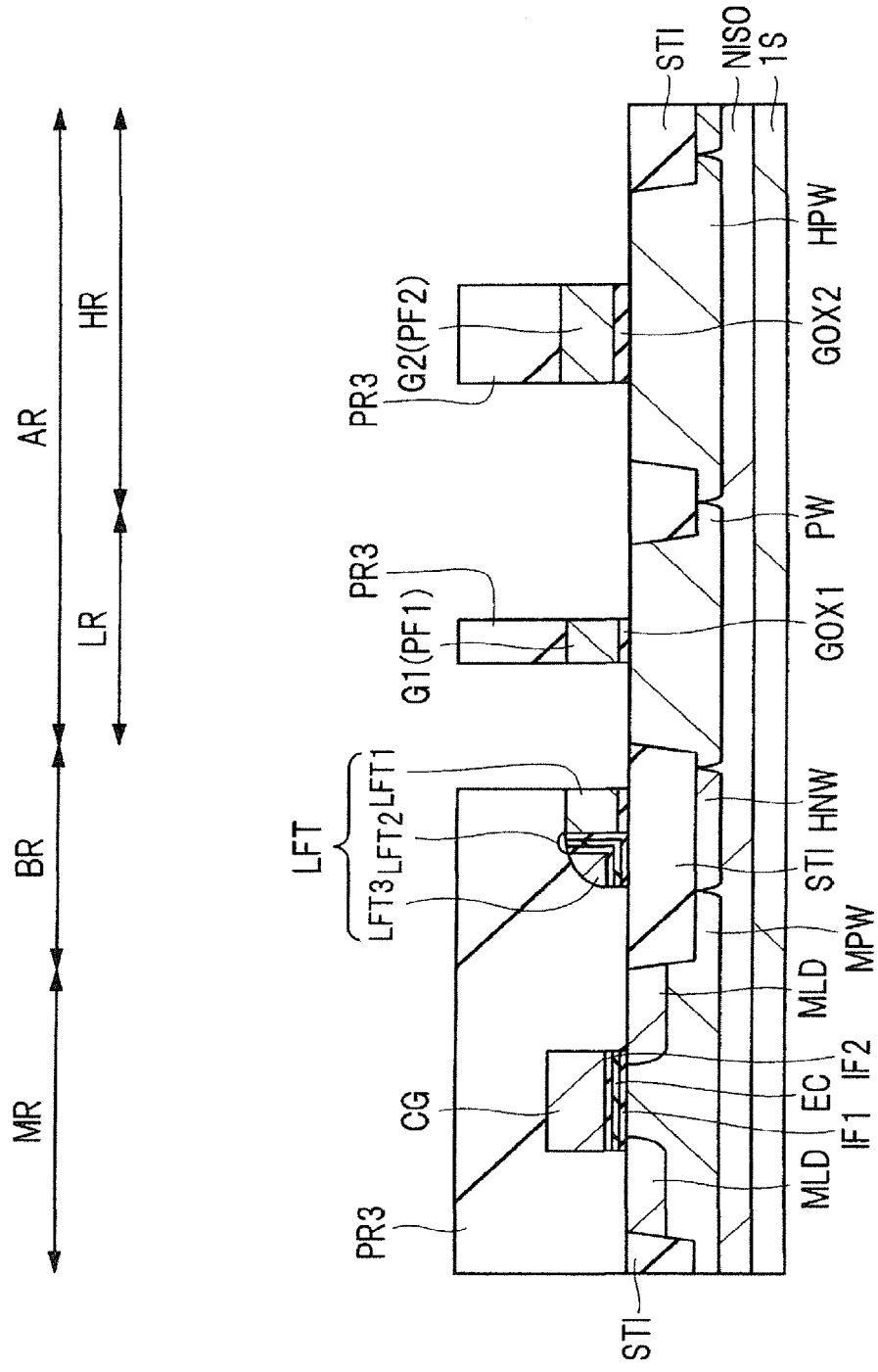
FIG. 13 is a cross-sectional view showing a manufacturing step of the semiconductor device following that of FIG. 12.

Next, as shown in FIG. 13, after removal of the patterned resist film PR2, a resist film PR3 extending from the memory formation region MR to the main circuit formation region AR is formed by application. More specifically, a resist film PR3 that covers the gate electrode CG formed in the memory formation region MR and extends over the polysilicon film PF1 formed in the main circuit formation region AR is formed by application. Then, the resist film PR3 is patterned by photolithography. Patterning of the resist film PR3 is performed so as to cover the memory formation region MR and at the same time, cover a gate electrode formation region of the main circuit formation region AR. By etching with the patterned resist film PR3 as a mask, the polysilicon film PF1 is processed and a gate electrode G1 and a gate electrode G2 are formed in the low breakdown voltage MISFET formation region LR of the main circuit formation region AR and in the high breakdown voltage MISFET formation region HR of the main circuit formation region AR, respectively. Simultaneously, a residue portion LFT1 which is a residue of the polysilicon film PF1 is formed in the boundary region BR. As a result, in the boundary region BR, the residue pattern LFT having a structure in which the residue portion LFT1 has, on the side wall thereof, the residue portion LFT3 via the residue portion LFT2 remains.

Figure 14:
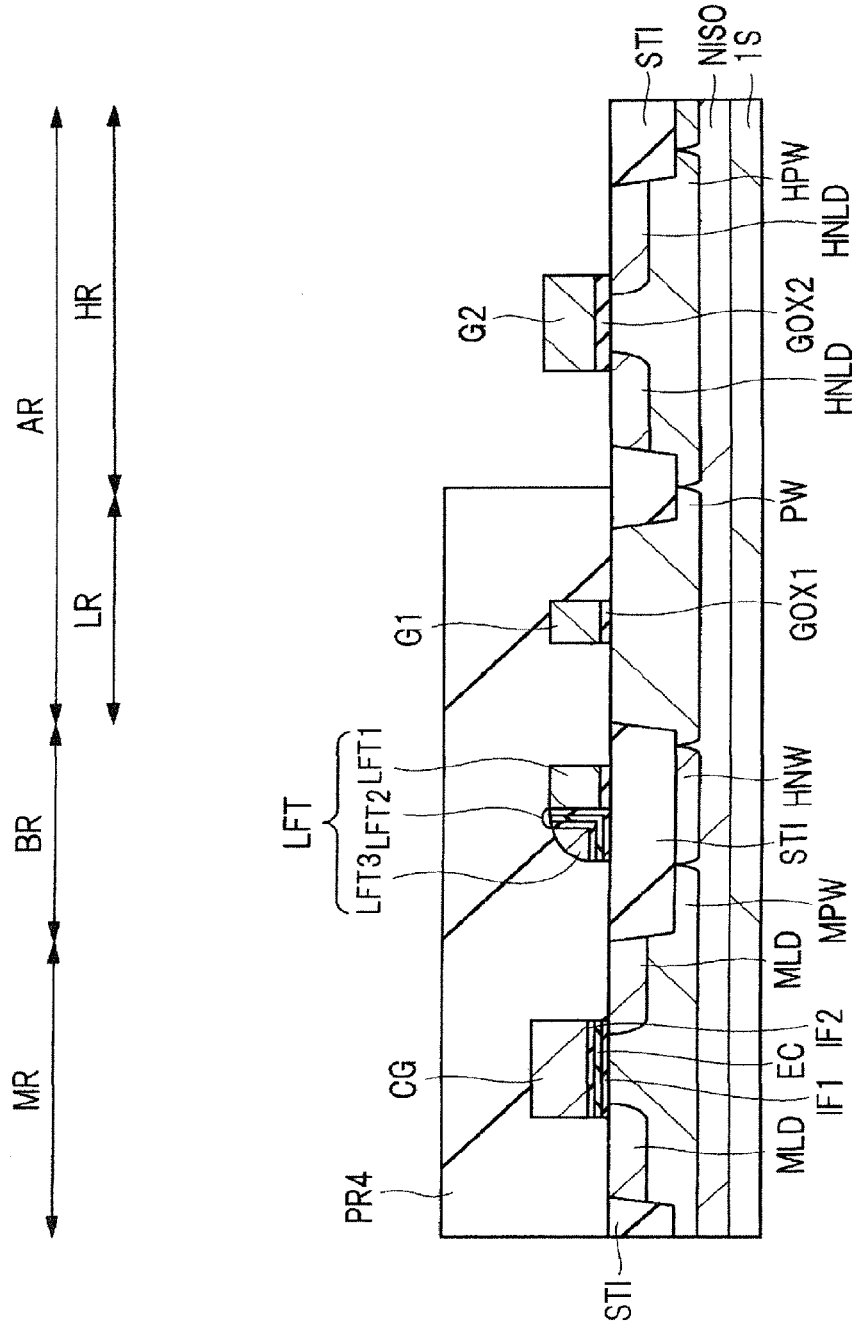
FIG. 14 is a cross-sectional view showing a manufacturing step of the semiconductor device following that of FIG. 13.

Next, as shown in FIG. 14, after removal of the patterned resist film PR3, a resist film PR4 is formed on the semiconductor substrate 1S by application. The resist film PR4 is then patterned by photolithography. Patterning of the resist film PR4 is performed so as to cover the memory formation region MR, the boundary region BR, and the low breakdown voltage MISFET formation region LR, while exposing the high breakdown voltage MISFET formation region HR. Then, by ion implantation with the patterned resist film PR4 as a mask, an n⁻ type semiconductor region HNLD is formed in the semiconductor substrate 1S of the high breakdown voltage MISFET formation region HR in alignment with the gate electrode G2.

Figure 15:
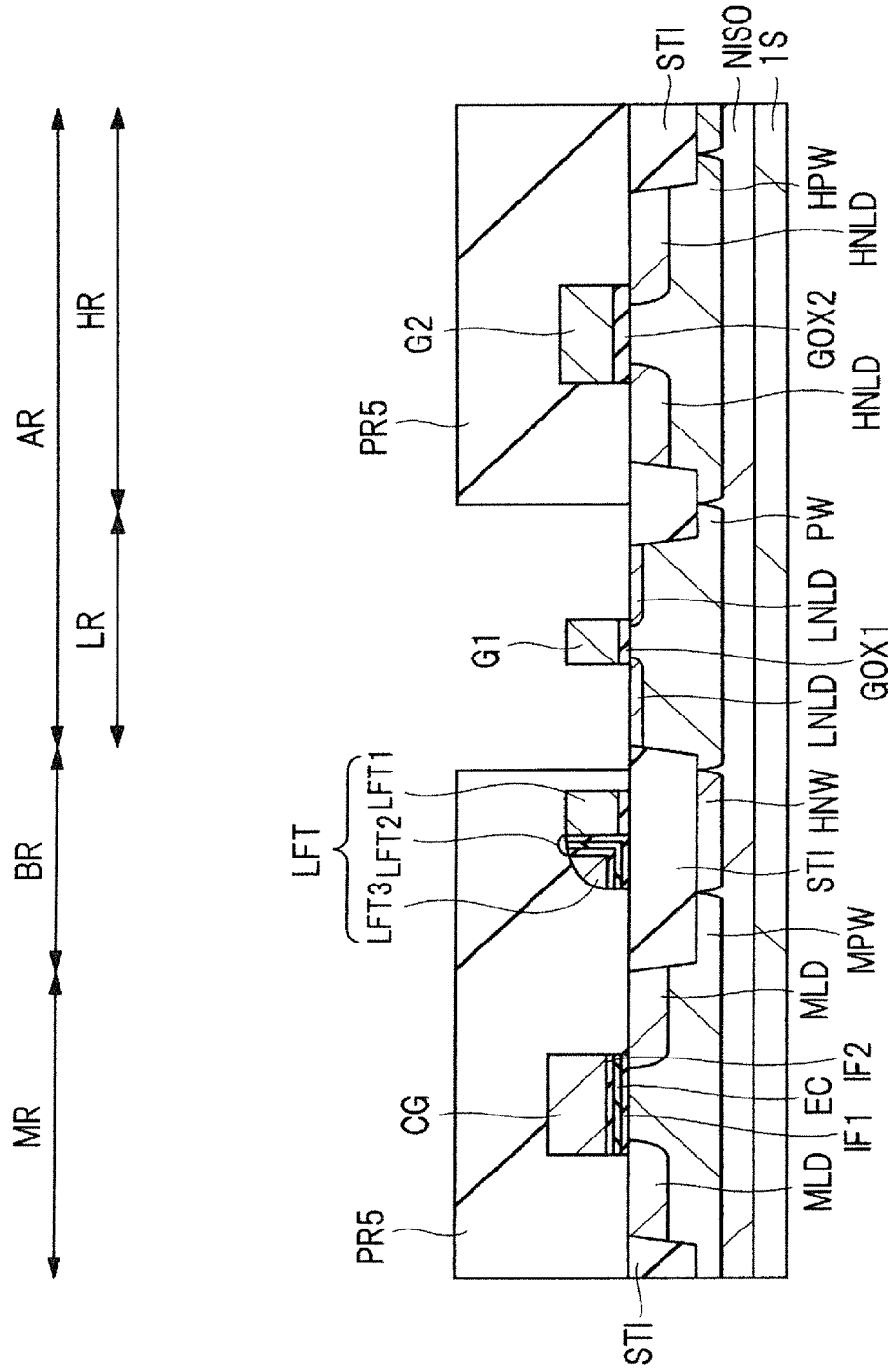
FIG. 15 is a cross-sectional view showing a manufacturing step of the semiconductor device following that of FIG. 14.

Next, as shown in FIG. 15, after removal of the patterned resist film PR4, a resist film PR5 is formed on the semiconductor substrate 1S by application. Then, the resist film PR5 is patterned by photolithography. Patterning of the resist film PR5 is performed so as to cover the memory formation region MR, the boundary region BR, and the high breakdown voltage MISFET formation region HR, while exposing the low breakdown voltage MISFET formation region LR. Then, by ion implantation with the patterned resist film PR5 as a mask, an n⁻ type semiconductor region LNLD is formed in the semiconductor substrate 1S of the low breakdown voltage MISFET formation region LR in alignment with the gate electrode G1.

Figure 16:
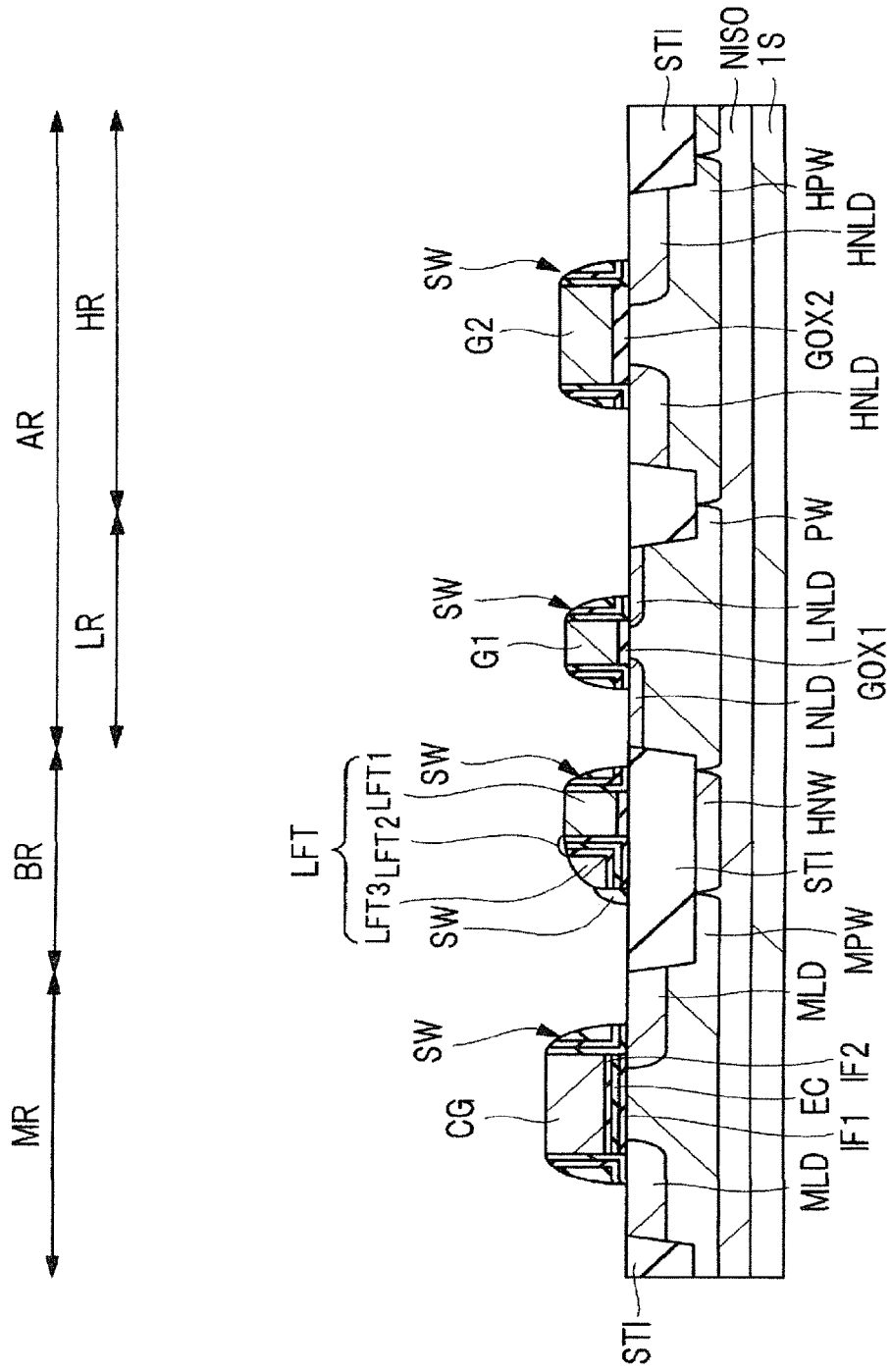
FIG. 16 is a cross-sectional view showing a manufacturing step of the semiconductor device following that of FIG. 15.

Next, after removal of the patterned resist film PR5, a stacked film of a silicon oxide film, a silicon nitride film, and a silicon oxide film is formed on the semiconductor substrate 1S as shown in FIG. 16. For the formation of the silicon oxide film and the silicon nitride film, for example, CVD can be used. Then, the stacked film is anisotropically etched to form a side wall SW. More specifically, the side wall SW is formed on both side walls of the gate electrode CG (staked structure: gate electrode CG+ONO film) in the memory formation region MR. In the low breakdown voltage MISFET formation region LR of the main circuit formation region AR, on the other hand, a side wall SW is formed on both side walls of the gate electrode G1 and in the high breakdown voltage MISFET formation region HR of the main circuit formation region AR, a side wall SW is formed on both side walls of the gate electrode G2. Also in the boundary region BR, a side wall SW is formed on the side wall of the residue pattern LFT.

Figure 17:
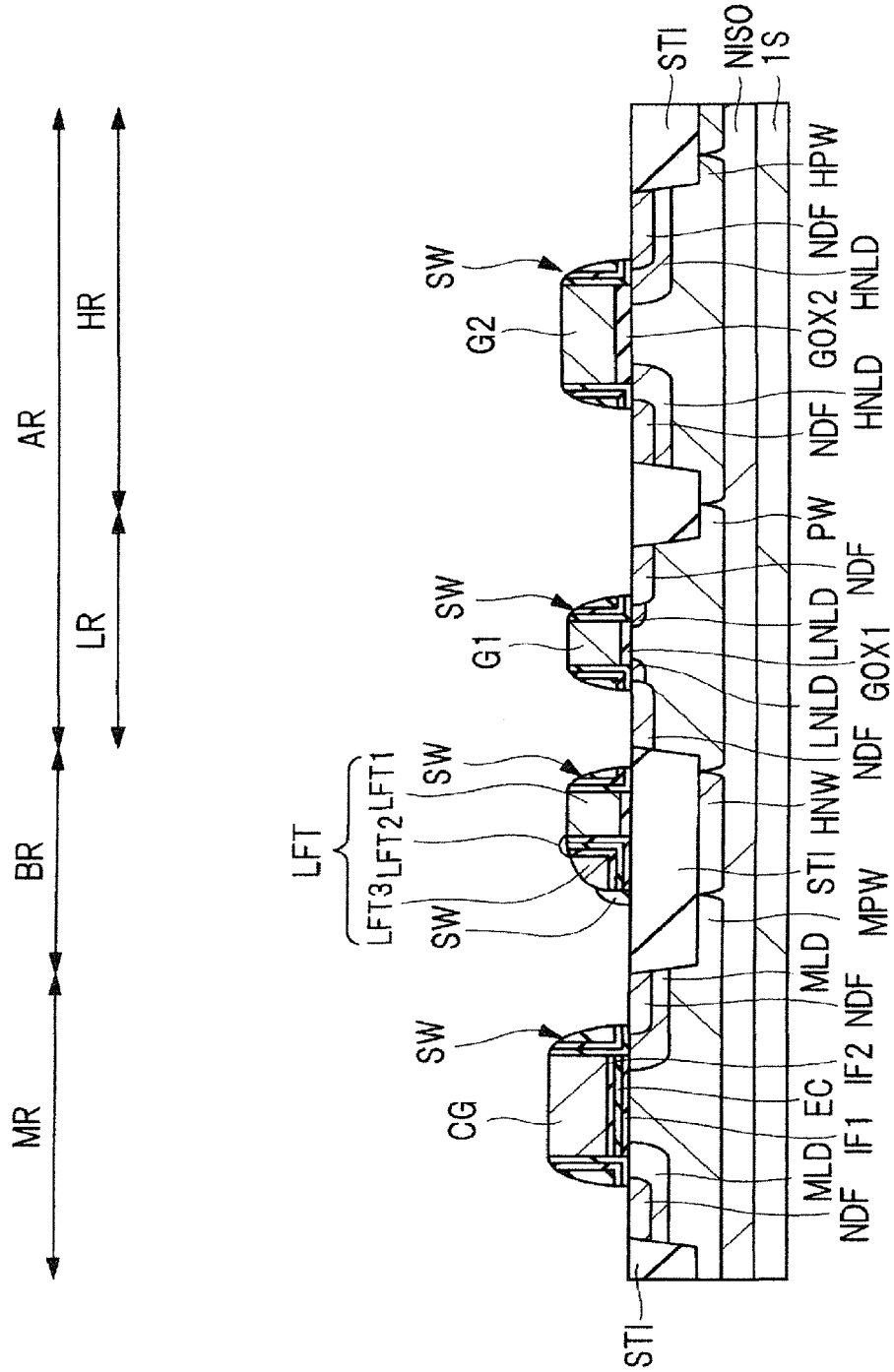
FIG. 17 is a cross-sectional view showing a manufacturing step of the semiconductor device following that of FIG. 16.

Next, as shown in FIG. 17, by using photolithography and ion implantation, an n⁺ type semiconductor region (diffusion layer or heavily doped impurity diffusion region) NDF is formed in the memory formation region MR in alignment with the side wall SW. The n⁺ type semiconductor region NDF is a semiconductor region implanted with an n type impurity such as phosphor or arsenic. The n⁺ type semiconductor region NDF and the n⁻ type semiconductor region MLD configure the source or drain region of the MONOS transistor. By forming each of the source region and drain region of the MONOS transistor from the n⁺ type semiconductor region NDF and the n⁻ type semiconductor region MLD, the source region and the drain region of the MONOS transistor can each have an LDD (lightly doped drain) structure.

By a similar ion implantation step, an n⁺ type semiconductor region NDF is formed in alignment with the side wall SW also in the low breakdown voltage MISFET formation region LR of the main circuit formation region AR. The n⁺ type semiconductor region NDF and the n⁻ type semiconductor region LNLD configure the source or drain region of the low breakdown voltage MISFET. Also in the low breakdown voltage MISFET, by forming each of the source region and drain region from the n⁺ type semiconductor region NDF and the n⁻ type semiconductor region LNLD, respectively, the source region and the drain region of the low breakdown voltage MISFET can each have an LDD structure.

By a similar ion implantation step, an n⁺ type semiconductor region NDF is formed in alignment with the side wall SW also in the high breakdown voltage MISFET formation region HR of the main circuit formation region AR. The n⁺ type semiconductor region NDF and the n⁻ type semiconductor region HNLD configure the source or drain region of the high breakdown voltage MISFET. Also in the high breakdown voltage MISFET, by forming each of the source region and drain region from the n⁺ type semiconductor region NDF and the n⁻ type semiconductor region HNLD, the source region and the drain region of the high breakdown voltage MISFET can each have an LDD structure.

Thus, in First Embodiment, the n⁺ type semiconductor region NDF of the MONOS transistor, the n⁺ type semiconductor region NDF of the low breakdown voltage MISFET, and the n⁺ type semiconductor region NDF of the high breakdown voltage MISFET are formed together. This means that in First Embodiment, the n⁺ type semiconductor region NDF of the MONOS transistor, the n⁺ type semiconductor region NDF of the low breakdown voltage MISFET, and the n⁺ type semiconductor region NDF of the high breakdown voltage MISFET are formed simultaneously by ion implantation using a common mask. As a result, according to First Embodiment, an additional mask for the formation of the n⁺ type semiconductor region NDF of the MONOS transistor becomes unnecessary. According to First Embodiment, therefore, the number of additional masks necessary for mix-loading of the MONOS transistor can be reduced.

Figure 18:
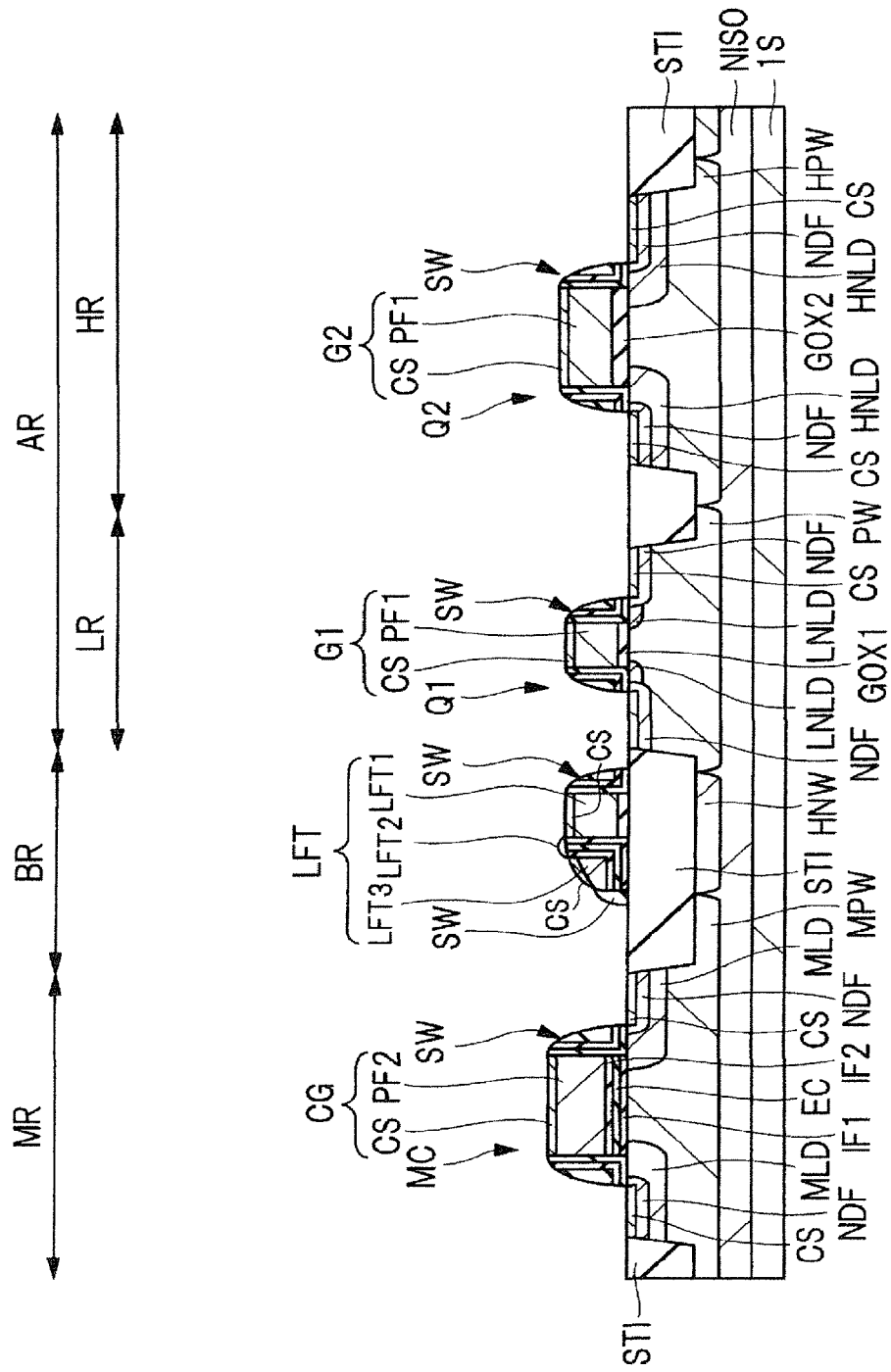
FIG. 18 is a cross-sectional view showing a manufacturing step of the semiconductor device following that of FIG. 17.

Next, as shown in FIG. 18, after formation of a nickel platinum film (NiPt film) on the semiconductor substrate 1S, heat treatment is performed to cause a reaction between the polysilicon film PF2 configuring the gate electrode CG and the nickel platinum film in the memory formation region MR to form a silicide film CS made of a nickel platinum silicide film (NiPtSi film). As a result, the gate electrode CG has a stacked structure of the polysilicon film PF2 and the silicide film CS. Similarly, silicon and the nickel platinum film react with each other on the surface of the n⁺ type semiconductor region NDF to form a silicide film CS.

Similarly, a silicide film CS made of a nickel platinum silicide film is formed on the surface of the polysilicon film PF1 configuring the gate electrode G1 also in the low breakdown voltage MISFET formation region LR of the main circuit formation region AR. As a result, the gate electrode G1 is comprised of the polysilicon film PF1 and the silicide film CS. A silicide film CS made of a nickel platinum silicide film is also formed as a result of a reaction between silicon and the nickel platinum film on the surface of the n⁺ type semiconductor region NDF.

Similarly, a silicide film CS made of a nickel platinum silicide film is formed on the surface of the polysilicon film PF1 configuring the gate electrode G2 also in the high breakdown voltage MISFET formation region HR of the main circuit formation region AR. As a result, the gate electrode G2 is comprised of the polysilicon film PF1 and the silicide film CS. Also, a silicide film CS made of a nickel platinum silicide film is formed as a result of a reaction between silicon and the nickel platinum film on the surface of the n⁺ type semiconductor region NDF.

In First Embodiment, the nickel platinum silicide film is formed, but, for example, a cobalt silicide film, a nickel silicide film, a titanium silicide film, or a platinum silicide film may be formed instead of the nickel platinum silicide film.

As described above, the MONOS transistor is formed in the memory formation region MR of the semiconductor substrate 1S, the low breakdown voltage MISFETQ1 is formed in the low breakdown voltage MISFET formation region LR of the main circuit formation region AR, and the high breakdown voltage MISFETQ2 is formed in the high breakdown voltage MISFET formation region HR of the main circuit formation region AR.

Figure 19:
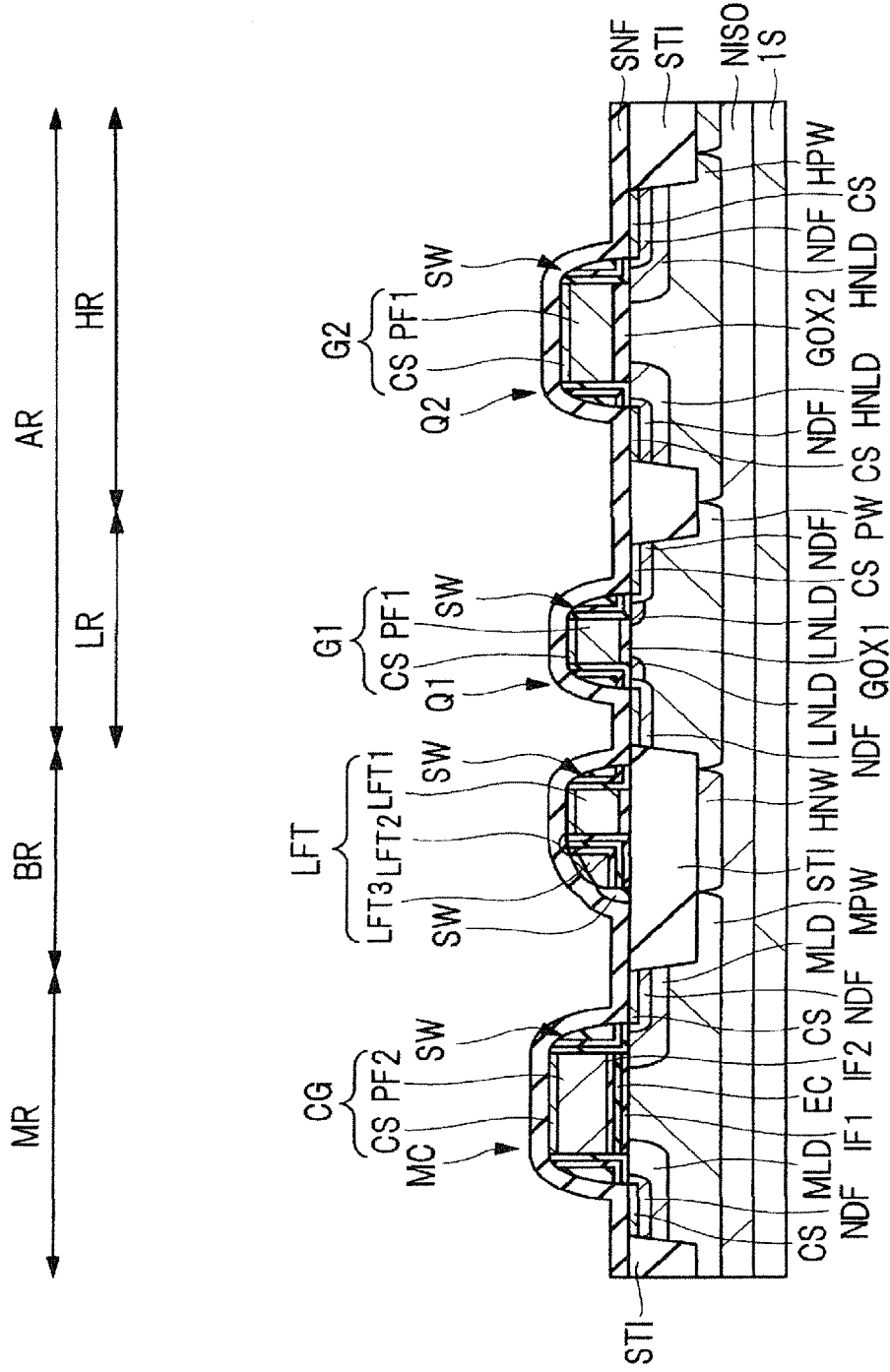
FIG. 19 is a cross-sectional view showing a manufacturing step of the semiconductor device following that of FIG. 18.
Figure 20:
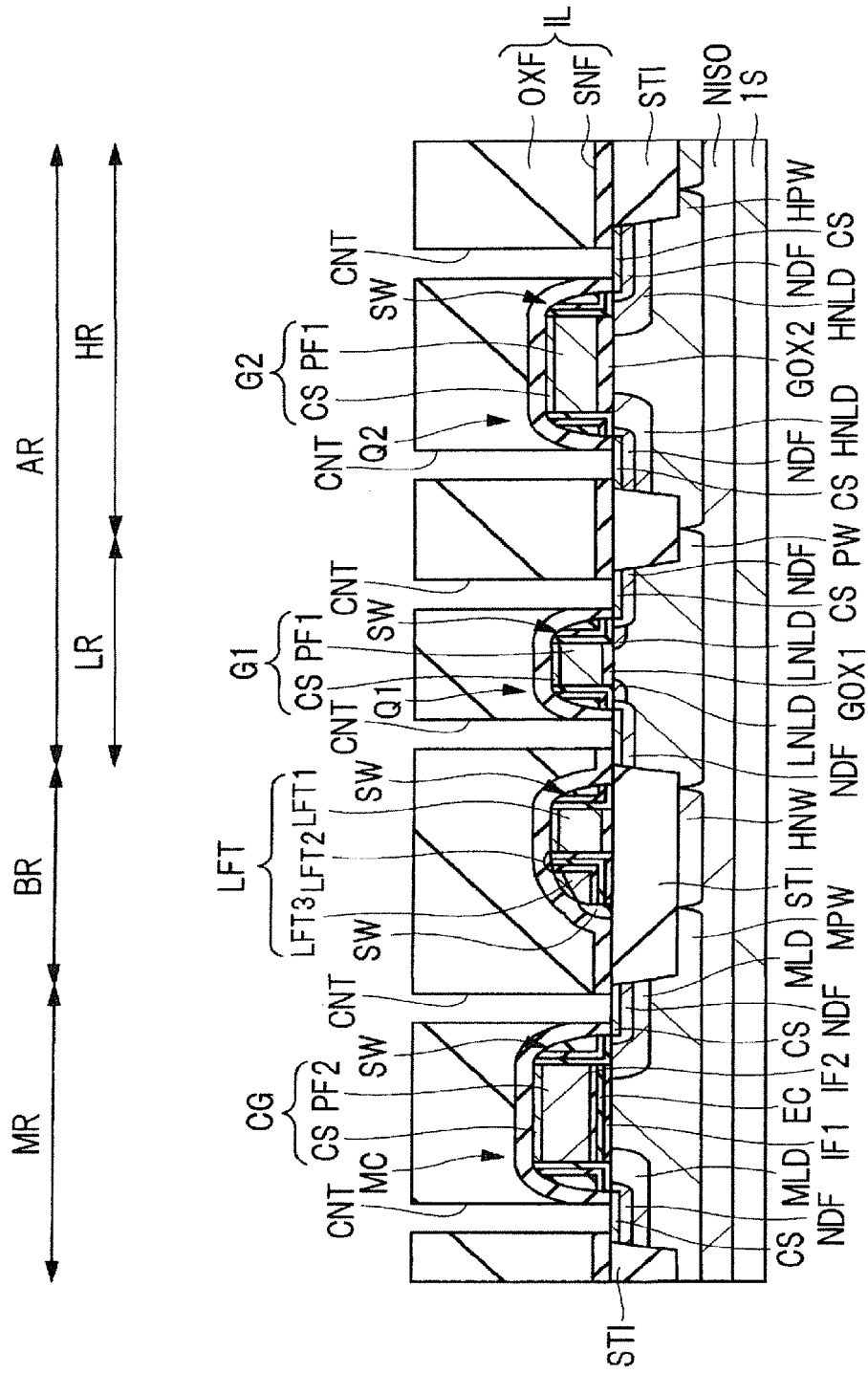
FIG. 20 is a cross-sectional view showing a manufacturing step of the semiconductor device following that of FIG. 19.

Next, a wiring step will be described. As shown in FIG. 19, a silicon nitride film SNF is formed on the main surface of the semiconductor substrate 1S. Then, as shown in FIG. 20, by forming a silicon oxide film OXF on the silicon nitride film SNF, a contact interlayer insulating film IL comprised of the silicon nitride film SNF and the silicon oxide film OXF can be formed. The surface of the contact interlayer insulating film IL is then planarized by using, for example, CMP (chemical mechanical polishing).

Next, as shown in FIG. 20, a contact hole CNT is formed in the contact interlayer insulating film IL by using photolithography and etching. Then, as shown in FIG. 3, a titanium/titanium nitride film is formed on the contact interlayer insulating film IL including the bottom surface and the inner wall of the contact hole CNT. The titanium/titanium nitride film is comprised of a stacked film of a titanium film and a titanium nitride film and can be formed using, for example, sputtering. This titanium/titanium nitride film prevents diffusion of, for example, tungsten, a material of a film to be filled in the later step, into silicon. In short, it has a so-called barrier property.

A tungsten film is formed on the entire main surface of the semiconductor substrate 1S so as to fill the contact hole CNT. The tungsten film can be formed, for example, by CVD. An unnecessary portion of the titanium/titanium nitride film and tungsten film formed on the contact interlayer insulating film IL is removed, for example, by CMP. Then, annealing is performed in a hydrogen atmosphere to form a plug PLG.

Next, as shown in FIG. 3, an interlayer insulating film IL1 made of, for example, a silicon oxide film is formed on the contact interlayer insulating film IL having therein the plug PLG. A wiring trench is then formed in the interlayer insulating film IL1 by photolithography and etching. Then, a tantalum/tantalum nitride film is formed on the interlayer insulating film IL1 and also in the wiring trench. The tantalum/tantalum nitride film can be formed, for example, by sputtering. Then, after formation of a seed film made of a thin copper film on the tantalum/tantalum nitride film, for example by sputtering, a copper film is formed, by electroplating with the seed film as an electrode, on the interlayer insulating film IL1 having the wiring trench therein. Then, the copper film exposed on the interlayer insulating film IL1 except the inside of the wiring trench is polished and removed, for example, by CMP to leave the copper film only in the wiring trench formed in the interlayer insulating film IL1. Thus, a wiring W1 can be formed. Another wiring is formed above the wiring W1, but a description on it is omitted. In such a manner, the semiconductor device of First Embodiment can be formed finally.

In First Embodiment, an example of forming the wiring W1 made of a copper film has been described. The wiring W1 may be formed, for example, from an aluminum film instead. In this case, a titanium/nitride titanium film, an aluminum film, and a titanium/titanium nitride film are formed successively on the interlayer insulating film IL1 and the plug PLG. These films can be formed using, for example, sputtering. Then, these films are patterned into a wiring W1 by using photolithography and sputtering. As a result, a wiring W1 made of an aluminum film can be formed.

<Characteristics in First Embodiment>

Characteristics of First Embodiment will next be described. The first characteristic in First Embodiment is that as shown in FIGS. 10 to 12, the polysilicon film PF2 is processed with the patterned resist film PR2 as a mask to form a gate electrode CG in the memory formation region MR; and then, by ion implantation using the mask without changing it to another one, the n⁻ type semiconductor region MLD is formed in the semiconductor substrate 1S of the memory formation region MR in alignment with the gate electrode CG. In other words, the first characteristic of First Embodiment is that a mask is shared between formation of the gate electrode CG of the MONOS transistor MC by processing and ion implantation for the formation of the n-type semiconductor region MLD in self alignment with the gate electrode CG of the MONOS transistor MC. As a result, in First Embodiment, the number of additional masks necessary for mix-loading of the MONOS transistor MC can be reduced.

Next, the second characteristic of First Embodiment is that as shown in FIG. 17, the n' type semiconductor region NDF of the MONOS transistor MC, the n⁺ type semiconductor region NDF of the low breakdown voltage MISFETQ1, and the n⁺ type semiconductor region NDF of the high breakdown voltage MISFETQ2 are formed simultaneously.

In other words, the second characteristic of First Embodiment is that the n⁺ type semiconductor region NDF of the MONOS transistor MC, the n⁺ type semiconductor region NDF of the low breakdown voltage MISFETQ1, and the n⁺ type semiconductor region NDF of the high breakdown voltage MISFETQ2 are formed simultaneously by ion implantation using a common mask. According to the second characteristic of First embodiment, an additional mask for forming the n⁺ type semiconductor region NDF of the MONOS transistor MC becomes unnecessary. First Embodiment therefore makes it possible to reduce the number of additional masks necessary for mix-loading of the MONOS transistor MC.

In First Embodiment having both the first characteristic and the second characteristic, the number of masks to be added for mix-loading of the MONOS transistor MC can be made smaller than that in the related technology. More specifically, in the related technology, four additional masks become necessary for mix-loading of the MONOS transistor MC (add-on circuit) with the base product (main circuit). In First Embodiment, on the other hand, the MONOS transistor MC (add-on circuit) can be mix-loaded with the base product (main circuit) by using only two additional masks. According to the semiconductor device of First Embodiment, while minimizing a change in the manufacturing process of the base product having a main circuit therein, it is possible to mix-load the MONOS transistor as an add-on circuit to be added to the main circuit.

In association with the second characteristic of First Embodiment, it seems possible to form the n⁻ type semiconductor region MLD of the MONOS transistor MC, the n-type semiconductor region LNLD of the low breakdown voltage MISFETQ1, and the n⁻ type semiconductor region HNLD of the high breakdown voltage MISFETQ2 simultaneously. It is however difficult to simultaneously form, as the same semiconductor region, the n⁻ type semiconductor region MLD of the MONOS transistor with the n⁻ type semiconductor region LNLD of the low breakdown voltage MISFETQ1 and the n⁻ type semiconductor region HNLD of the high breakdown voltage MISFETQ2 which configure the main circuit, from the standpoint of write operation or disturbance characteristic. In First Embodiment, therefore, a step of forming the n⁻ type semiconductor region MLD of the MONOS transistor MC is performed separately from a step of forming the n⁻ type semiconductor region LNLD of the low breakdown voltage MISFETQ1 or a step of forming the n⁻ type semiconductor region HNLD of the high breakdown voltage MISFETQ2 but the number of additional masks is reduced based on the first characteristic. On the other hand, the n⁺ type semiconductor region NDF of the MONOS transistor MC, the n⁺ type semiconductor region NDF of the low breakdown voltage MISFETQ1, and the n⁺ type semiconductor region NDF of the high breakdown voltage MISFETQ2 can be formed simultaneously as the same semiconductor region by proper optimization and therefore, the number of additional masks is reduced based on the second characteristic.

In First Embodiment, by taking the measures described as the first and second characteristics in the ion implantation step for forming the source region and the drain region of the MONOS transistor MC, the number of additional masks can be reduced. As a result, in First Embodiment, due to a reduction in the number of additional masks, the manufacturing cost of a semiconductor device can be reduced.

The third characteristic of First Embodiment will next be described. FIG. 21 is an explanatory view of the third characteristic in First Embodiment. In the method of manufacturing the semiconductor device of First Embodiment, the polysilicon film PF2 for the formation of the gate electrode CG of the MONOS transistor MC is different from the polysilicon film PF1 for the formation of the gate electrode G1 of the low breakdown voltage MISFETQ1 or the gate electrode G2 of the high breakdown voltage MISFETQ2 so that a residue pattern is inevitably formed in the boundary region BR.

Here, for example, FIG. 21B shows a technology of leaving a resist film in the boundary region BR and thereby intentionally forming a large-size residue pattern LFT(P). As shown in FIG. 21B, the large-size residue pattern LFT(P) thus formed increases adhesive force of the residue pattern LFT(P) so that it gives an advantage that the residue pattern is prevented from peeling off and becoming foreign matters. In consideration of mix-loading of the MONOS transistor as an add-on circuit to be added to the main circuit while minimizing a change in the manufacturing process of the main circuit, however, the increase in the size of the residue pattern has the following disadvantage. Described specifically, as shown in FIG. 21B, the increase in the size of the residue pattern LFT(P) decreases a distance LB between the surface of the contact interlayer insulating film and the upper surface of the residue pattern LFT(P). This means that an increase in a thickness L2 of the contact interlayer insulating film becomes necessary. In other words, the increase in the size of the residue pattern LFT(P) is useful from the standpoint of preventing the residue pattern LFT(P) from peeling off, but this technology needs a change in the manufacturing process of the main circuit in order to ensure a distance LB between the surface of the contact interlayer insulating film and the upper surface of the residue pattern LFT(P). This process therefore has difficulty in minimizing a change in the manufacturing process of the main circuit when the MONOS transistor is mix-loaded. As a result, it increases the manufacturing cost due to a change in the manufacturing process of the main circuit.

On the other hand, FIG. 21A shows the shape of the residue pattern LFT formed in the boundary region BR in First Embodiment. As shown in FIG. 21A, the residue pattern LFT is formed without leaving a resist film in the boundary region BR in First Embodiment (third characteristic). In this case, the height of the residue pattern LFT is not greater than the height of the gate electrode of the field effect transistor formed in the main circuit formation region AR. This means that in First Embodiment, a distance LA can be ensured between the surface of the contact interlayer insulating film and the upper surface of the residue pattern LFT. As a result, according to First embodiment, there is no necessity of changing the thickness L1 of the contact interlayer insulating film and a change in the manufacturing process of the main circuit can be minimized. According to First Embodiment, therefore, an increase in the manufacturing cost due to a change in the manufacturing process of the main circuit is avoidable.

Due to the synergistic effect of first and second characteristics that enable a reduction in the number of additional masks and the third characteristic that enables minimization of a change in the manufacturing process of the main circuit, First Embodiment has a marked effect on reduction in the manufacturing cost of the semiconductor device having the MONOS transistor MC as an add-on circuit to be added to a main circuit.

MODIFICATION EXAMPLE 1

Next, Modification Example 1 will be described. A manufacturing method of a semiconductor device in Modification Example 1 is substantially similar to that of the semiconductor device of First Embodiment so that a difference between them will be described mainly.

Figure 22:
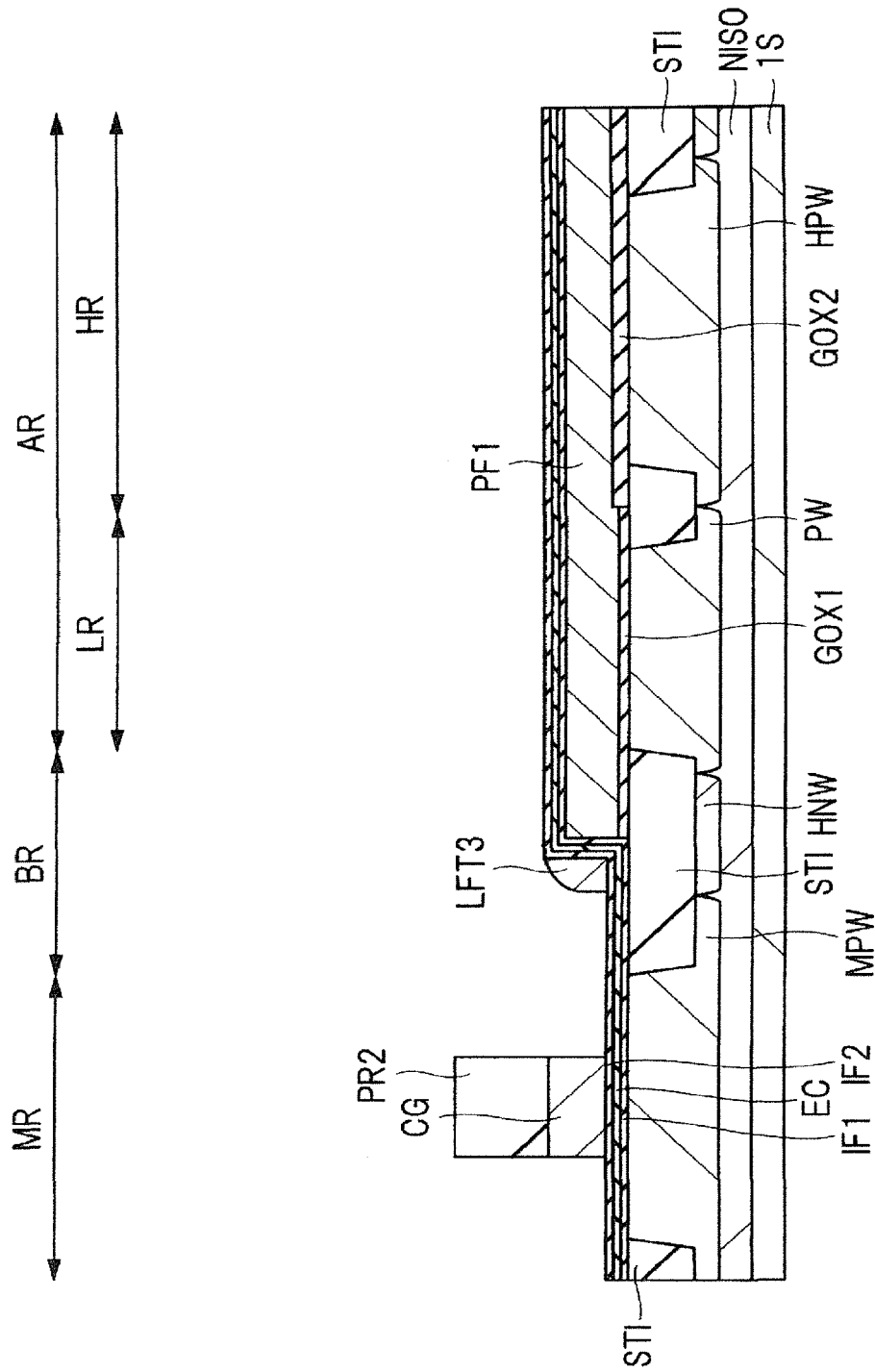
FIG. 22 is a cross-sectional view showing a manufacturing step of a semiconductor device of Modification Example 1.

Similar to First Embodiment, steps shown in FIGS. 7 to 9 are performed. Then, as shown in FIG. 22, a resist film PR2 is formed on the polysilicon film PF2 by application and the resist film PR2 thus formed is patterned using photolithography. The patterning of the resist film PR2 is performed so as to cover the gate electrode formation region of the memory formation region MR and expose the main circuit formation region AR. By etching with the patterned resist film PR2 as a mask, the polysilicon film PF2 is patterned to form a gate electrode CG in the memory formation region MR.

Figure 23:
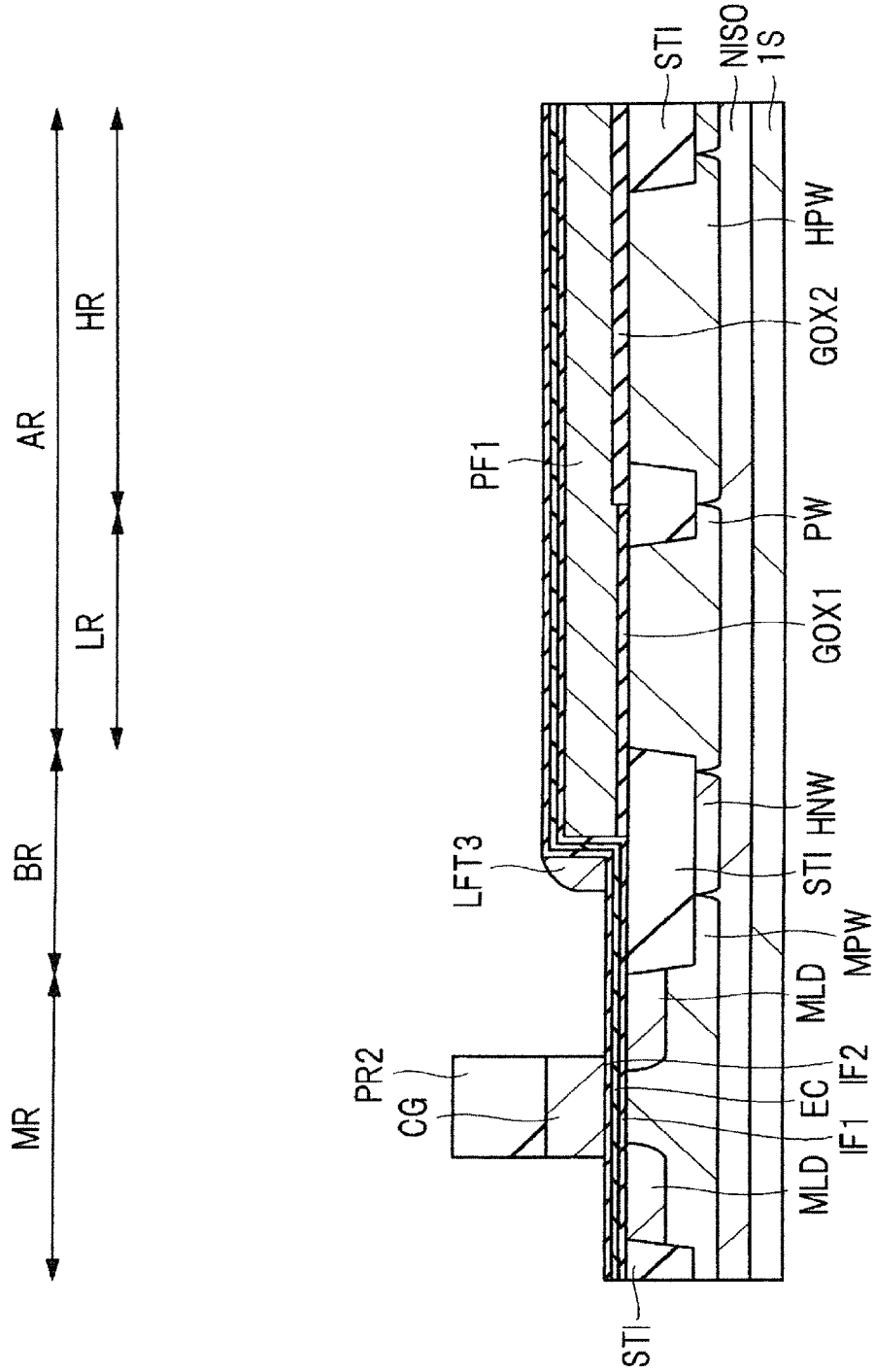
FIG. 23 is a cross-sectional view showing a manufacturing step of the semiconductor device following that of FIG. 22.

Next, as shown in FIG. 23, by ion implantation using the patterned resist film PR2 as a mask without changing it to another one, an n⁻ type semiconductor region MLD is formed in the semiconductor substrate 1S of the memory formation region MR in alignment with the gate electrode CG. Also in Modification Example 1, a mask is shared between processing for the formation of the gate electrode CG of the MONOS transistor and ion implantation for the formation of the n⁻ type semiconductor region MLD in alignment with the gate electrode CG of the MONOS transistor. Also in Modification Example 1, this makes it possible to reduce the number of additional masks to be used for mix-loading of the MONOS transistor.

In Modification Example 1, as shown in FIG. 23, the n⁻ type semiconductor region MLD is formed in the semiconductor substrate 1S via a stacked insulating film comprised of the insulating film IF1, the charge storage film EC, and the insulating film IF2 and exposed from the gate electrode CG. In short, the characteristic of Modification Example 1 is that the n⁻ type semiconductor region MLD is formed by ion implantation while leaving the stacked insulating film exposed from the gate electrode CG.

Figure 24:
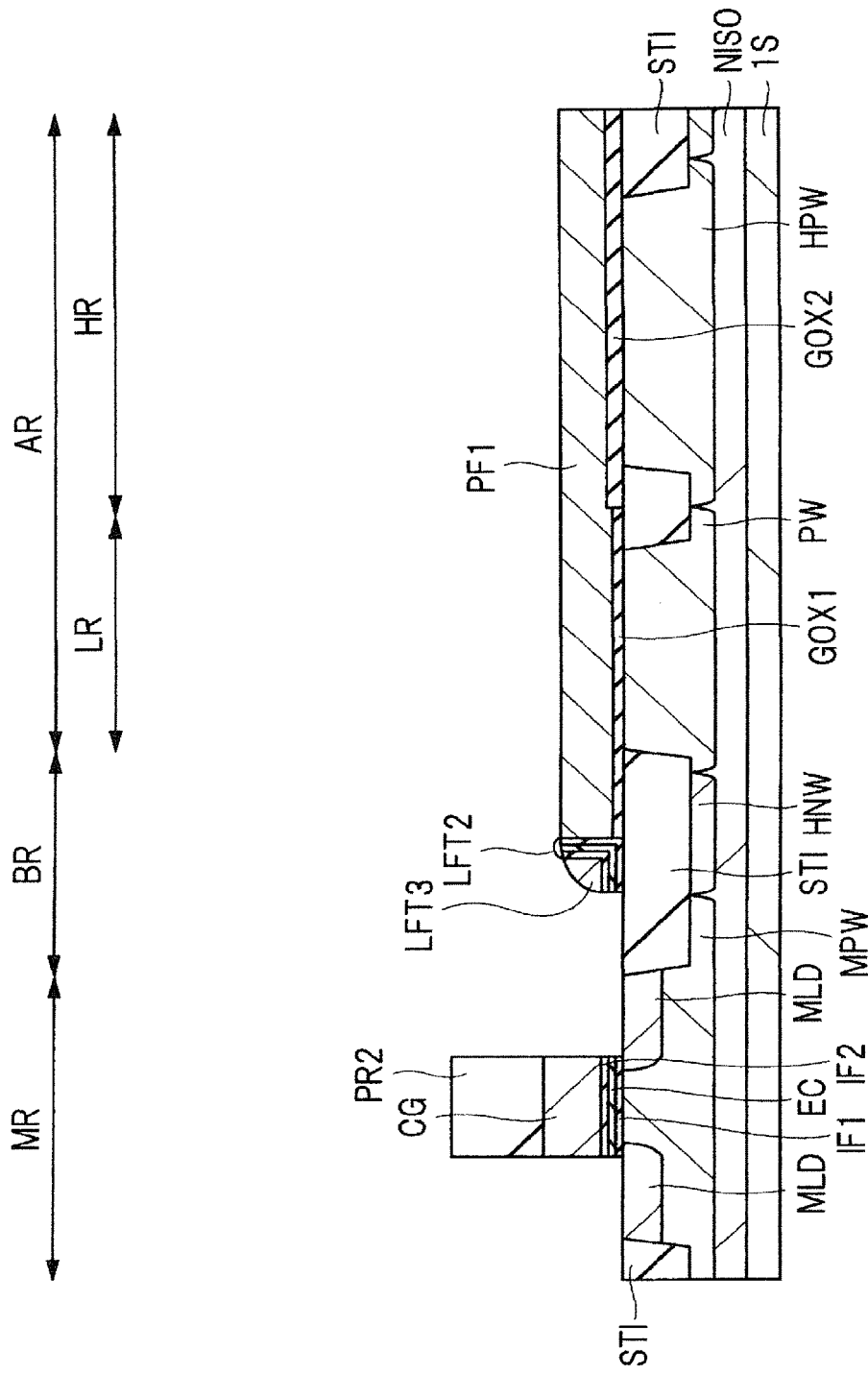
FIG. 24 is a cross-sectional view showing a manufacturing step of the semiconductor device following that of FIG. 23.

Then, as shown in FIG. 24, the exposed insulating film IF2, charge storage film EC, and insulating film IF1 are then removed, for example, by dry etching. Steps after that are similar to those of First Embodiment.

As described above, in the manufacturing method of the semiconductor device in Modification Example 1, since the n⁻ type semiconductor region MLD is formed via the stacked insulating film (the insulating film IF1, the charge storage film EC, and the insulating film IF2) as shown in FIG. 23, the surface of the semiconductor substrate 1S can be protected from the damage which may occur upon ion implantation. In other words, in Modification Example 1, due to the presence of the stacked insulating film, the damage which may occur upon ion implantation can be reduced and at the same time, the surface of the semiconductor substrate 1S can be prevented from contamination which may be caused by ion implantation. Further, the stacked insulating film remaining on the polysilicon film PF1 in the main circuit formation region AR is effective for preventing easy penetration of an ion-implanted conductivity type impurity through the polysilicon film PF1.

MODIFICATION EXAMPLE 2

Next, Modification Example 2 will be described. A manufacturing method of a semiconductor device in Modification Example 2 is almost similar to that of the semiconductor device of First Embodiment so that a difference between them will be described mainly.

Figure 25:
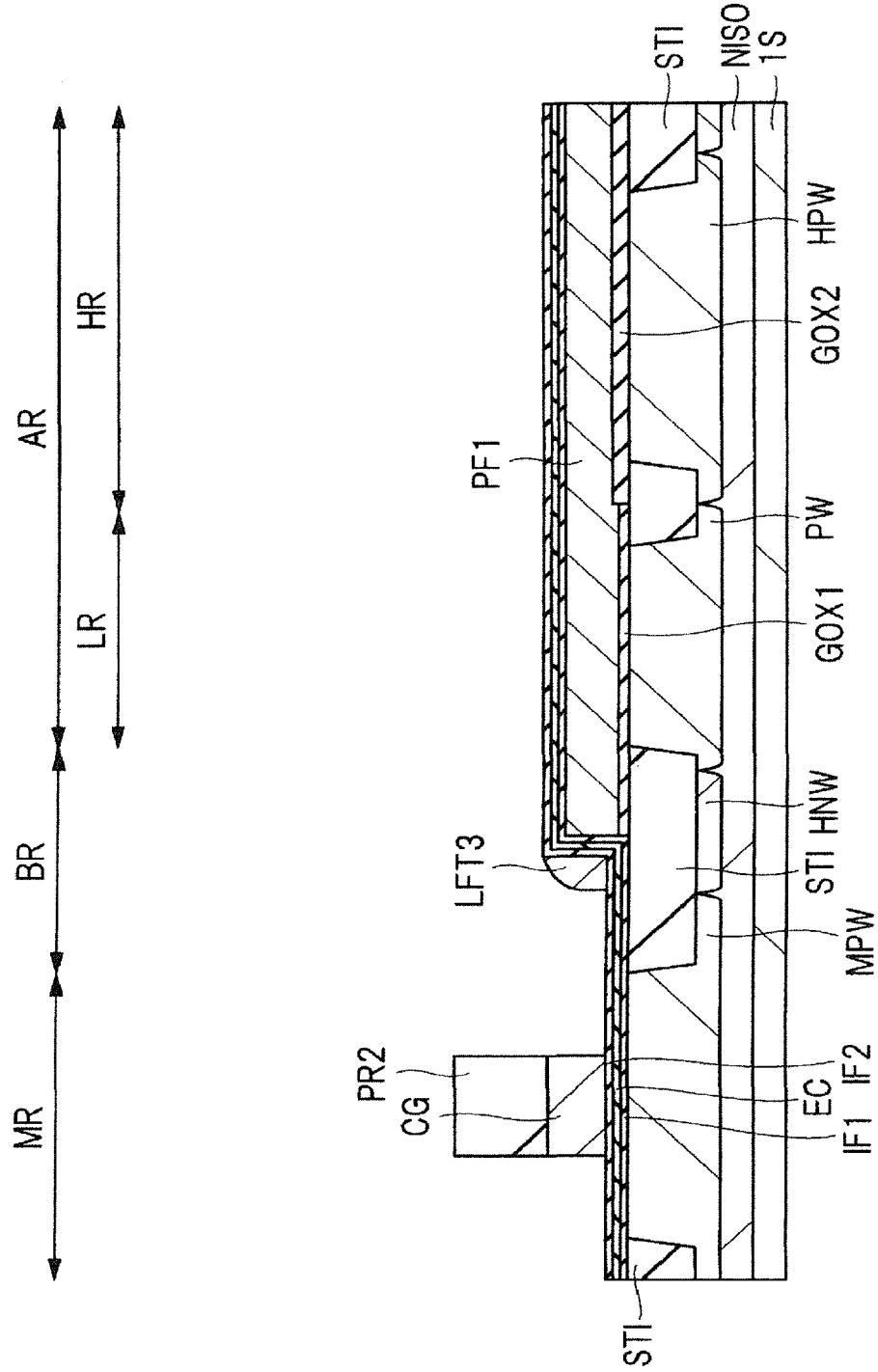
FIG. 25 is a cross-sectional view showing a manufacturing step of a semiconductor device of Modification Example 2.

In a manner similar to that of First Embodiment, steps shown in FIGS. 7 to 9 are performed. Then, as shown in FIG. 25, a resist film PR2 is formed on the polysilicon film PF2 by application and the resist film PR2 is patterned using photolithography. Patterning of the resist film PR2 is performed so as to cover the gate electrode formation region of the memory formation region MR and at the same time, expose the main circuit formation region AR. By etching with the patterned resist film PR2 as a mask, the polysilicon film PF2 is patterned to form a gate electrode CG in the memory formation region MR.

Figure 26:
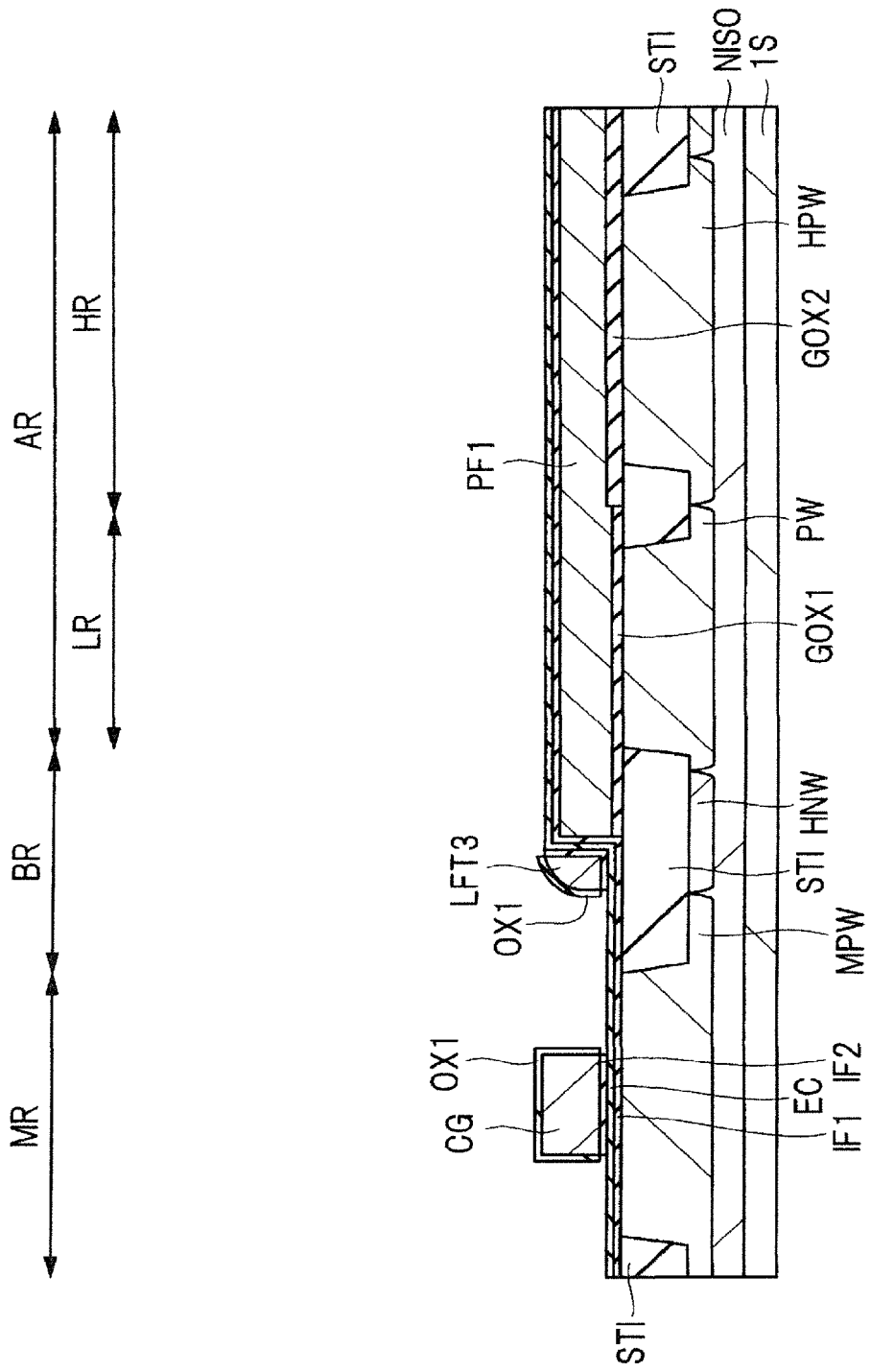
FIG. 26 is a cross-sectional view showing a manufacturing step of the semiconductor device following that of FIG. 25.

Next, as shown in FIG. 26, after removal of a mask made of the patterned resist film PR2, the insulating film IF2 exposed from the gate electrode CG is removed, for example, by wet etching. Then, the exposed surface of the gate electrode CG is oxidized to form a silicon oxide film OX1 on the exposed surface of the gate electrode CG.

Figure 27:
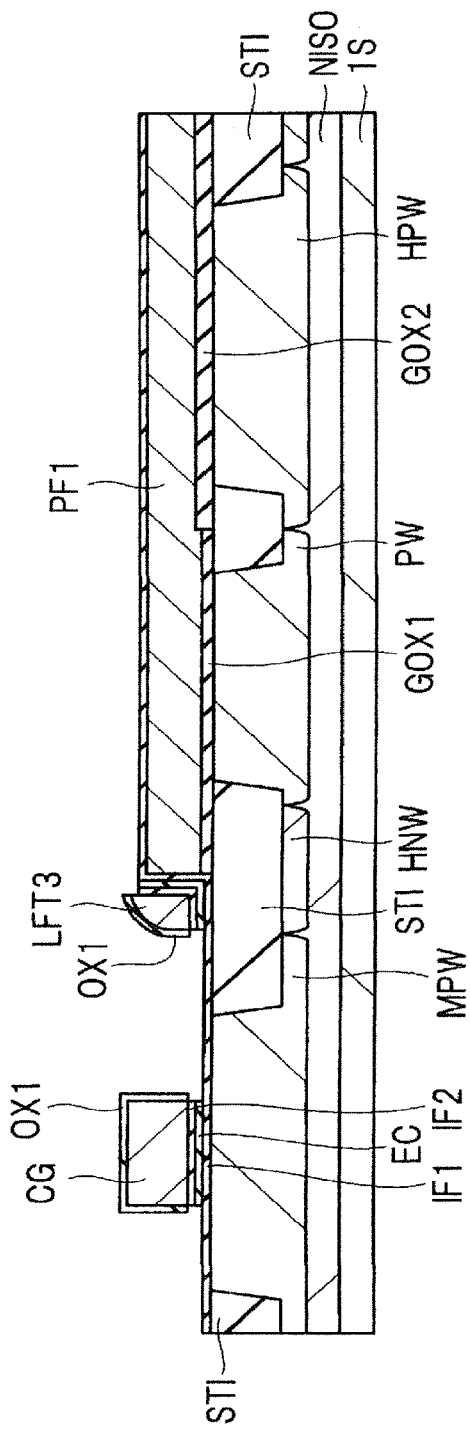
FIG. 27 is a cross-sectional view showing a manufacturing step of the semiconductor device following that of FIG. 26.
Figure 28:
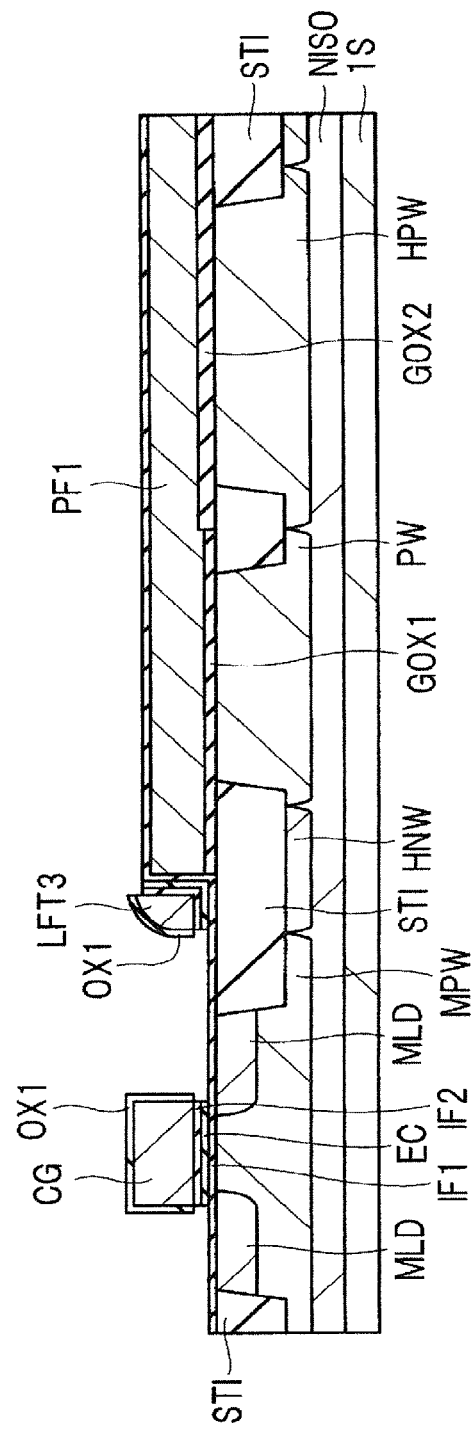
FIG. 28 is a cross-sectional view showing a manufacturing step of the semiconductor device following that of FIG. 27.

Then, as shown in FIG. 27, the charge storage film EC made of a silicon nitride film is removed, for example, by wet etching with hot phosphoric acid. Then, as shown in FIG. 28, by ion implantation using the gate electrode CG as a mask, an n⁻ type semiconductor region MLD is formed in the semiconductor substrate 1S of the memory formation region MR in alignment with the gate electrode CG. In FIG. 28, it is also possible to form, after removal of the insulating film IF1 exposed from the gate electrode CG by wet etching, the n⁻ type semiconductor region MLD in the semiconductor substrate 1S of the memory formation region MR in alignment with the gate electrode CG by ion implantation using the gate electrode CG as a mask. Steps after that are similar to those of First Embodiment.

As described above, in the manufacturing method of the semiconductor device in Modification Example 2, the semiconductor substrate 1S can be prevented from the damage due to dry etching because the stacked insulating film is removed not by dry etching but by wet etching. Further, in Modification Example 2, the silicon oxide film OX1 is formed on the exposed surface of the gate electrode CG and this silicon oxide film OX1 functions as an offset spacer during the ion implantation step using the gate electrode CG as a mask so that a short-channel effect at the MONOS transistor MC can be suppressed.

MODIFICATION EXAMPLE 3

Next, Modification Example 3 will be described. A manufacturing method of a semiconductor device in Modification Example 3 is substantially similar to that of the semiconductor device of First Embodiment so that a difference between them will be described mainly.

Figure 29:
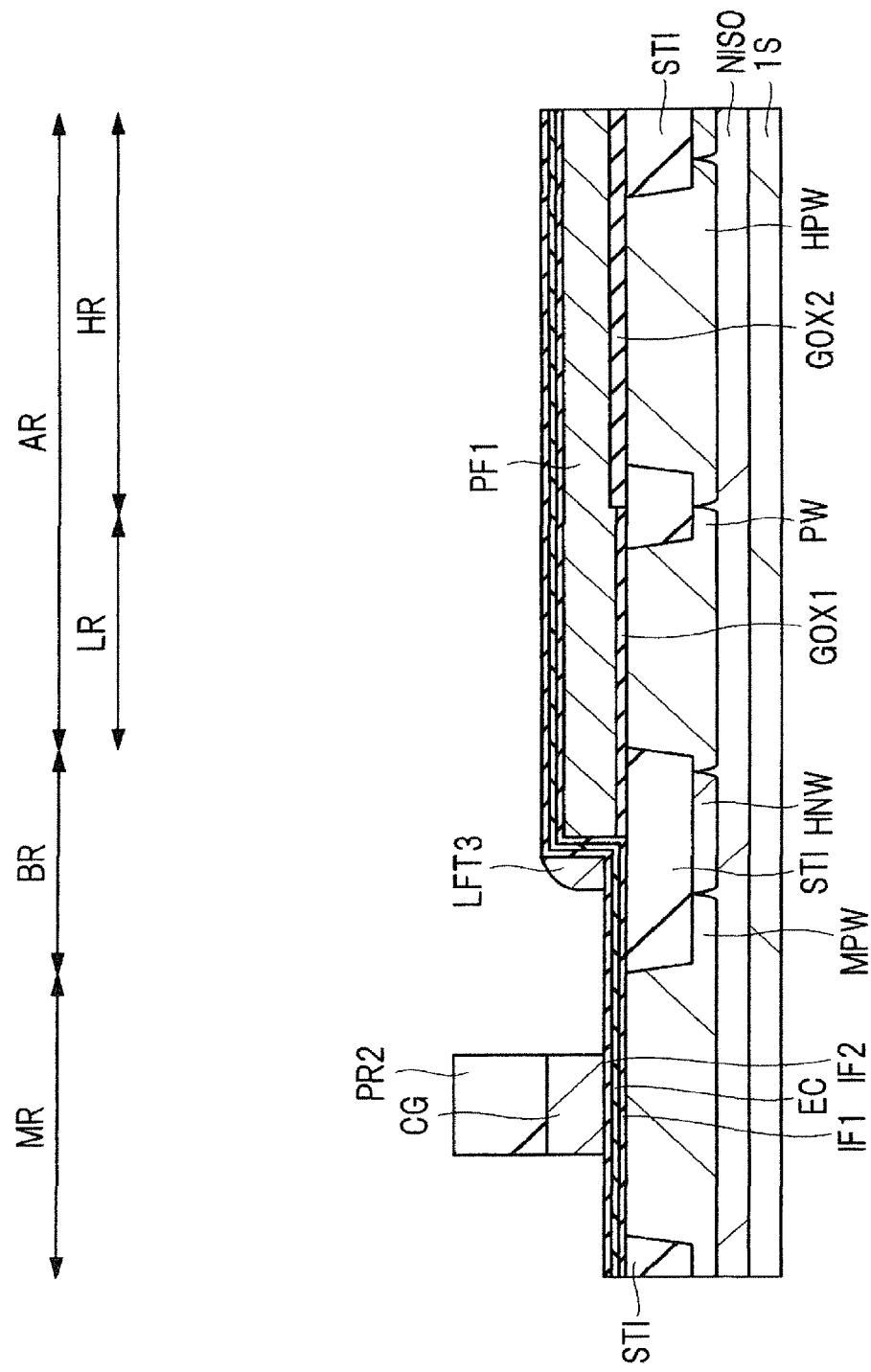
FIG. 29 is a cross-sectional view showing a manufacturing step of a semiconductor device of Modification Example 3.

In a manner similar to First Embodiment, steps shown in FIGS. 7 to 9 are performed. Then, as shown in FIG. 29, a resist film PR2 is formed on the polysilicon film PF2 by application and the resist film PR2 is patterned using photolithography. Patterning of the resist film PR2 is performed so as to cover the gate electrode formation region of the memory formation region MR and at the same time, expose the main circuit formation region AR. By etching with the patterned resist film PR2 as a mask, the polysilicon film PF2 is patterned to form a gate electrode CG in the memory formation region MR.

Figure 30:
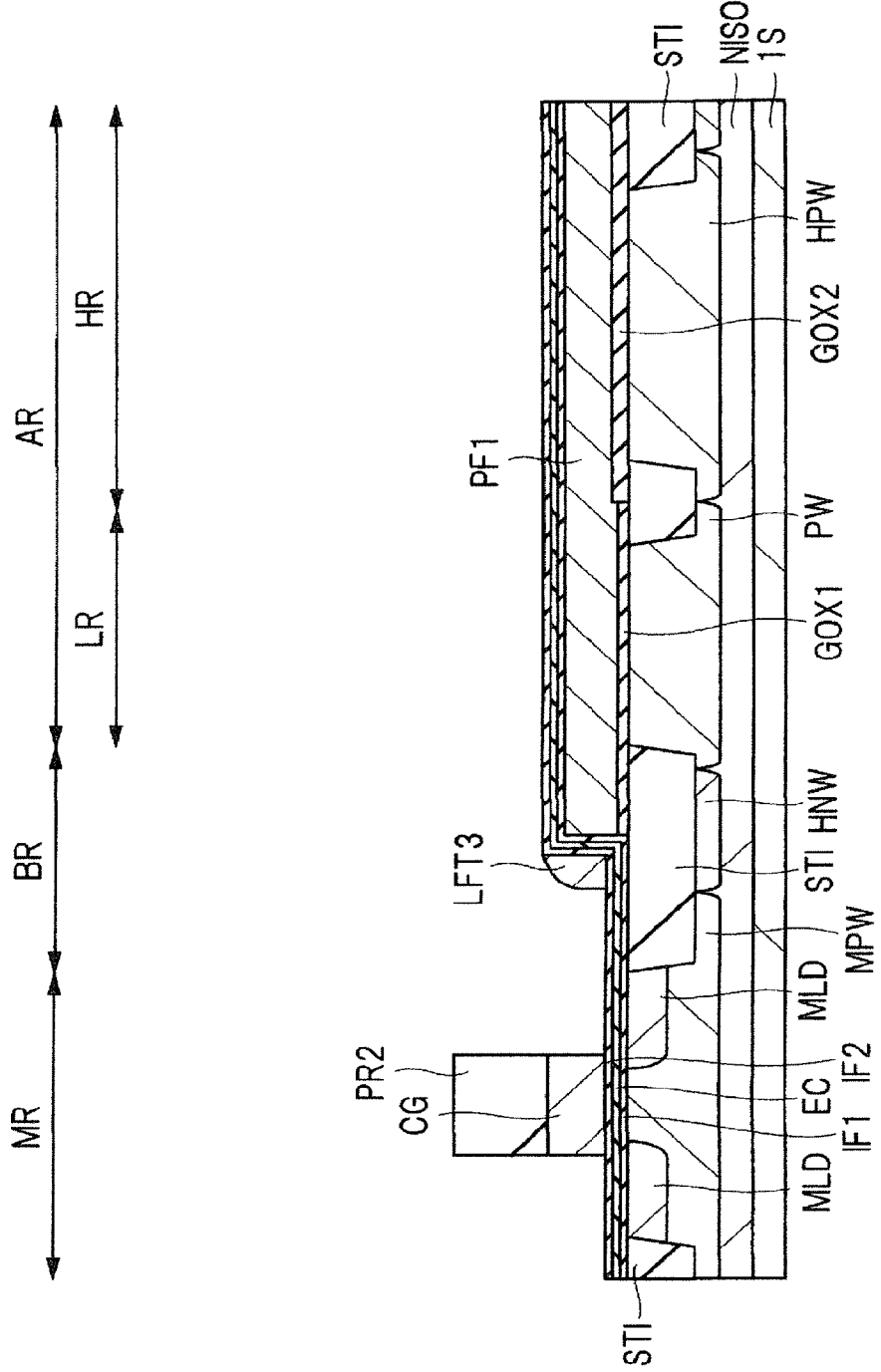
FIG. 30 is a cross-sectional view showing a manufacturing step of the semiconductor device following that of FIG. 29.

Next, as shown in FIG. 30, by ion implantation using the patterned resist film PR2 as a mask without changing it to another one, an n⁻ type semiconductor region MLD is formed in the semiconductor substrate 1S of the memory formation region MR in alignment with the gate electrode CG. At this time, in Modification Example 3, the n⁻ type semiconductor region MLD is formed in the semiconductor substrate 1S via the stacked insulating film (the insulating film IF1, the charge storage film EC, and the insulating film IF2) exposed from the gate electrode CG.

Figure 31:
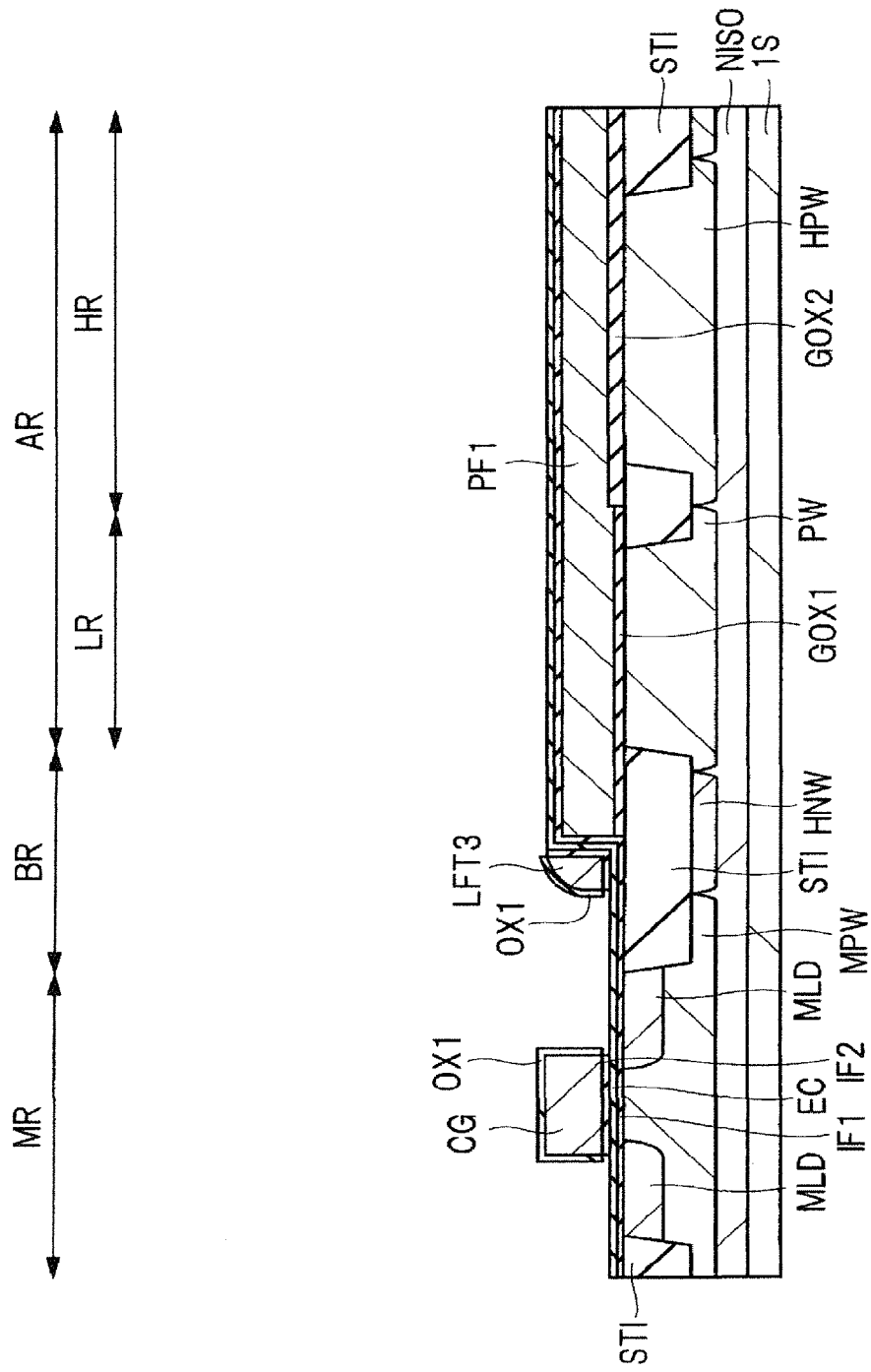
FIG. 31 is a cross-sectional view showing a manufacturing step of the semiconductor device following that of FIG. 30.

Then, as shown in FIG. 31, after removal of the mask made of the patterned resist film PR2, the insulating film IF2 exposed from the gate electrode CG is removed, for example, by wet etching. Then, the exposed surface of the gate electrode CG is oxidized to form a silicon oxide film OX1 on the exposed surface of the gate electrode CG.

Figure 32:
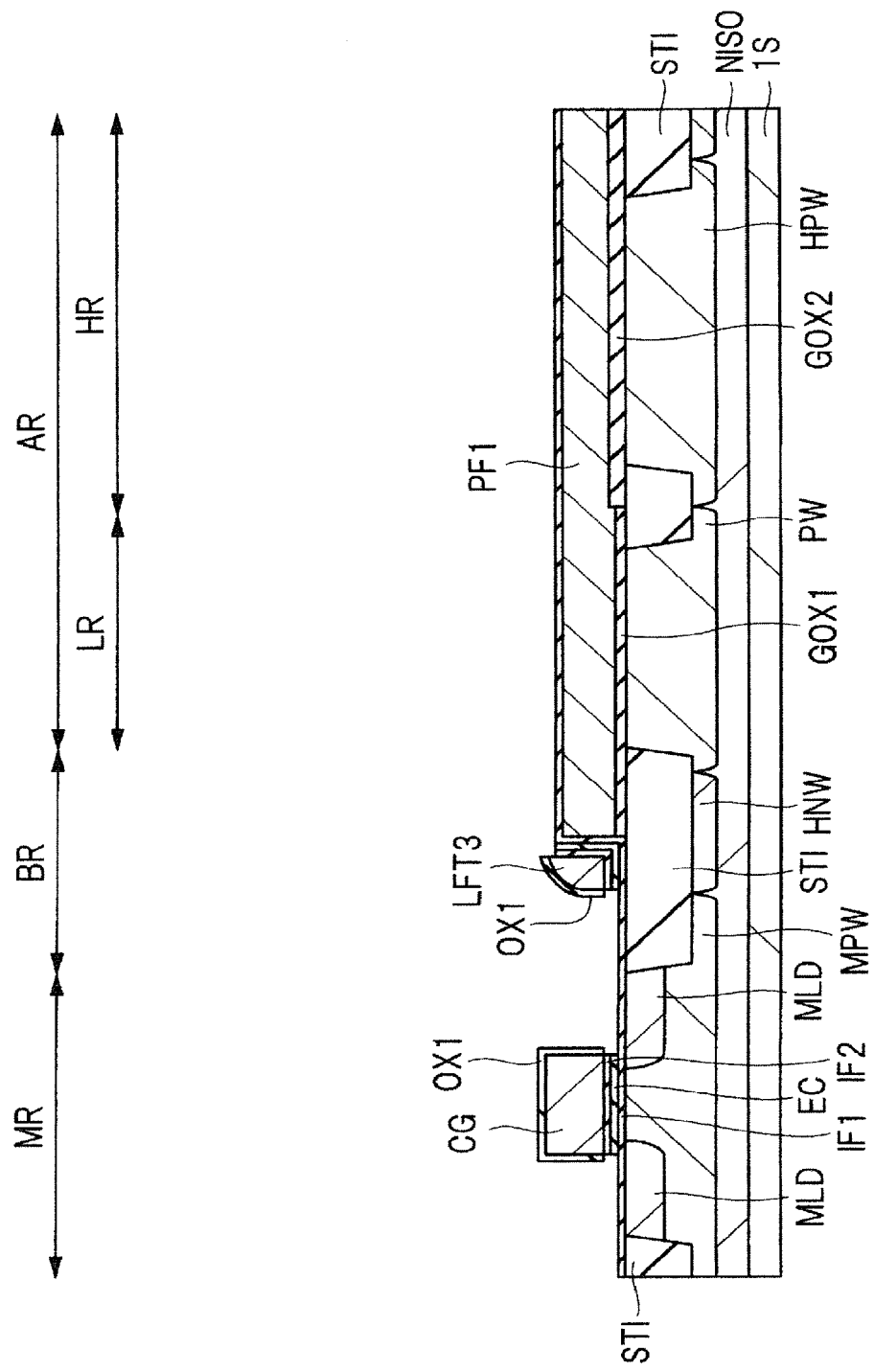
FIG. 32 is a cross-sectional view showing a manufacturing step of the semiconductor device following that of FIG. 31.

Next, as shown in FIG. 32, for example, the charge storage film EC made of a silicon nitride film is removed by wet etching with hot phosphoric acid. After the step shown in FIG. 32, the insulating film IF1 exposed from the gate electrode CG is removed by wet etching (not illustrated). Steps after that are similar to those of First Embodiment.

As described above, the manufacturing method of the semiconductor device in Modification Example 3 can suppress the semiconductor substrate 1S from being damaged by dry etching because the stacked insulating film is removed not by dry etching but by wet etching.

SECOND EMBODIMENT

In Second Embodiment, a semiconductor device having both a main circuit having a power transistor and a MONOS transistor included in an add-on circuit will be described.
<Layout Configuration Example of Semiconductor Chip>

Figure 33:
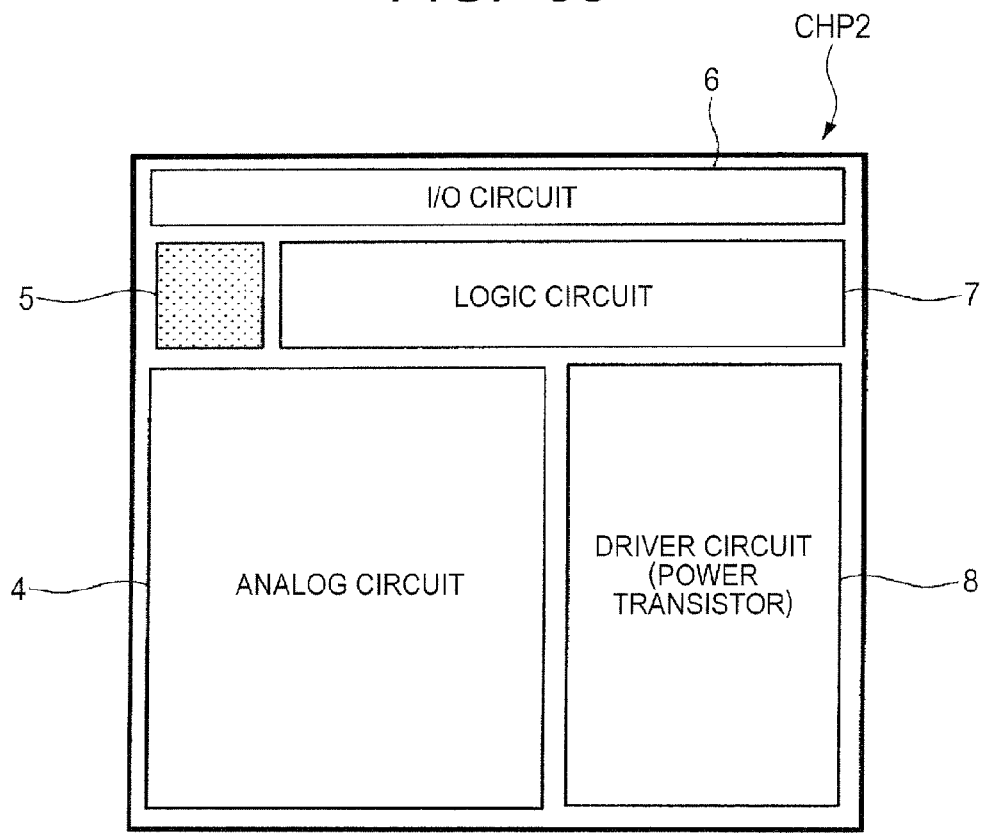
FIG. 33 shows a layout configuration example of a semiconductor chip of Second Embodiment.

FIG. 33 shows a layout configuration example of a semiconductor chip CHP2 of Second Embodiment. In FIG. 33, the semiconductor chip CHP2 of Second Embodiment has an analog circuit 4, a nonvolatile memory 5, an I/O circuit 6, a logic circuit 7, and a driver circuit 8. The logic circuit 7 is comprised of, for example, an n channel type low breakdown voltage MISFET (n type MISFET) and a p channel type low breakdown voltage MISFET (p type MISFET), while the driver circuit 8 is comprised of, for example, an n channel type power transistor (n type power transistor) and a p channel type power transistor (p type power transistor).

The main circuit is comprised of the analog circuit 4, the logic circuit 7, and the driver circuit 8, while the add-on circuit is comprised of the nonvolatile memory 5. In short, the semiconductor chip CHP2 of Second Embodiment has the main circuit realizing a main function and the add-on circuit to be added to the main circuit. In Second Embodiment, a MONOS transistor is used for the add-on circuit. In particular, in Second Embodiment, the add-on circuit is comprised of an electronic fuse to be used for voltage regulation after completion of a wafer. By configuring this electronic fuse from a MONOS transistor which is a rewritable nonvolatile memory, an MTP (multi time program) type electronic fuse which can be regulated repeatedly in wafer form or package form can be realized.
<Device Structure of Semiconductor Chip>

Figure 34:
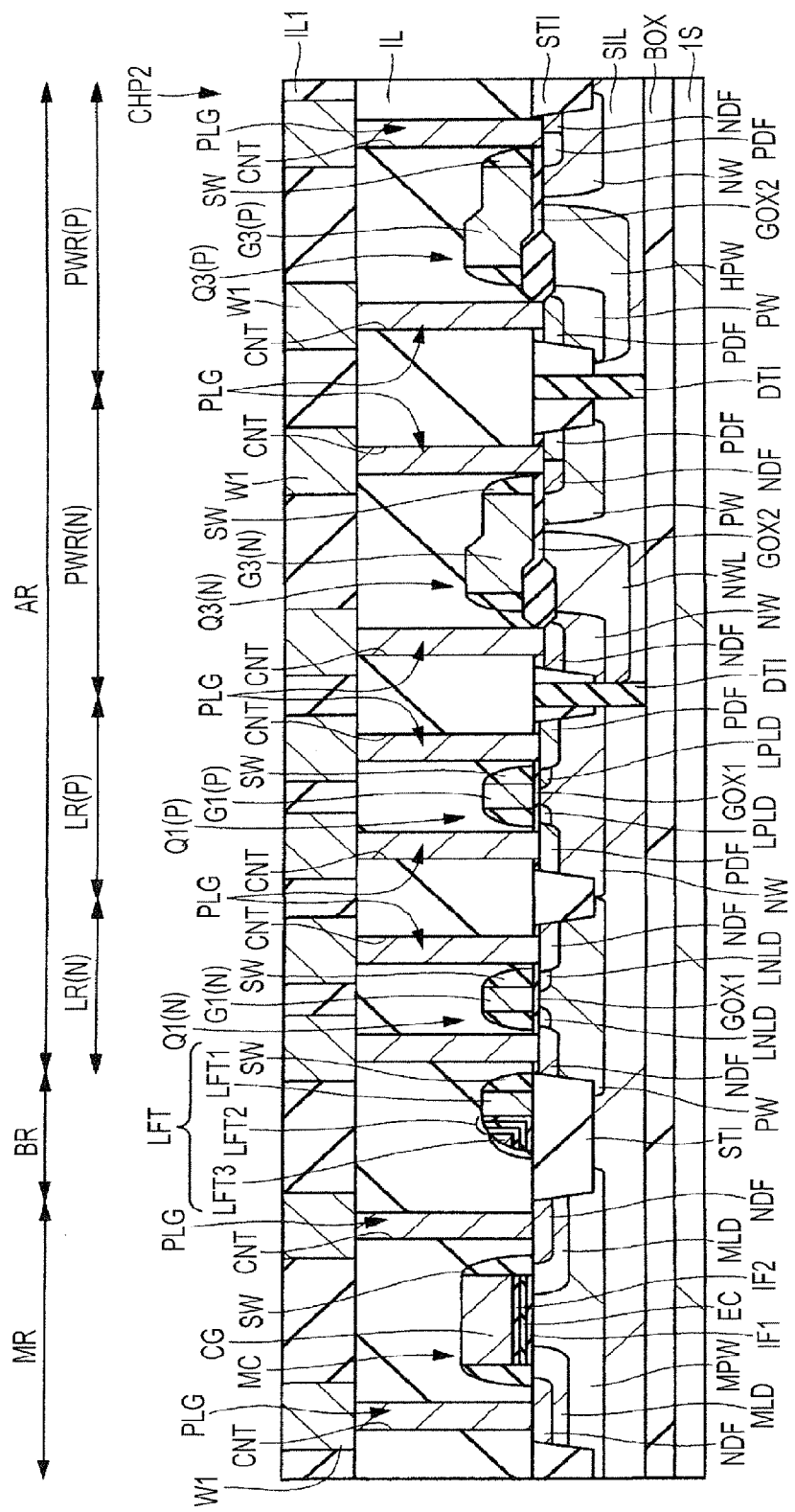
FIG. 34 shows a device structure example of the semiconductor chip of Second Embodiment.

FIG. 34 is a cross-sectional view showing the device structure example of the semiconductor chip CHP2 in Second Embodiment. FIG. 34 shows a memory formation region MR, a main circuit formation region AR, and a boundary region BR sandwiched between the memory formation region MR and the main circuit formation region AR. The main circuit formation region AR is comprised of an n type MISFET formation region LR(N), a p type MISFET formation region LR(P), an n type power transistor formation region PWR(N), and a p type power transistor formation region PWR (P).

In FIG. 34, the semiconductor substrate 1S has thereon a buried insulating layer BOX. This buried insulating layer BOX has thereon a silicon layer SIL. This silicon layer SIL has therein an element isolation region STI for isolating elements from each other. Active regions isolated by the element isolation region STI become a memory formation region MR, an n type MISFET formation region LR(N), a p type MISFET formation region LR(P), an n type power transistor formation region PWR(N), and a p type power transistor formation region PWR(P), respectively. In particular, the element isolation region STI separating the n type power transistor formation region PWR(N) from the p type power transistor formation region PWR(P) has a deep trench isolation region DTI that penetrates through the silicon layer SIL and reaches the buried insulating layer BOX.

The MONOS transistor MC formed in the memory formation region MR has the following configuration. Described specifically, the p well MPW formed in the silicon layer SIL has thereon an insulating film (potential barrier film) IF1 and this insulating film IF1 has thereon a charge storage film EC. This charge storage film EC has thereon an insulating film (potential barrier film) IF2 and the insulating film IF2 has thereon a gate electrode CG made of a conductive film. The gate electrode CG is comprised of a stacked film of, for example, a polysilicon film PF2 and a silicide film CS in order to reduce the resistance. The gate electrode CG has, on both side walls thereof, a side wall SW made of, for example, an insulating film to have an LDD structure.

The silicon layer SIL below the side wall SW has therein, as a semiconductor region, an n⁻ type semiconductor region MLD and an n⁺ type semiconductor region NDF. The p well MPW just below the insulating film IF1 has therein a channel region.

Next, the configuration of an n type MISFETQ1(N) formed in the n type MISFET formation region LR(N) will be described. In the n type MISFETQ1(N), a p well PW formed in the silicon layer SIL has thereon a gate insulating film GOX1 and this gate insulating film GOX1 has thereon a gate electrode G1(N). The gate insulating film GOX1 is made of, for example, a silicon oxide film, while the gate electrode G1(N) is made of, for example, a polysilicon film. The gate electrode G1(N) has, on both side walls thereof, a side wall SW and the silicon layer SIL below this side wall SW has therein, as a semiconductor region, an n⁻ type semiconductor region LNLD and an n⁺ type semiconductor region NDF. The p well PW just below the gate insulating film GOX1 has therein a channel region.

Next, the configuration of a p type MISFETQ1(P) formed in the p type MISFET formation region LR(P) will be described. In the p type MISFETQ1(P), an n well NW formed in the silicon layer SIL has thereon a gate insulating film GOX1 and this gate insulating film GOX1 has thereon a gate electrode G1(P). The gate insulating film GOX1 is made of, for example, a silicon oxide film, while the gate electrode G1(P) is made of, for example, a polysilicon film. The gate electrode G1(P) has, on both side walls thereof, a side wall SW and the silicon layer SIL below this side wall SW has therein, as a semiconductor region, a p⁻ type semiconductor region LPLD and a p⁺ type semiconductor region PDF. The n well NW just below the gate insulating film GOX1 has therein a channel region.

Next, the configuration of an n type power transistor Q3(N) formed in the n type power transistor formation region PWR(N) will be described. In the n type power transistor Q3(N), the silicon layer SIL has therein an n well NWL and a p well PW which are separated from each other. The n well NW is formed so as to be embraced in the n well NWL. An n⁺ type semiconductor region NDF (drain region) is formed so as to be embraced in the n well NW. On the other hand, an n⁺ type semiconductor region NDF (source region) and a p⁺ type semiconductor region PDF (body contact region) are formed so as to be embraced in the p type well PW (body region). The n⁺ type semiconductor region NDF and the p⁺ type semiconductor region PDF are formed so as to be adjacent to each other. The silicon layer SIL has, on the surface thereof, a gate insulating film GOX2 and this gate insulating film GOX2 has thereon a gate electrode G3(N). The gate electrode GOX2 is made of, for example, a silicon oxide film and the gate electrode G3(N) is made of, for example, a polysilicon film.

Next, the configuration of the p type power transistor Q3(P) formed in the p type power transistor formation region PWR(P) will be described. In the p type power transistor Q3(P), the silicon layer SIL has therein a p well HPW and an n well NW which are separated from each other. A p well PW is formed so as to be embraced in the p well HPW. A p⁺ type semiconductor region PDF (drain region) is formed so as to be embraced in the p well PW. On the other hand, a p' type semiconductor region PDF (source region) and an n⁺ type semiconductor region NDF (body contact region) are formed so as to be embraced in the n well NW (body region). The p⁺ type semiconductor region PDF and the n⁺ type semiconductor region NDF are formed so as to be adjacent to each other. The silicon layer SIL has, on the surface thereof, a gate insulating film GOX2 and this gate insulating film GOX2 has thereon a gate electrode G3(P). The gate electrode GOX2 is made of, for example, a silicon oxide film and the gate electrode G3(P) is made of, for example, a polysilicon film.

The boundary region BR has therein a residue pattern LFT which is a trace of a manufacturing step. More specifically, the residue pattern LFT in Second Embodiment is, as shown in FIG. 34, comprised of a residue portion LFT3 which is a residue of the polysilicon film, a residue portion LFT2 which is a residue of the stacked insulating film comprised of the insulating film IF1, the charge storage film EC, and the insulating film IF2, and a residue portion LFT1 which is a residue of the polysilicon film. The residue portion LFT3 is formed in sidewall form on the side surface of the residue portion LFT1 via the residue portion LFT2.

<Method of Manufacturing Semiconductor Device in Second Embodiment> (Monos Last)

The semiconductor device of Second Embodiment has the configuration as described above. A manufacturing method of it will hereinafter be described referring to some drawings. The method of manufacturing the semiconductor device of Second Embodiment is called "MONOS LAST". This "MONOS LAST" is advantageous in that in particular, application of an excessive heat load to a MONOS transistor can be suppressed. Described specifically, Second Embodiment is premised on mix-loading of a power transistor and a MONOS transistor. At this time, a considerably large heat load is applied to the power transistor as a manufacturing condition of it, because control of a large voltage or current is required for its usage. When the power transistor and the MONOS transistor are mix-loaded, therefore, a large heat load during formation of the power transistor may have an influence on the characteristics of the MONOS transistor. In Second Embodiment, a manufacturing method called "MONOS LAST" capable of suppressing application of an excessive heat load to the MONOS transistor is employed. The manufacturing method of the semiconductor device of Second Embodiment using the manufacturing method called "MONOS LAST" will hereinafter be described.

Figure 35:
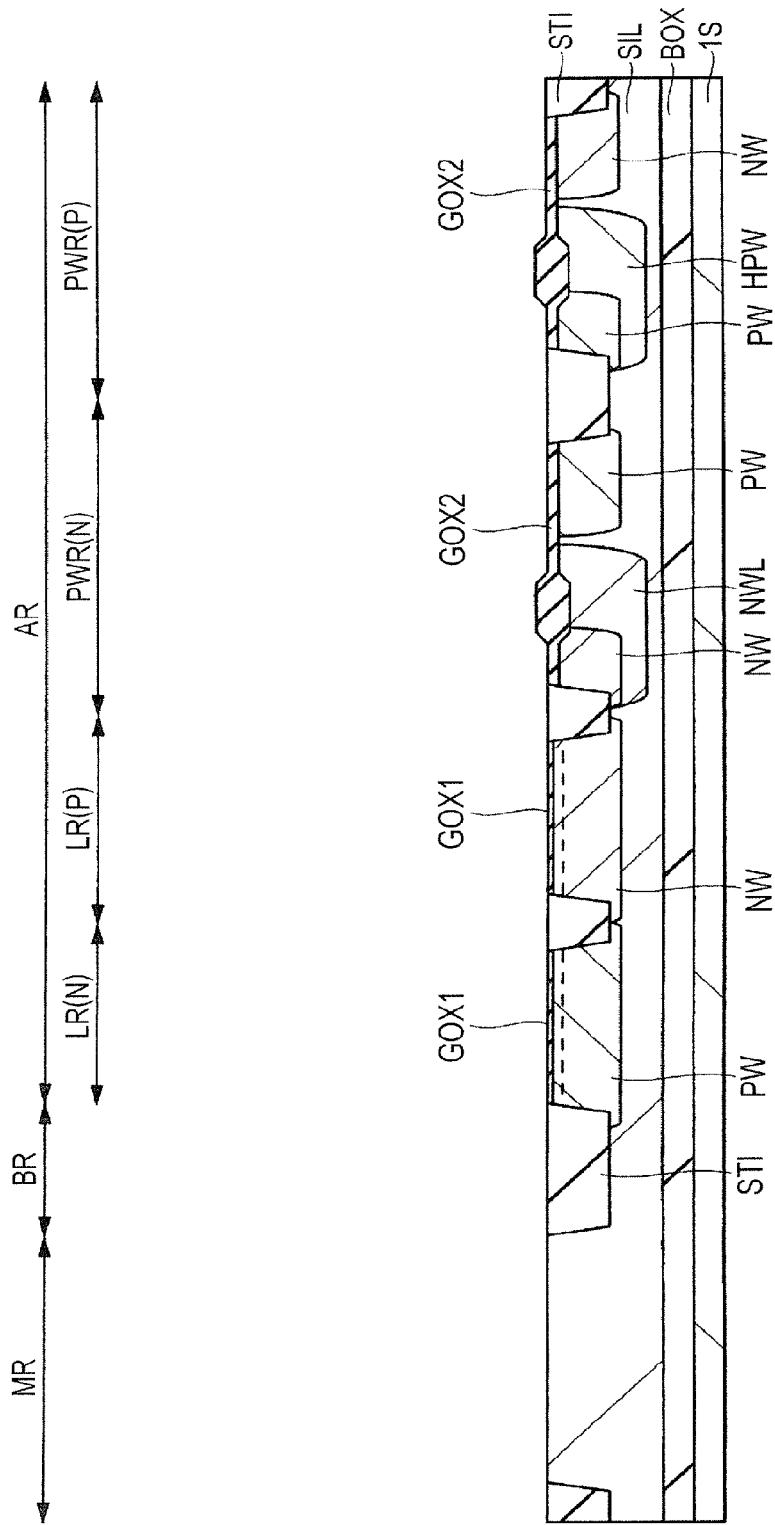
FIG. 35 is a cross-sectional view showing a manufacturing step of a semiconductor device of Second Embodiment.

First, in FIG. 35, provided is a SOI (silicon on insulator) substrate having a buried insulating layer BOX on a semiconductor substrate 1S and having a silicon layer SIL on the buried insulating layer BOX. Then, an element isolation region STI is formed in the silicon layer SIL, whereby a memory formation region MR, an n type MISFET formation region LR(N), a p type MISFET formation region LR(P), an n type power transistor formation region PWR(N), and a p type power transistor formation region PWR(P) are separated from each other. Then, by photolithography and ion implantation, a p well PW is formed in the silicon layer SIL of the n type MISFET formation region LR(N) and an n well NW in the silicon layer SIL of the p type MISFET formation region LR(P). In the silicon layer SIL of the n type power transistor formation region PWR(N), an n well NWL, an n well NW, and a p well PW are formed. Similarly, in the silicon layer SIL of the p type power transistor formation region PWR(P), a p well HPW, a p well PW, and an n well NW are formed. Then, a gate insulating film GOX1 is formed on the surface of the silicon layer SIL of each of the n type MISFET formation region LR(N) and the p type MISFET formation region LR(P), while a gate insulating film GOX2 is formed on the surface of the silicon layer SIL of each of the n type power transistor formation region PWR(N) and the p type power transistor formation region PWR(P).

Figure 36:
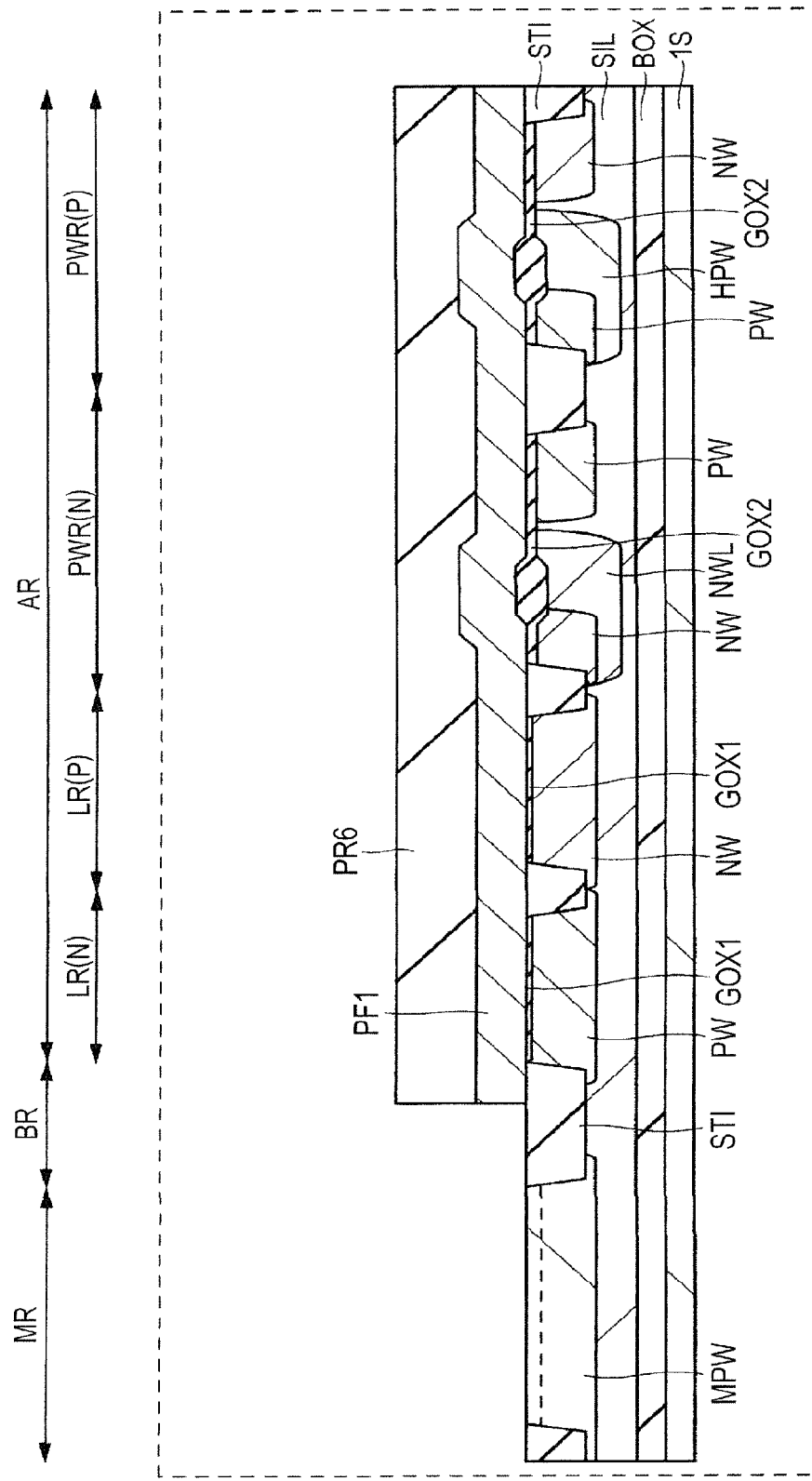
FIG. 36 is a cross-sectional view showing a manufacturing step of the semiconductor device following that of FIG. 35.

Next, as shown in FIG. 36, a polysilicon film (polycrystalline silicon film) PF1 is formed on the entire surface of the SOI substrate. After formation of a resist film PR6 by application onto the polysilicon film PF1, the resist film PR6 is patterned using photolithography. Patterning of the resist film PR6 is performed so as to cover the main circuit formation region AR and at the same time, expose the memory formation region MR. Then, by etching with the patterned resist film PR6 as a mask, the polysilicon film PF1 and the gate insulating film GOX1 are removed from the memory formation region MR. Then, by ion implantation with the patterned resist film PR6 as a mask, a p well MPW is formed in the silicon layer SIL of the memory formation region MR. Further, in the memory formation region MR, a conductivity type impurity is implanted into a channel region of the p well MPW by ion implantation in order to regulate the threshold voltage of the MONOS transistor.

Figure 37:
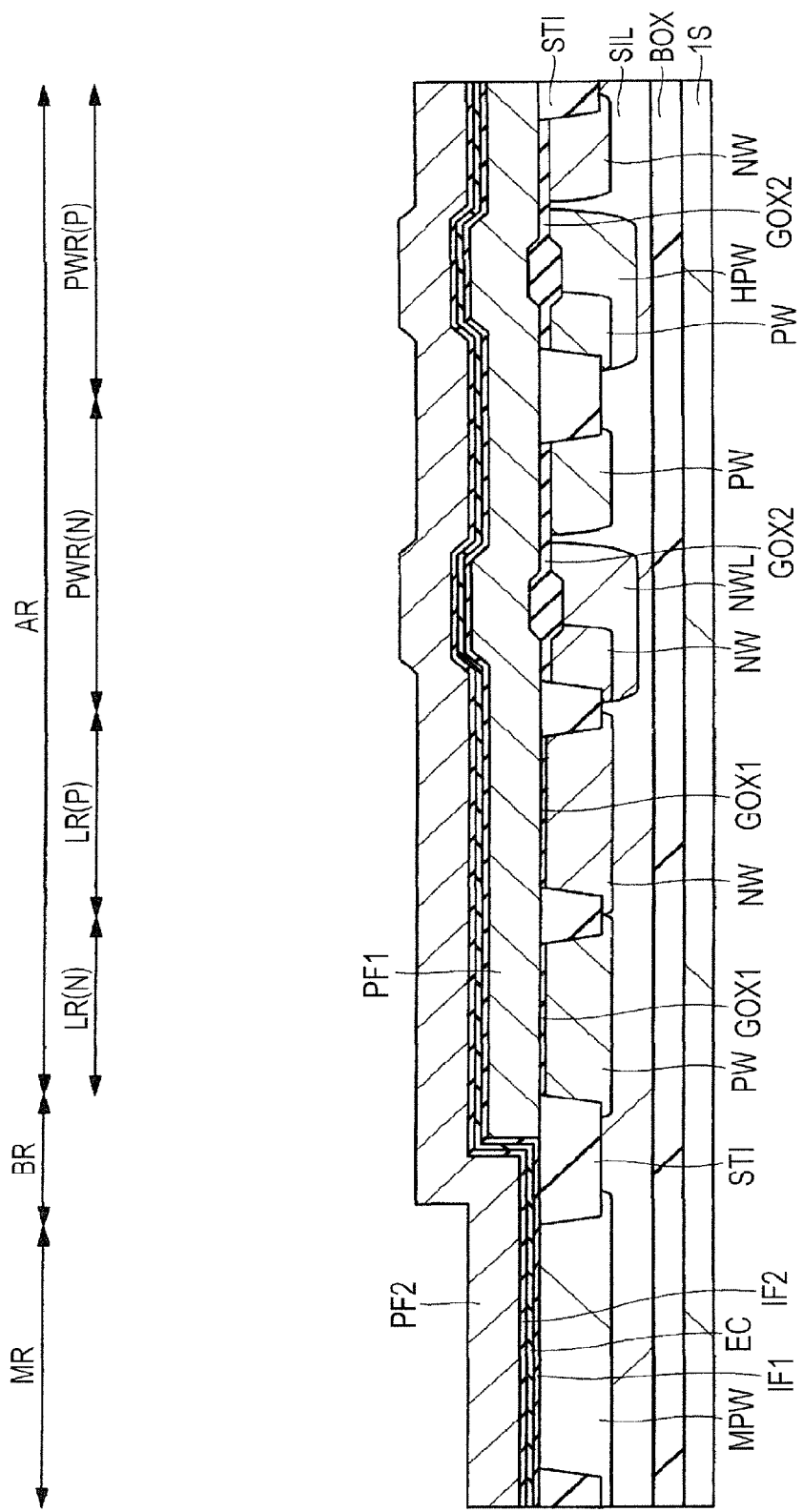
FIG. 37 is a cross-sectional view showing a manufacturing step of the semiconductor device following that of FIG. 36.

Next, as shown in FIG. 37, an insulating film IF1 is formed on the SOI substrate and the polysilicon film PF1 and a charge storage film EC is formed on this insulating film IF1. Then, an insulating film IF2 is formed on the charge storage film EC, followed by the formation of a polysilicon film PF2 on the insulating film IF2. The insulating film IF1 is made of, for example, a silicon oxide film and for the formation of it, ISSG oxidation capable of forming a silicon oxide film which is dense and has a good film quality can be used. The insulating film IF1 has a thickness of about 4 nm. The charge storage film EC is made of a silicon nitride film and can be formed, for example, by CVD. The charge storage film EC has a thickness of about 10 nm. The insulating film IF2 is made of a silicon oxide film and for the formation of it, HTO (high temperature oxide) capable of forming a silicon oxide film which is dense and has a good film quality can be used. The insulating film IF2 has a thickness of about 5 nm. The polysilicon film PF2 can be formed using, for example, CVD. In such a manner, a stacked insulating film (ONO film) which is dense, is excellent in insulation resistance tolerance, and has a good quality can be formed.

Figure 38:
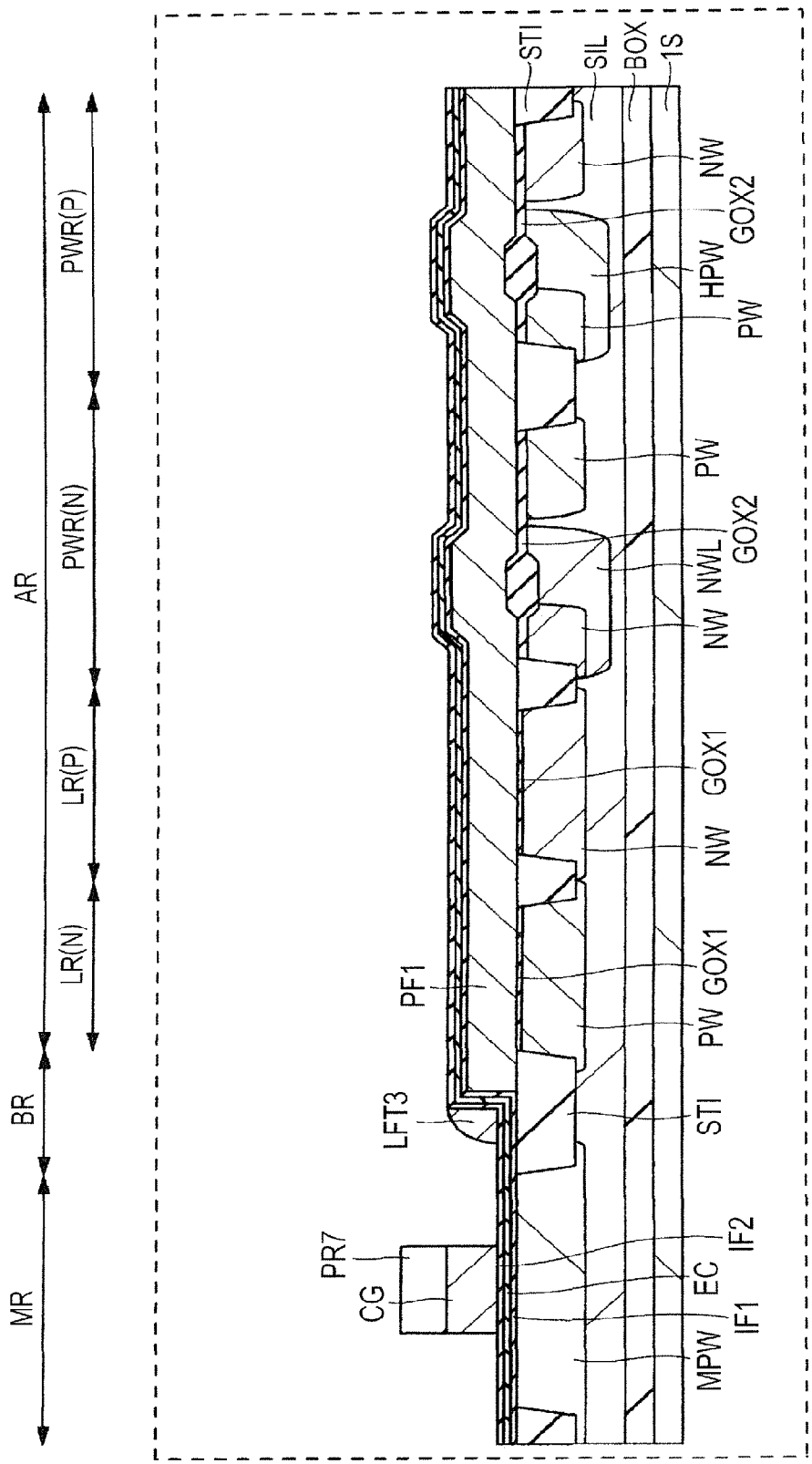
FIG. 38 is a cross-sectional view showing a manufacturing step of the semiconductor device following that of FIG. 37.
Figure 39:
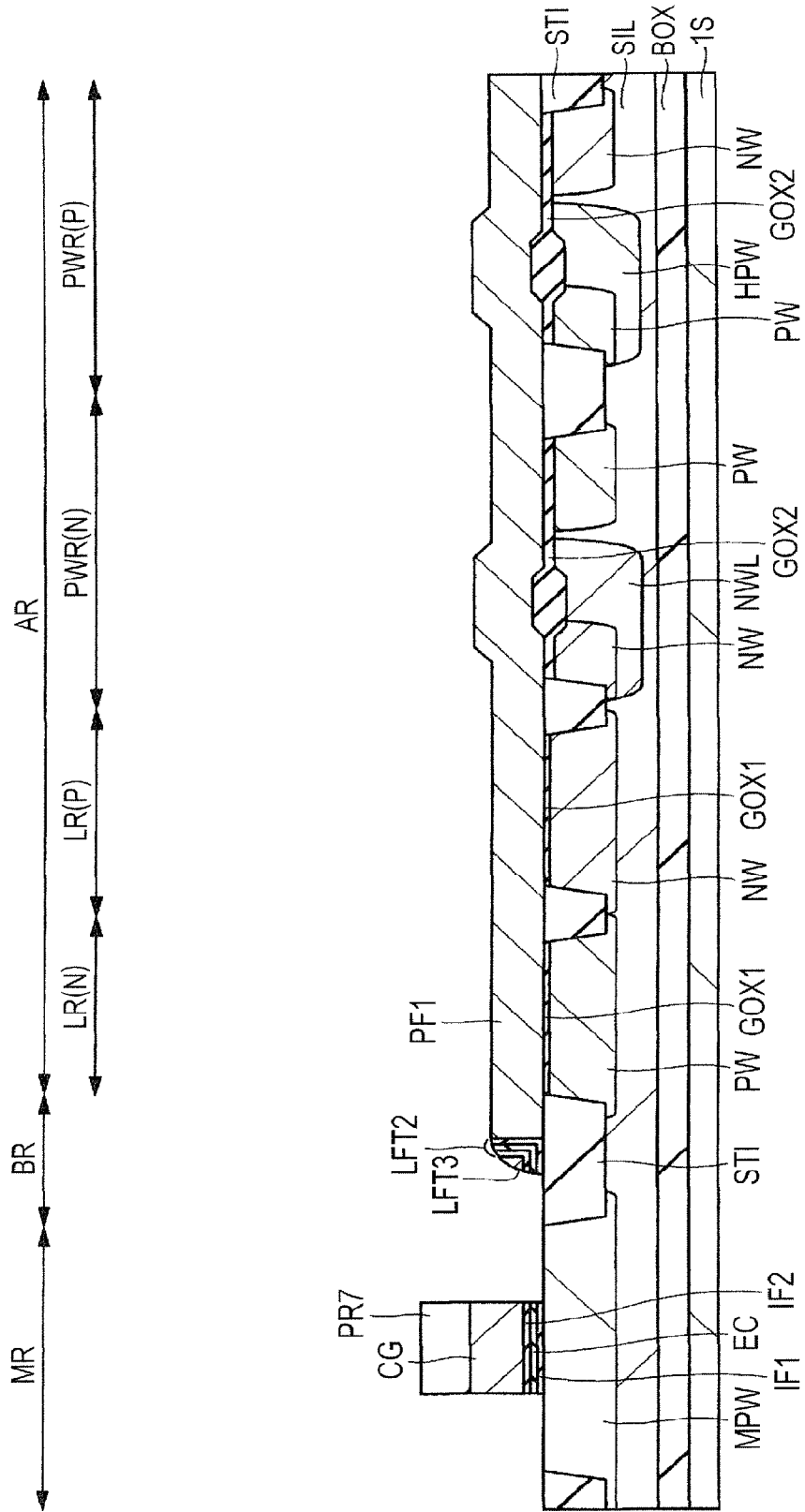
FIG. 39 is a cross-sectional view showing a manufacturing step of the semiconductor device following that of FIG. 38.

Next, as shown in FIG. 38, after formation of a resist film PR7 onto the polysilicon film PF2 by application, the resist film PR7 is patterned by photolithography. Patterning of the resist film PR7 is performed so as to cover a gate electrode formation region of the memory formation region MR and at the same time, expose the main circuit formation region AR. By etching with the patterned resist film PR7 as a mask, the polysilicon film PF2 is patterned to form a gate electrode CG in the memory formation region MR. At this time, as shown in FIG. 38, a residue portion LFT3 of the polysilicon film PF2 is formed in sidewall form in the boundary region BR. Then, as shown in FIG. 39, the exposed insulating film IF2, charge storage film EC, and insulating film IF1 are removed, for example, by dry etching. As a result, a stacked insulating film comprised of the insulating film IF1, the charge storage film EC, and the insulating film IF2 remains below the gate electrode CG formed in the memory formation region MR and at the same time, a residue portion LFT2 comprised of the insulating film IF2, the charge storage film EC, and the insulating film IF1 is formed in a portion of the boundary region BR covered with the residue portion LFT3.

Figure 40:
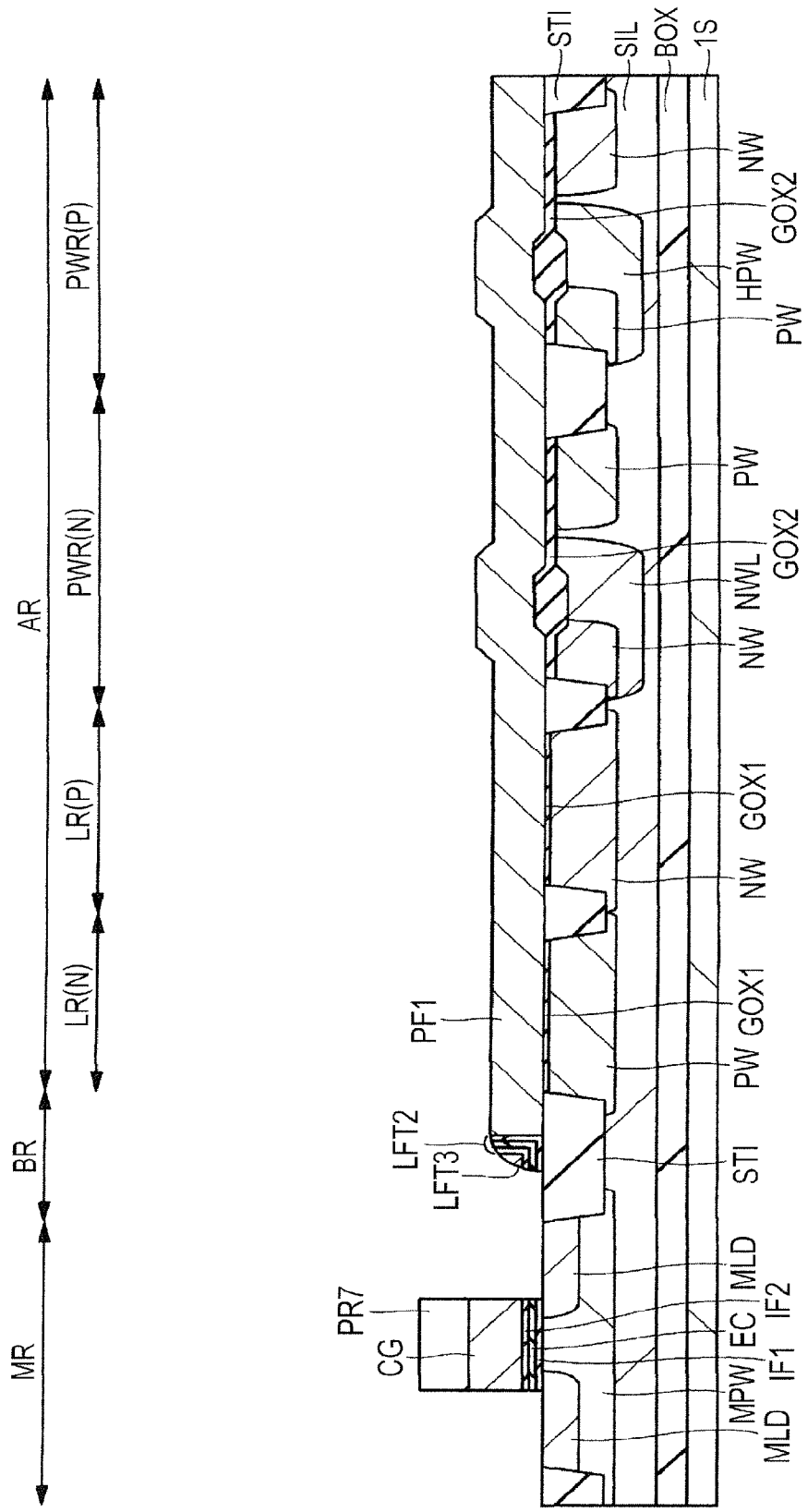
FIG. 40 is a cross-sectional view showing a manufacturing step of the semiconductor device following that of FIG. 39.

Then, as shown in FIG. 40, by ion implantation using the mask made of the patterned resist film PR7 without changing it to another one, an n⁻ type semiconductor region MLD is formed in alignment with the gate electrode CG in the silicon layer SIL of the memory formation region MR. This means that in Second Embodiment, a mask is shared between processing for the formation of the gate electrode CG of the MONOS transistor and ion implantation for the formation of the n⁻ type semiconductor region MLD in alignment with the gate electrode CG of the MONOS transistor. In Second Embodiment, this makes it possible to reduce the number of additional masks necessary for mix-loading of the MONOS transistor.

Figure 41:
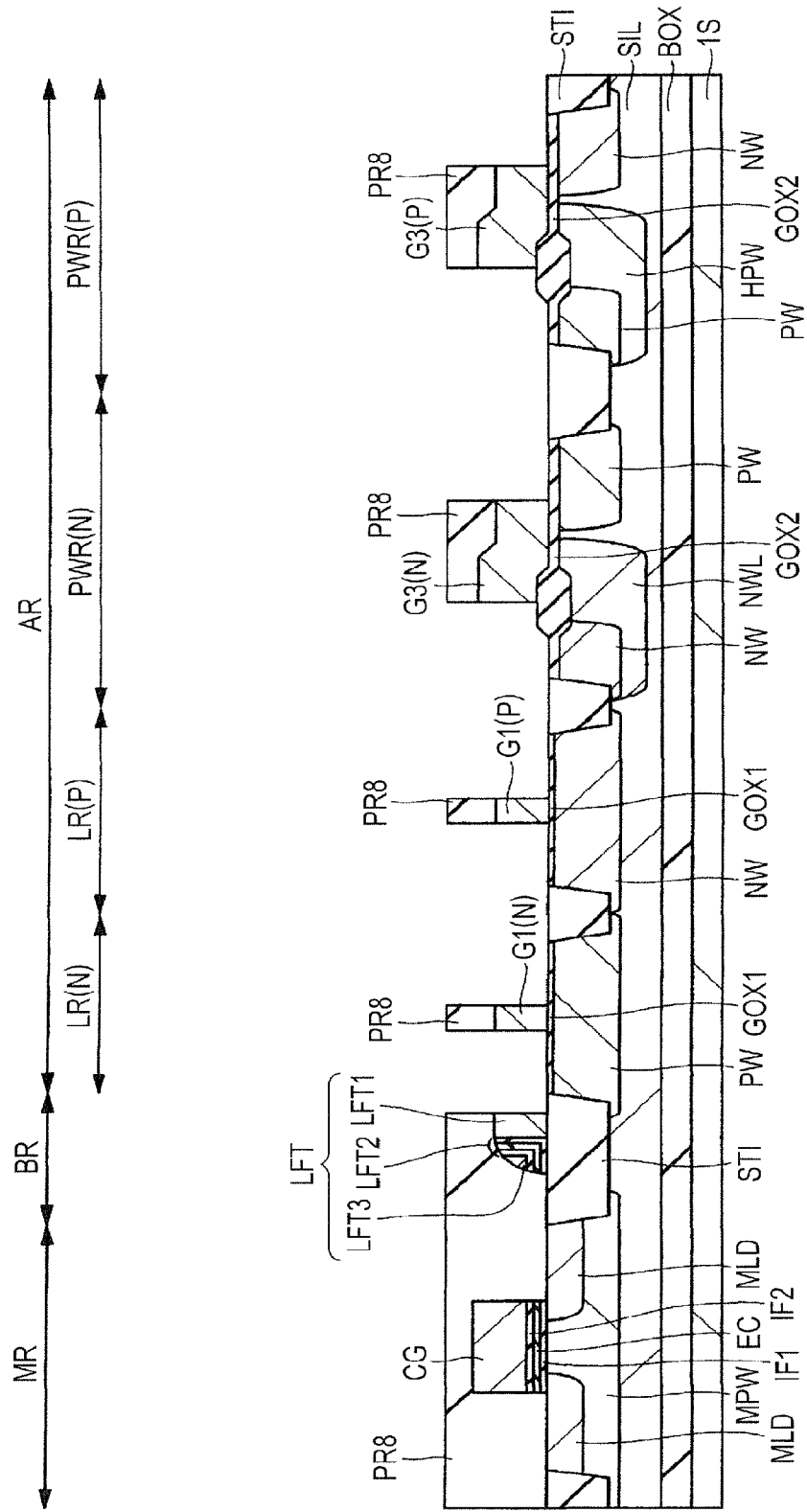
FIG. 41 is a cross-sectional view showing a manufacturing step of the semiconductor device following that of FIG. 40.

Next, as shown in FIG. 41, after removal of the patterned resist film PR7, a resist film PR8 extending from the memory formation region MR to the main circuit formation region AR is formed by application. More specifically, a resist film PR8 that covers the gate electrode CG formed in the memory formation region MR and at the same time, extends over the polysilicon film PF1 formed in the main circuit formation region AR is formed by application. Then, the resist film PR8 is patterned by photolithography. Patterning of the resist film PR8 is performed so as to cover the memory formation region MR and at the same time cover the gate electrode formation region of the main circuit formation region AR. By etching with the patterned resist film PR8 as a mask, the polysilicon film PF1 is processed. As a result, a gate electrode G1(N) and a gate electrode G1(P) can be formed in the n type MISFET formation region LR(N) of the main circuit formation region AR and in the p type MISFET formation region LR(P) of the main circuit formation region AR, respectively. Similarly, a gate electrode G3(N) and a gate electrode G3(P) can be formed in the n type power transistor formation region PWR(N) of the main circuit formation region AR and in the p type power transistor formation region PWR(P) of the main circuit formation region AR, respectively. At this time, in the boundary region BR, a residual portion LFT1 which is a residue of the polysilicon film PF1 is formed. As a result, a residue pattern LFT having a structure in which the residue portion LFT1 has, on the side wall thereof, the residue portion LFT3 via the residue portion LFT2 remains in the boundary region BR.

Figure 42:
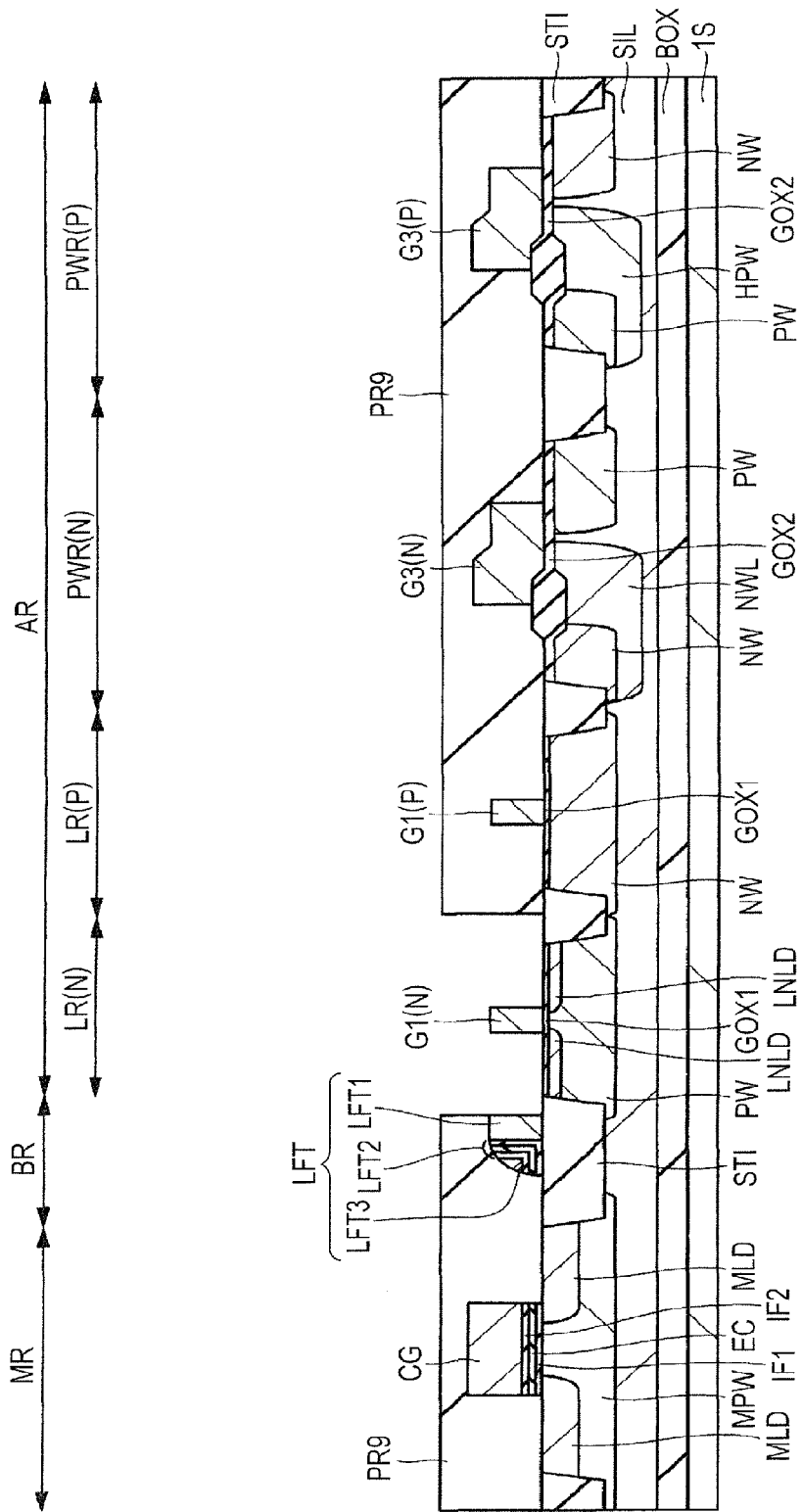
FIG. 42 is a cross-sectional view showing a manufacturing step of the semiconductor device following that of FIG. 41.

Then, as shown in FIG. 42, after removal of the patterned resist film PR8, a resist film PR9 is formed on the SOI substrate by application. By using photolithography, the resist film PR9 is patterned. Patterning of the resist film PR9 is performed so as to cover therewith the memory formation region MR, the boundary region BR, the p type MISFET formation region LR(P), the n type power transistor formation region PWR(N), and the p type power transistor formation region PWR(N), while exposing the n type MISFET formation region LR(N). Then, by ion implantation with the patterned resist film PR9 as a mask, an n⁻ type semiconductor region LNLD is formed in alignment with the gate electrode G1(N) in the silicon layer SIL of the n type MISFET formation region LR(N).

Figure 43:
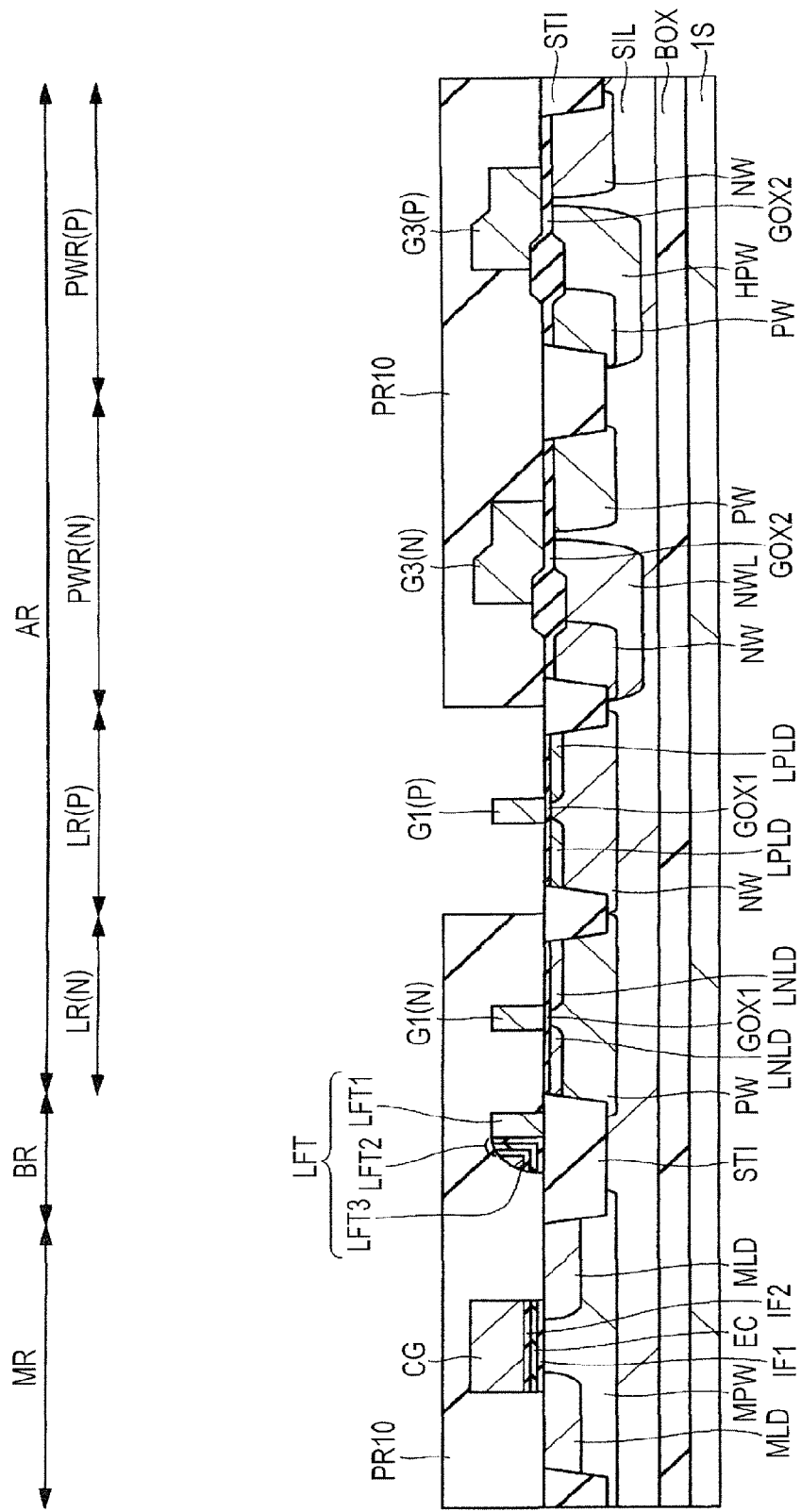
FIG. 43 is a cross-sectional view showing a manufacturing step of the semiconductor device following that of FIG. 42.

Next, as shown in FIG. 43, after removal of the patterned resist film PR9, a resist film PR10 is formed on the SOI substrate by application. By using photolithography, the resist film PR10 is patterned. Patterning of the resist film PR10 is performed so as to cover therewith the memory formation region MR, the boundary region BR, the n type MISFET formation region LR(N), the n type power transistor formation region PWR(N), and the p type power transistor formation region PWR(N), while exposing the p type MISFET formation region LR(P). Then, by ion implantation with the patterned resist film PR10 as a mask, a p⁻ type semiconductor region LPLD is formed in alignment with the gate electrode G1(P) in the silicon layer SIL of the P type MISFET formation region LR(P).

Figure 44:
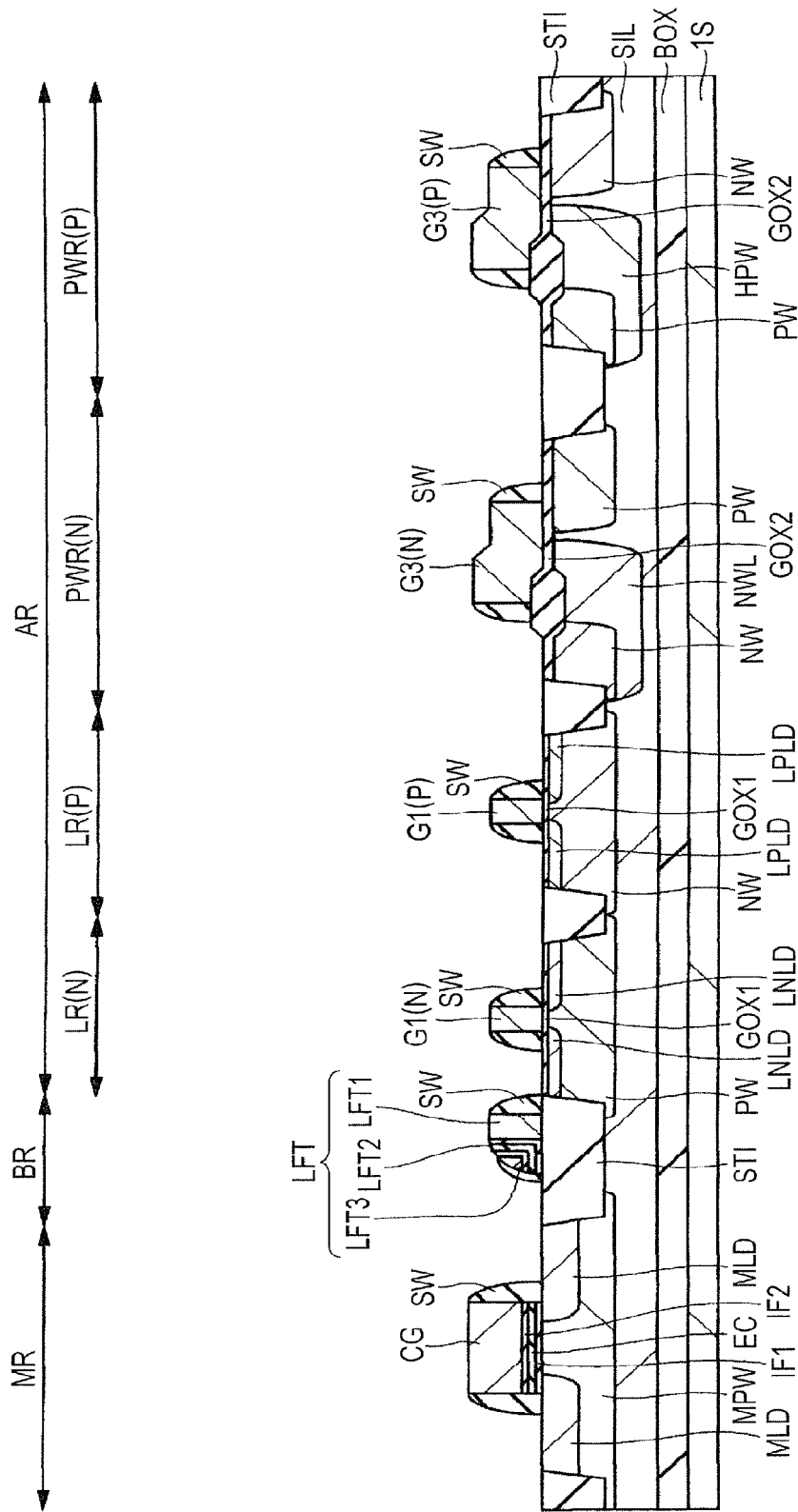
FIG. 44 is a cross-sectional view showing a manufacturing step of the semiconductor device following that of FIG. 43.

Next, after removal of the patterned resist film PR10, for example, a silicon oxide film is formed on the SOI substrate as shown in FIG. 44. The silicon oxide film can be formed, for example, by CVD. Then, the silicon oxide film is anisotropically etched to form a side wall SW. More specifically, in the memory formation region MR, a side wall SW is formed on both side walls of the gate electrode CG (stacked structure: gate electrode CG+ONO film). On the other hand, in the n type MISFET formation region LR(N) of the main circuit formation region AR, a side wall SW is formed on both side walls of the gate electrode G1(N), while in the p type MISFET formation region LR(P) of the main circuit formation region AR, a side wall SW is formed on both side walls of the gate electrode G1(P). Further, a side wall SW is formed on both side walls of the gate electrode G3(N) in the n type power transistor formation region PWR(N) of the main circuit formation region AR and a side wall SW is formed on both side walls of the gate electrode G3(P) in the p type power transistor formation region PWR(P) of the main circuit formation region AR. Also in the boundary region BR, a side wall SW is formed on the side wall of the residue pattern LFT.

Figure 45:
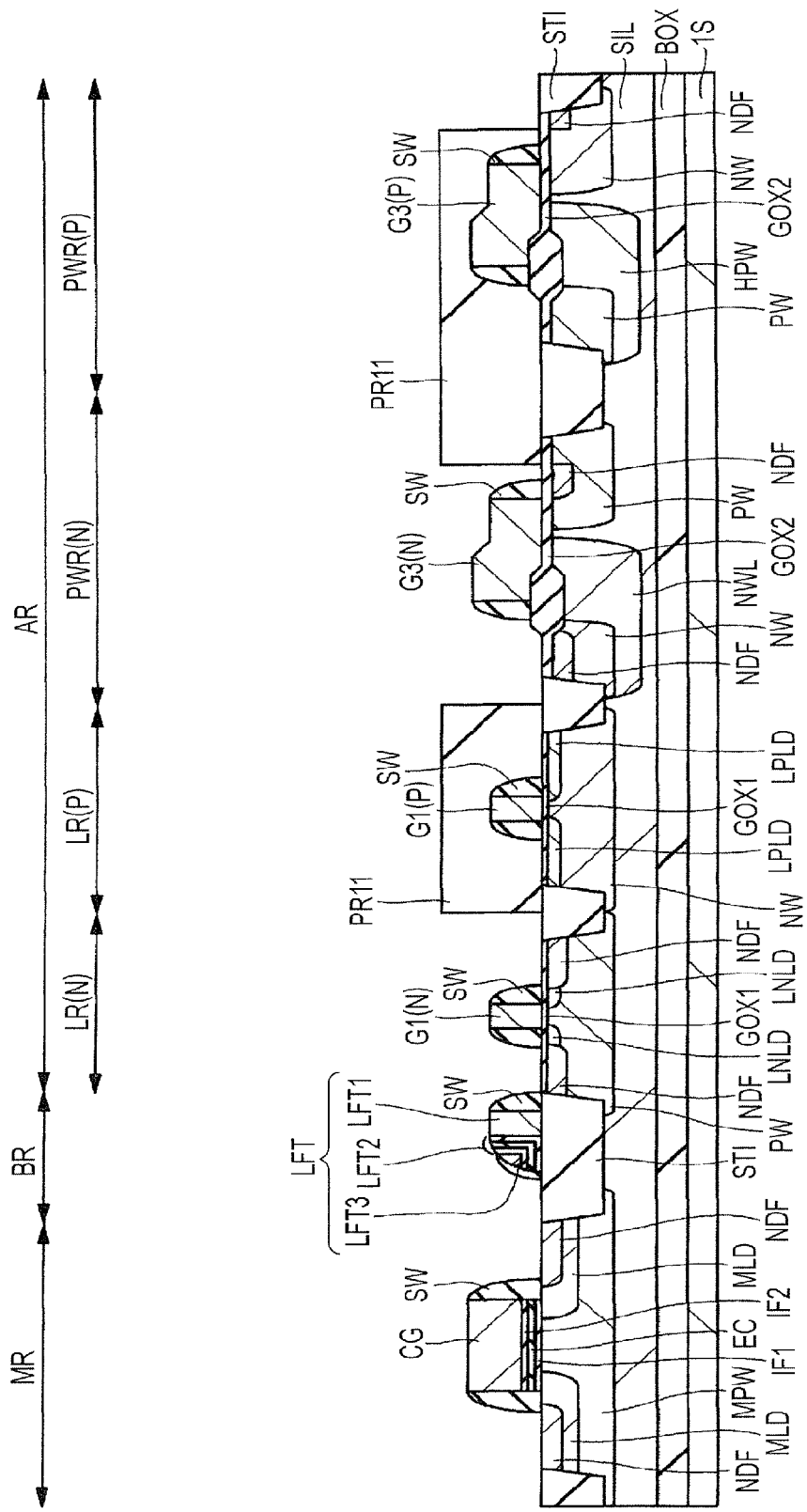
FIG. 45 is a cross-sectional view showing a manufacturing step of the semiconductor device following that of FIG. 44.

Next, as shown in FIG. 45, a resist film PR11 is formed on the SOI substrate by application. By using photolithography, the resist film PR11 is patterned. Patterning of the resist film PR11 is performed so as to expose the memory formation region MR, the boundary region BR, the n type MISFET formation region LR(N), and a region of the n type power transistor formation region PWR(N) other than the body contact region. At the same time, patterning of the resist film PR11 is performed so as to cover the p type MISFET formation region LR(P), the body contact region of the n type power transistor formation region PWR(N), and a region of the p type power transistor formation region PWR(P) other than the body contact region.

Then, by ion implantation with the patterned resist film PR11 as a mask, an $n^+$ type semiconductor region NDF is formed in the memory formation region MR in alignment with the side wall SW. The source or drain region of the MONOS transistor is formed from the $n^+$ type semiconductor region NDF and $n^-$ type semiconductor region MLD.

By a similar ion implantation step, an $n^+$ type semiconductor region NDF is formed also in the n type MISFET formation region LR(N) of the main circuit formation region AR in alignment with the side wall SW. The source or drain region of the n type MISFET is formed from the $n^+$ type semiconductor region NDF and the $n^-$ type semiconductor region LNLD.

By a similar ion implantation step, an $n^+$ type semiconductor region NDF is formed also in the n type power transistor formation region PWR(N) of the main circuit formation region AR. The source or drain region of the n type power transistor is formed from this $n^+$ type semiconductor region NDF.

Further, by a similar ion implantation step, an $n^+$ type semiconductor region NDF which will be a body contact region is formed also in the p type power transistor formation region PWR(P) of the main circuit formation region AR.

Thus, in Second Embodiment, the $n^+$ type semiconductor region NDF of the MONOS transistor, the $n^+$ type semiconductor region NDF of the n type MISFET, the $n^+$ type semiconductor region NDF of the n type power transistor, and the $n^+$ type semiconductor region NDF of the p type power transistor are formed simultaneously. This means that in Second Embodiment, the n' type semiconductor region NDF of the MONOS transistor, the $n^+$ type semiconductor region NDF of the n type MISFET, the $n^+$ type semiconductor region NDF of the n type power transistor, and the $n^+$ type semiconductor region NDF of the p type power transistor are formed simultaneously by ion implantation using a common mask. As a result, according to Second Embodiment, an additional mask for forming the $n^+$ type semiconductor region NDF of the MONOS transistor becomes unnecessary. Therefore, Second Embodiment makes it possible to reduce the number of additional masks necessary for mix loading or the MONOS transistor.

Figure 46:
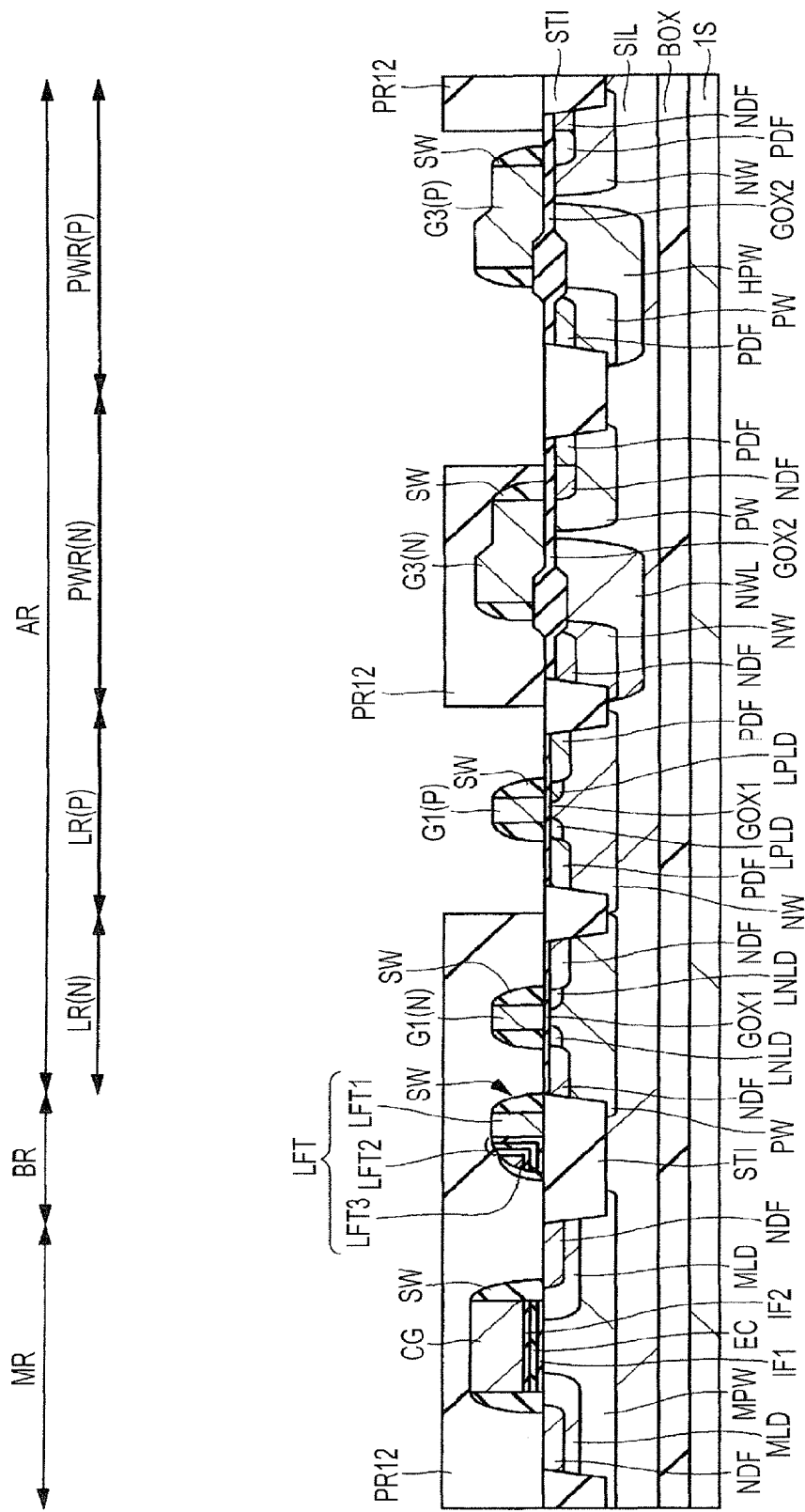
FIG. 46 is a cross-sectional view showing a manufacturing step of the semiconductor device following that of FIG. 45.

Next, as shown in FIG. 46, after removal of the patterned resist film PR11, a resist film PR12 is formed on the SOI substrate by application. By using photolithography, the resist film PR12 is patterned. Patterning of the resist film PR12 is performed so as to cover the memory formation region MR, the boundary region BR, the n type MISFET formation region LR(N), a region of the n type power transistor formation region PWR(N) other than the body contact region, and the body contact region of the p type power transistor formation region PWR(P). At the same time, patterning of the resist film PR12 is performed so as to expose the p type MISFET formation region LR(P), the body contact region of the n type power transistor formation region PWR(N), and a region of the p type power transistor formation region PWR(P) other than the body contact region.

Then, by ion implantation with the patterned resist film PR12 as a mask, a p type semiconductor region PDF is formed in the p type MISFET formation region LR(P) of the main circuit formation region AR in alignment with the side wall SW. The source or drain region of the p type MISFET is formed from the resulting $p^+$ type semiconductor region PDF and the $n^-$ type semiconductor region LPLD.

By a similar ion implantation step, a $p^+$ type semiconductor region PDF which will be a body contact region is formed also in the n type power transistor formation region PWR(N) of the main circuit formation region AR.

Further, by a similar ion implantation step, a $p^+$ type semiconductor region PDF is formed also in the p type power transistor formation region PWR(P) of the main circuit formation region AR. The source or drain region of the p type power transistor is formed from the resulting $p^+$ type semiconductor region PDF.

Figure 47:
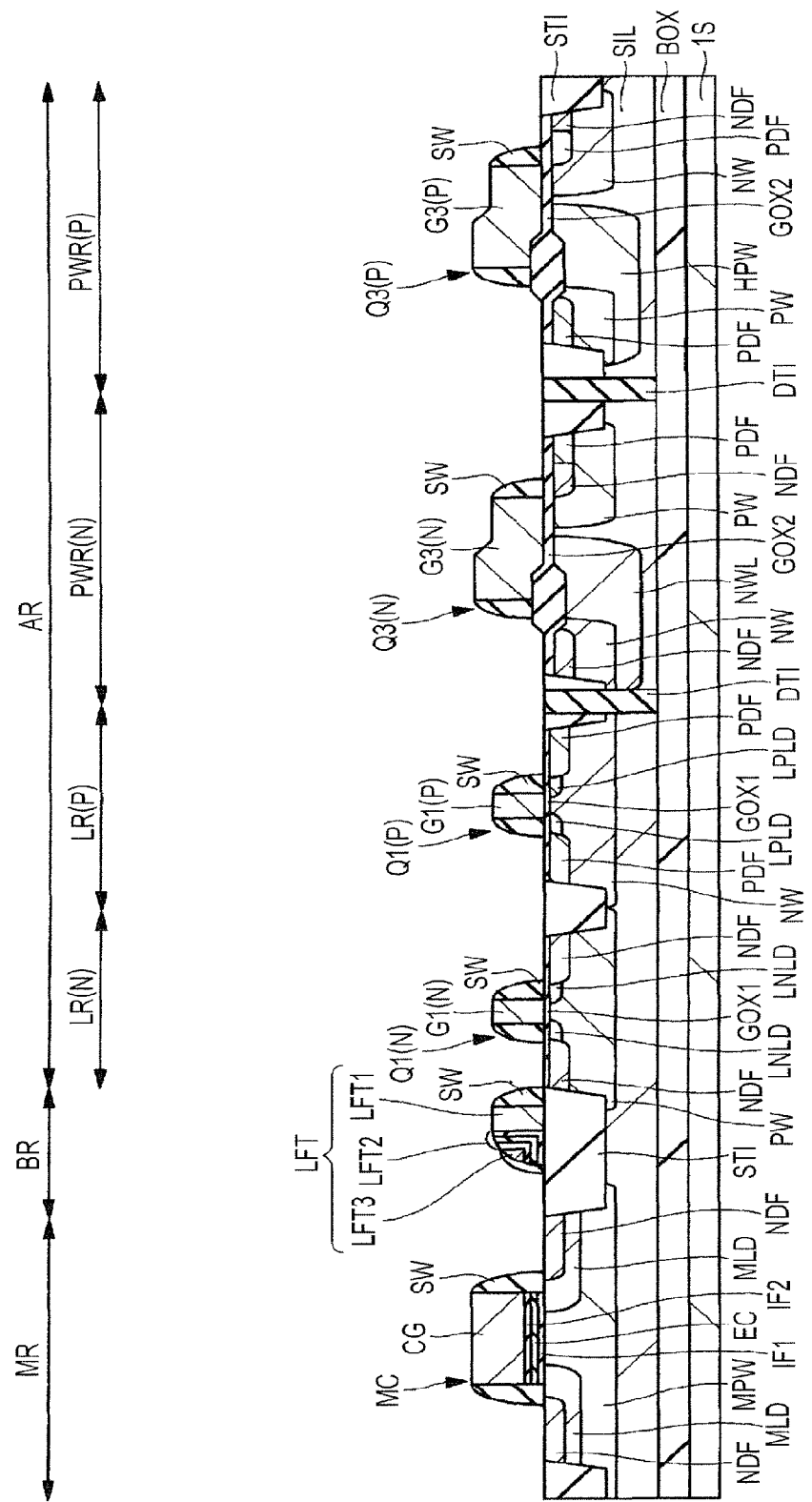
FIG. 47 is a cross-sectional view showing a manufacturing step of the semiconductor device following that of FIG. 46.

Next, as shown in FIG. 47, in the element isolation region STI separating the n type power transistor formation region PWR(N) and the p type power transistor formation region PWR(P), a deep trench isolation region DTI that penetrates through the silicon layer SIL and reaches the buried insulating layer BOX is formed. A wiring step thereafter is performed as in First Embodiment.

By the above-mentioned method, the semiconductor device of Second Embodiment having, mix-loaded therein, the MONOS transistor MC, the n type MISFETQ1(N), the p type MISFETQ1(P), the n type power transistor Q3(N), and the p type power transistor Q3(P) can be manufactured.

THIRD EMBODIMENT

In Third Embodiment, a using example of a manufacturing method of a semiconductor device called "MONOS FIRST" will next be described as a manufacturing method of a semiconductor device having, mix-loaded therein, a main circuit including a field effect transistor and a MONOS transistor included in an add-on circuit.

<Device Structure of Semiconductor Chip>

Figure 48:
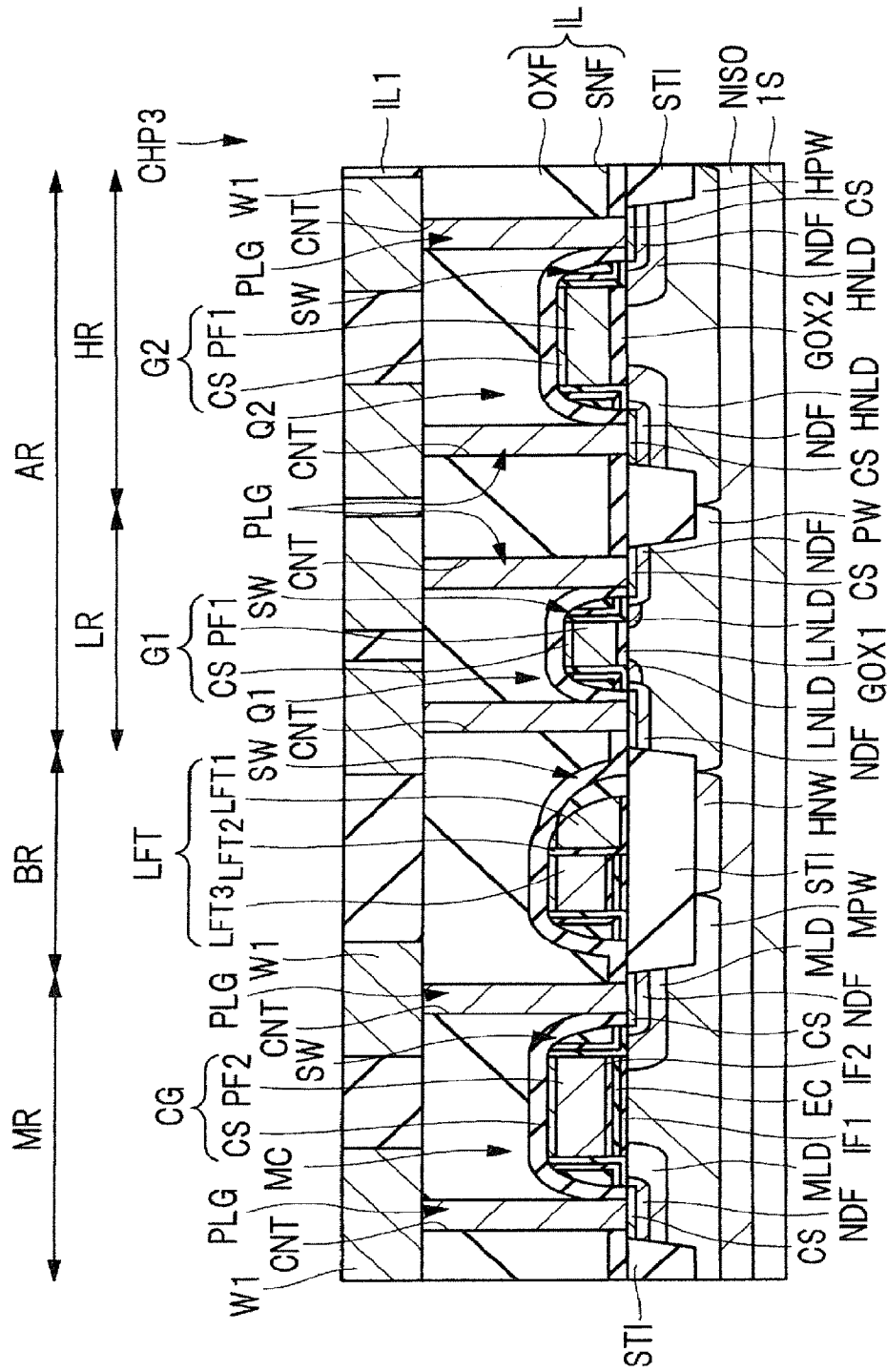
FIG. 48 shows a device structure example of a semiconductor chip of Third Embodiment.

FIG. 48 is a cross-sectional view showing a device structure example of a semiconductor chip CHP3 in Third Embodiment. FIG. 48 shows a memory formation region MR, a main circuit formation region AR, and a boundary region BR sandwiched between the memory formation region MR and the main circuit formation region AR. The main circuit formation region AR is comprised of a low breakdown voltage MISFET formation region LR and a high breakdown voltage MISFET formation region HR. The device structure of the semiconductor chip CHP3 in Third Embodiment is substantially similar to the device structure (refer to FIG. 3) of the semiconductor chip CHP1 of First Embodiment so that a difference between them will be described mainly.

In the semiconductor chip CHP3 of Third Embodiment, a residue pattern LFT formed in the boundary region BR is different from the residue pattern LFT of First Embodiment. This owes to a difference in the manufacturing method of a semiconductor device. A semiconductor device manufacturing method called "MONOS LAST" is used in First Embodiment, while a semiconductor device manufacturing method called "MONOS FIRST" is used in Third Embodiment. More specifically, the manufacturing method called "MONOS LAST" is used in First Embodiment so that the residue pattern LET of First Embodiment has, as shown in FIG. 3, a structure in which the residue portion LFT1 has, on the side wall thereof, the residue portion LFT3 in side wall form via the residue portion LFT2. In Third Embodiment, on the other hand, the manufacturing method called "MONOS FIRST" is employed and as a result, as shown in FIG. 48, the residue pattern LFT of Third Embodiment has a structure in which the residue portion LFT3 has, on the side wall thereof, the residue portion LFT1 in sidewall form via the residue portion LFT2. This means that in First Embodiment, the residue portion LFT3 is in sidewall form, while in Third Embodiment, the residue portion LFT1 is in sidewall form.

Another device structure of the semiconductor chip CHP3 of Third Embodiment is similar to the device structure of the semiconductor chip CHP1 in First Embodiment.

<Room for Improvement>

The manufacturing method of the semiconductor device of Third Embodiment is a method called "MONOS FIRST". The "MONOS FIRST" is a manufacturing method of forming a conductor film (second conductor film) to be processed into a gate electrode of a MONOS transistor which is a constituent component of an add-on circuit and then forming a conductor film (first conductor film) to be processed into a gate electrode of a field effect transistor which is a constituent component of a main circuit. The manufacturing method called "MONOS FIRST" is advantageous because the field effect transistor of the main circuit (base product) can be suppressed from being influenced by a heat load applied during formation of the MONOS transistor. The manufacturing method called "MONOS FIRST" is therefore effective particularly for suppressing application of an excessive heat load to the field effect transistor configuring the main circuit and thereby reducing variation in the characteristic of the field effect transistor which is a constituent component of the main circuit.

In the manufacturing method of a semiconductor device called "MONOS FIRST" similar to the manufacturing method of a semiconductor device called "MONOS LAST", it is desired to mix-load a MONOS transistor as an add-on circuit while minimizing a change in the manufacturing process of a base product having therein a main circuit. More specifically, mix-loading of a MONOS transistor with a field effect transistor of a main circuit increases the number of masks so that it is desired to reduce the number of additional masks and thereby reduce the manufacturing cost of a semiconductor device. First, related technology of "MONOS FIRST" will be described, followed by description on the room for improvement in this related technology.

Figure 49:
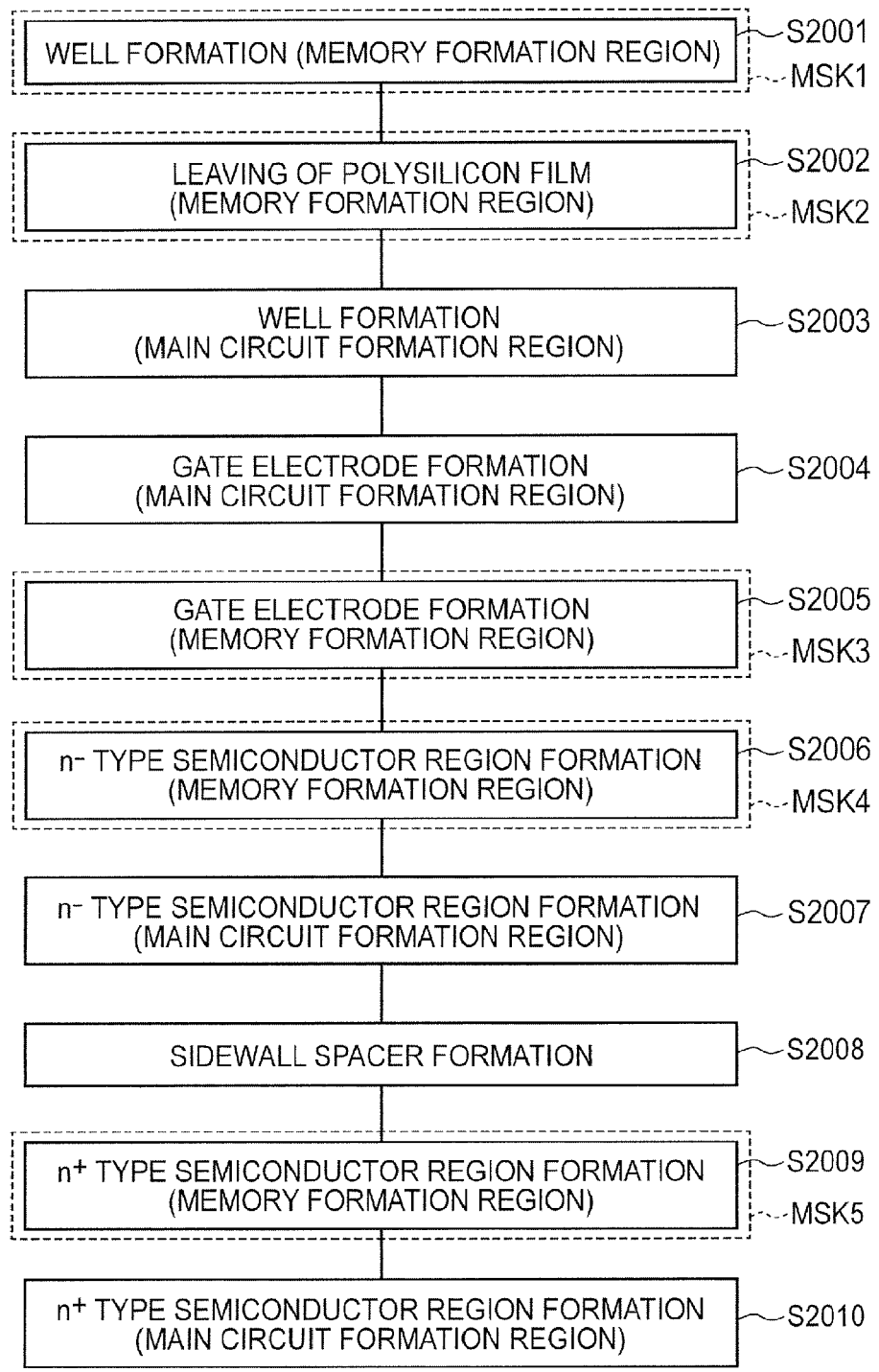
FIG. 49 is a flow chart showing the flow of manufacturing steps of a semiconductor device in related technology.

FIG. 49 is a flow chart of the related technology showing the flow of manufacturing steps for mix-loading a field effect transistor which is a constituent component of a main circuit and a MONOS transistor which is a constituent component of an add-on circuit. In the flow chart shown in FIG. 49, steps requiring an additional mask for mix-loading of a MONOS transistor are surrounded by a broken line.

First, as shown in FIG. 49, a well is formed in the memory formation region (S2001). During formation of the well, an additional mask MSK1 covering the main circuit formation region and exposing the memory formation region is used. This means that the additional mask MSK1 becomes necessary for the formation of a well of a MONOS transistor in the memory formation region. A polysilicon film is formed on the entire main surface of a semiconductor substrate. Then, the polysilicon film formed in the main circuit formation region is removed while leaving the polysilicon film formed in the memory formation region (S2002). At this time, an additional mask MSK2 covering the memory formation region and at the same time, exposing the main circuit formation region is used. Then, a well is formed in the main circuit formation region (S2003).

Next, a gate electrode is formed in the main circuit formation region (S2004). Then, a gate electrode is formed in the memory formation region (S2005). At this time, an additional mask MSK3 becomes necessary for the formation of a gate electrode of the MONOS transistor in the memory formation region.

Next, an n$^-$ type semiconductor region (extension region) is formed in the memory formation region (S2006). At this time, an additional mask MSK4 becomes necessary for the formation of an n$^-$ type semiconductor region of the MONOS transistor in the memory formation region. Next, an n$^-$ type semiconductor region of the field effect transistor is formed in the main circuit formation region (S2007).

Then, a sidewall spacer is formed on each of the side wall of the gate electrode of the MONOS transistor and the side wall of the gate electrode of the field effect transistor (S2008). Then, an n$^+$ type semiconductor region (diffusion layer) is formed in the memory formation region (S2009). At this time, an additional mask MSK5 becomes necessary for the formation of the n$^+$ type semiconductor region of the MONOS transistor in the memory formation region. Next, an n$^+$ type semiconductor region of the field effect transistor is formed in the main circuit formation region (S2010).

Steps thereafter do not need an additional mask so that description on them is omitted. In the related technology, the field effect transistor which is a constituent component of a main circuit and the MONOS transistor which is a constituent component of an add-on circuit can be mix-loaded in such a manner. As shown in FIG. 49, manufacturing steps of a semiconductor device according to the related technology need five additional masks MSK1 to MSK5 for mix-loading of the MONOS transistor (add-on circuit) with a base product (main circuit). In this point, it is desired to reduce the number of masks to be added for mix-loading of a MONOS transistor and thereby reduce the manufacturing cost of a semiconductor device. Therefore, a further reduction in the number of additional mask (five masks) used in the related technology is desired. In third Embodiment, therefore, a measure is taken to make the number of masks added for mix-loading of the MONOS transistor smaller than that of the related technology. The technical concept of Third Embodiment taking this measure will next be described.

<Technical Concept in Third Embodiment>

Figure 50:
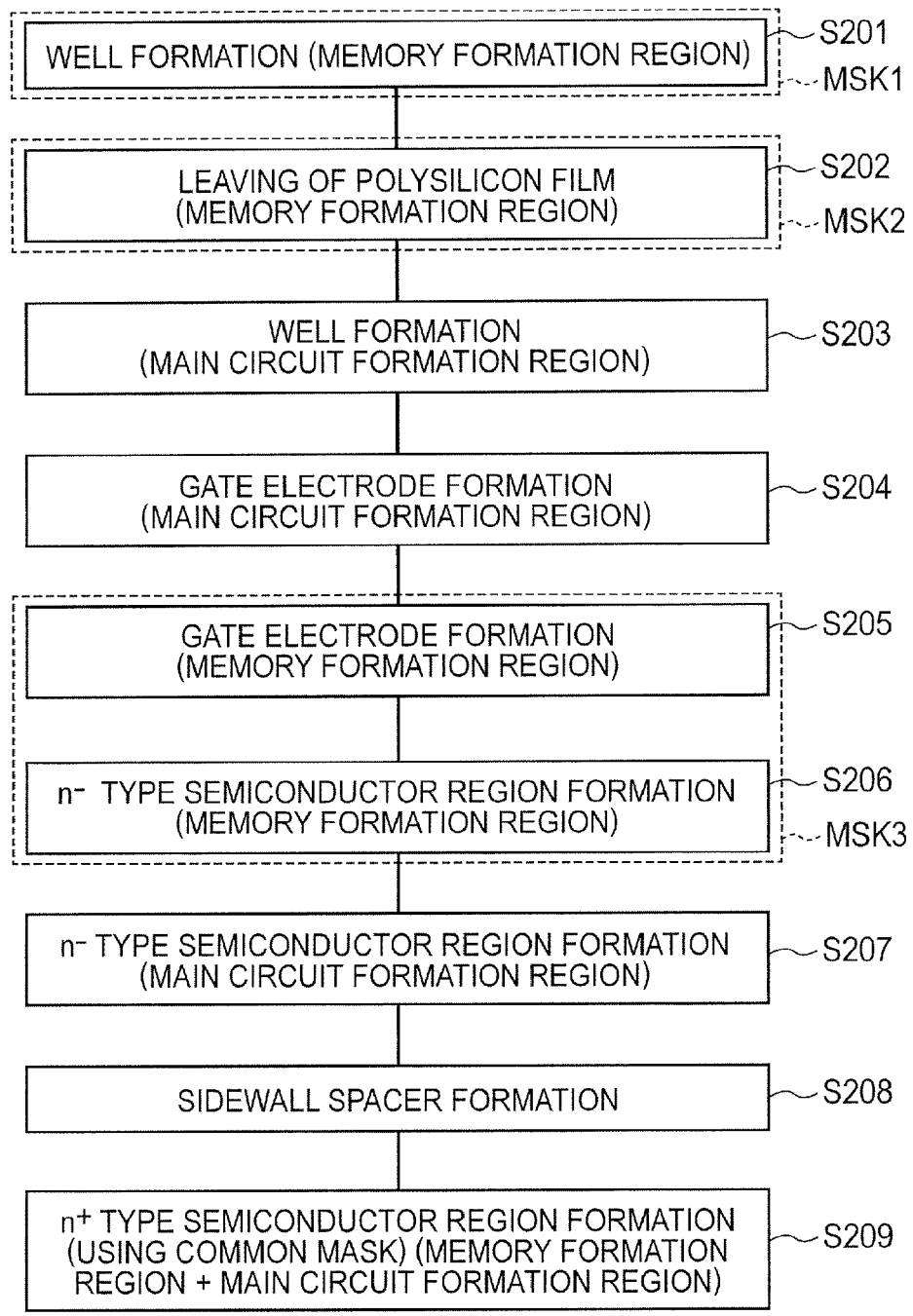
FIG. 50 is a flow chart showing the flow of manufacturing steps of a semiconductor device of Third Embodiment.

FIG. 50 is a flow chart showing the flow of manufacturing steps of Third Embodiment for mix-loading of a field effect transistor which is a constituent component of a main circuit and a MONOS transistor which is a constituent component of an add-on circuit. In the flow chart shown in FIG. 50, a step requiring an additional mask for mix-loading of the MONOS transistor is surrounded by a broken line.

As shown in FIG. 50, a well is formed in the memory formation region (S201). During well formation, an additional mask MSK1 that covers the main circuit formation region and exposes the memory formation region is used. In short, the additional mask MSK1 becomes necessary for the formation of a well of the MONOS transistor in the memory formation region. Then, a polysilicon film is formed on the entire whole surface of the semiconductor substrate. Then, the polysilicon film formed in the main circuit formation region is removed while leaving the polysilicon film formed in the memory formation region (S202). At this time, an additional mask MSK2 that covers the memory formation region and exposes the main circuit formation region is used. Then, a well is formed in the main circuit formation region (S203).

Next, a gate electrode is formed in the main circuit formation region (S204). Then, a gate electrode is formed in the memory formation region (S205). At this time, an additional mask MSK3 becomes necessary for the formation of the gate electrode of the MONOS transistor in the memory formation region. In Third Embodiment, an $n^-$ type semiconductor region is formed in the memory formation region while using the additional mask used for the formation of the gate electrode of the MONOS transistor in the memory formation region without changing it to another one (S206). In other words, in Third Embodiment, the n-type semiconductor region is formed in alignment with the gate electrode of the MONOS transistor by ion implantation using the additional mask used for patterning for the formation of the gate electrode of the MONOS transistor without changing it to another one. This means that in Third Embodiment a mask is shared between processing for the formation of the gate electrode of the MONOS transistor and ion implantation for the formation of the $n^-$ type semiconductor region in alignment with the gate electrode of the MONOS transistor. Third Embodiment therefore achieves a reduction in the number of additional masks used for mix-loading of the MONOS transistor (first mask reduction effect).

Next, an $n^-$ type semiconductor region of the field effect transistor is formed in the main circuit formation region (S207). Then, a sidewalls pacer is formed on the side wall of each of the gate electrode of the MONOS transistor and the gate electrode of the field effect transistor (S208). Then, an $n^+$ type semiconductor region of the MONOS transistor is formed in the memory formation region and at the same time, an $n^+$ type semiconductor region of the field effect transistor is formed in the main circuit formation region (S209). This means that in Third Embodiment, the $n^+$ type semiconductor region of the MONOS transistor and the $n^+$ type semiconductor region of the field effect transistor are formed simultaneously. In other words, in Third Embodiment, the $n^+$ type semiconductor region of the MONOS transistor and the $n^+$ type semiconductor region of the field effect transistor are formed simultaneously by ion implantation with a common mask.

As a result, according to Third Embodiment, an additional mask for the formation of the $n^+$ type semiconductor region of the MONOS transistor becomes unnecessary. Third Embodiment therefore achieves a reduction in the number of additional masks used for mix-loading of the MONOS transistor (second mask reduction effect).

In Third Embodiment, therefore, the number of additional masks used for mix-loading of the MONOS transistor can be made smaller than that of the related technology due to the above-mentioned first mask reduction effect and the second mask reduction effect. More specifically, five additional masks MSK1 to MSK5 become necessary for mix-loading of the MONOS transistor (add-on circuit) with the base product (main circuit) in the related technology, while mix-loading of the MONOS transistor (add-on circuit) with the base product (main circuit) requires only three additional masks MSK1 to MSK3 in Third embodiment. In the semiconductor device of Third Embodiment, therefore, it is possible to mix-load the MONOS transistor as an add-on circuit to be added to a main circuit while minimizing a change in the manufacturing process of the base product having therein the main circuit. As a result, a manufacturing cost of the semiconductor device can be reduced.

<Manufacturing Method of Semiconductor Device in Third Embodiment> (Monos First)

A manufacturing method of the semiconductor device of Third Embodiment will next be described referring to drawings. The manufacturing method of the semiconductor device of Third Embodiment is called "MONOS FIRST".

Figure 51:
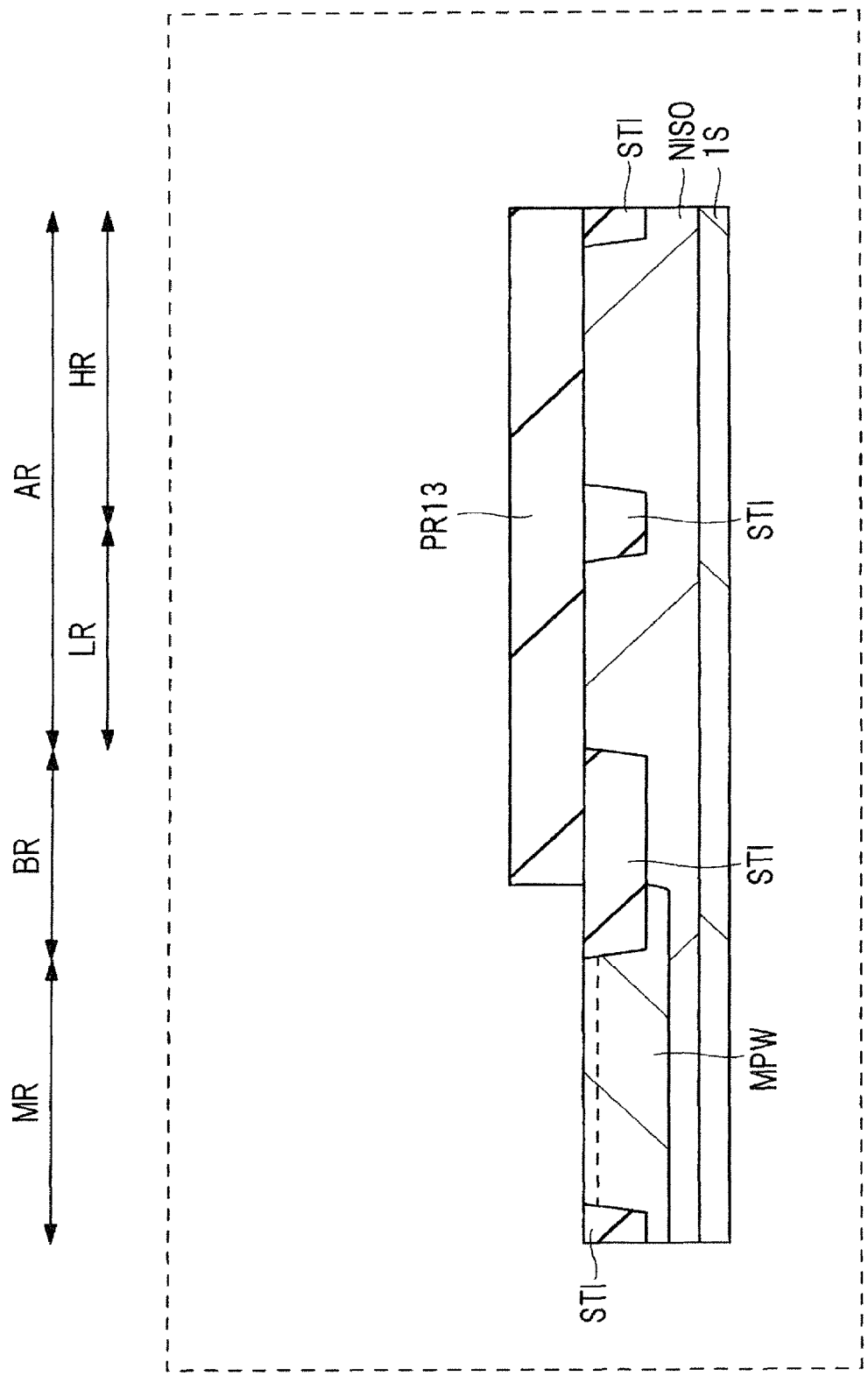
FIG. 51 is a cross-sectional view showing a manufacturing step of the semiconductor device of Third Embodiment.

As shown in FIG. 51, provided is a semiconductor substrate 1S made of a silicon single crystal implanted with a p type impurity such as boron (B). The semiconductor substrate 1S at this time is in the form of a semiconductor wafer having a substantially disk shape. An element isolation region STI is formed in the semiconductor substrate 1S. The element isolation region STI is provided in order to prevent interference between elements. Then, a well isolation layer NISO comprised of an n type semiconductor region is formed in the semiconductor substrate 1S by implanting an n type impurity such as phosphorus (P) or arsenic (As) into the semiconductor substrate 1S.

Next, a resist film PR13 is formed on the semiconductor substrate 1S by application. The resist film PR13 is then patterned by photolithography. Patterning of the resist film PR13 is performed to expose the memory formation region MR and cover the main circuit formation region AR. Then, by ion implantation using the patterned resist film PR13 as a mask, a p well MPW is formed in the semiconductor substrate 1S of the memory formation region MR. Further, a conductivity type impurity is implanted into a channel region in the p well MPW by ion implantation in order to control the threshold voltage of the MONOS transistor in the memory formation region MR.

Figure 52:
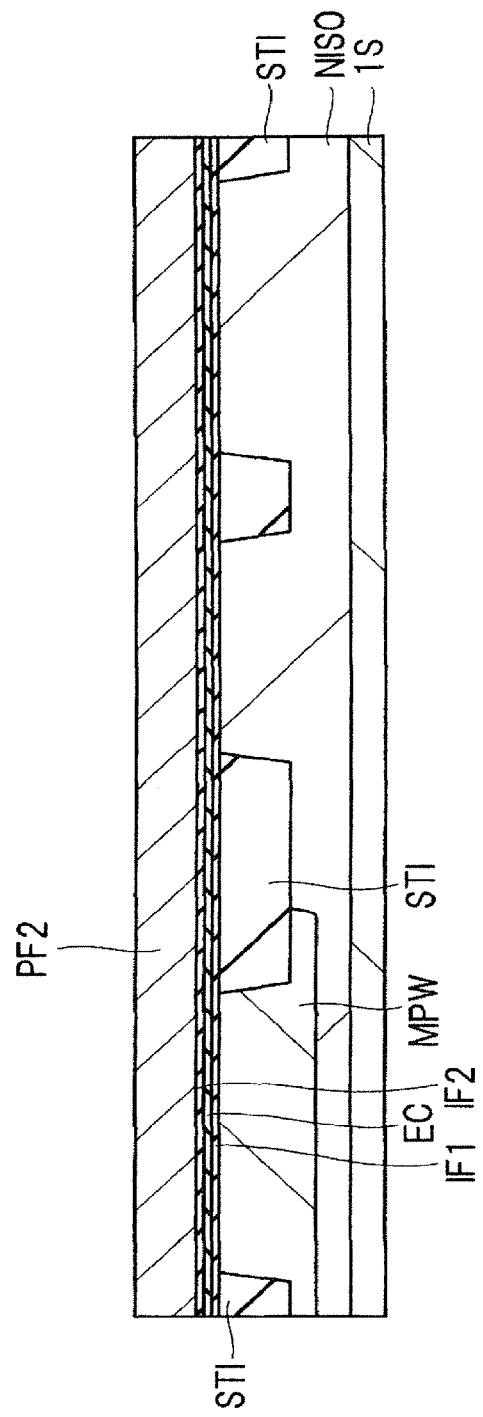
FIG. 52 is a cross-sectional view showing a manufacturing step of the semiconductor device following that of FIG. 51.

Next, as shown in FIG. 52, after removal of the patterned resist film PR13, an insulating film IF1 is formed on the semiconductor substrate 1S, followed by the formation of a charge storage film EC on the insulating film IF1. Then, an insulating film IF2 is formed on the charge storage film EC and then, a polysilicon film PF2 is formed on the insulating film IF2. The insulating film IF1 is made of, for example, a silicon oxide film and for the formation of it, ISSG oxidation capable of forming a dense silicon oxide film with a good film quality can be used. The insulating film IF1 has a thickness of about 4 nm. The charge storage film EC is made of a silicon nitride film and can be formed, for example, by CVD. The charge storage film EC has a thickness of about 10 nm. The insulating film IF2 is made of a silicon oxide film and for the formation of it, HTO (high temperature oxide) capable of forming a dense silicon oxide film with a good film quality can be used. The insulating film IF2 has a thickness of about 5 nm. The polysilicon film PF2 can be formed using, for example, CVD. In such a manner, a stacked insulating film (ONO film) which is dense, is excellent in insulation resistance tolerance, and has a good film quality can be formed.

Next, as shown in FIG. 53, a resist film PR14 is formed on the polysilicon film PF2 by application. The resist film PR14 is then patterned by photolithography. Patterning of the resist film PR14 is performed so as to cover the entirety of the memory formation region MR and expose the main circuit formation region AR. Then, by etching with the patterned resist film PR14 as a mask, the polysilicon film PF2 and the stacked insulating film (ONO film) are removed from the main circuit formation region AR.

In this step, the polysilicon film PF2 and the stacked insulating film remain in the entire memory formation region MR and processing for the formation of a gate electrode of the MONOS transistor is not performed in the memory formation region MR, because when a gate electrode of the MONOS transistor is formed in the memory formation region MR in this step, the MONOS transistor inevitably has a bird's beak due to the step of forming a gate insulating film in the main circuit formation region AR to be performed later. In Third Embodiment, therefore, to prevent the MONOS transistor from having a bird's beak, the polysilicon film PF2 and the stacked insulating film are left in the entirety of the memory formation region MR in this step.

Figure 54:
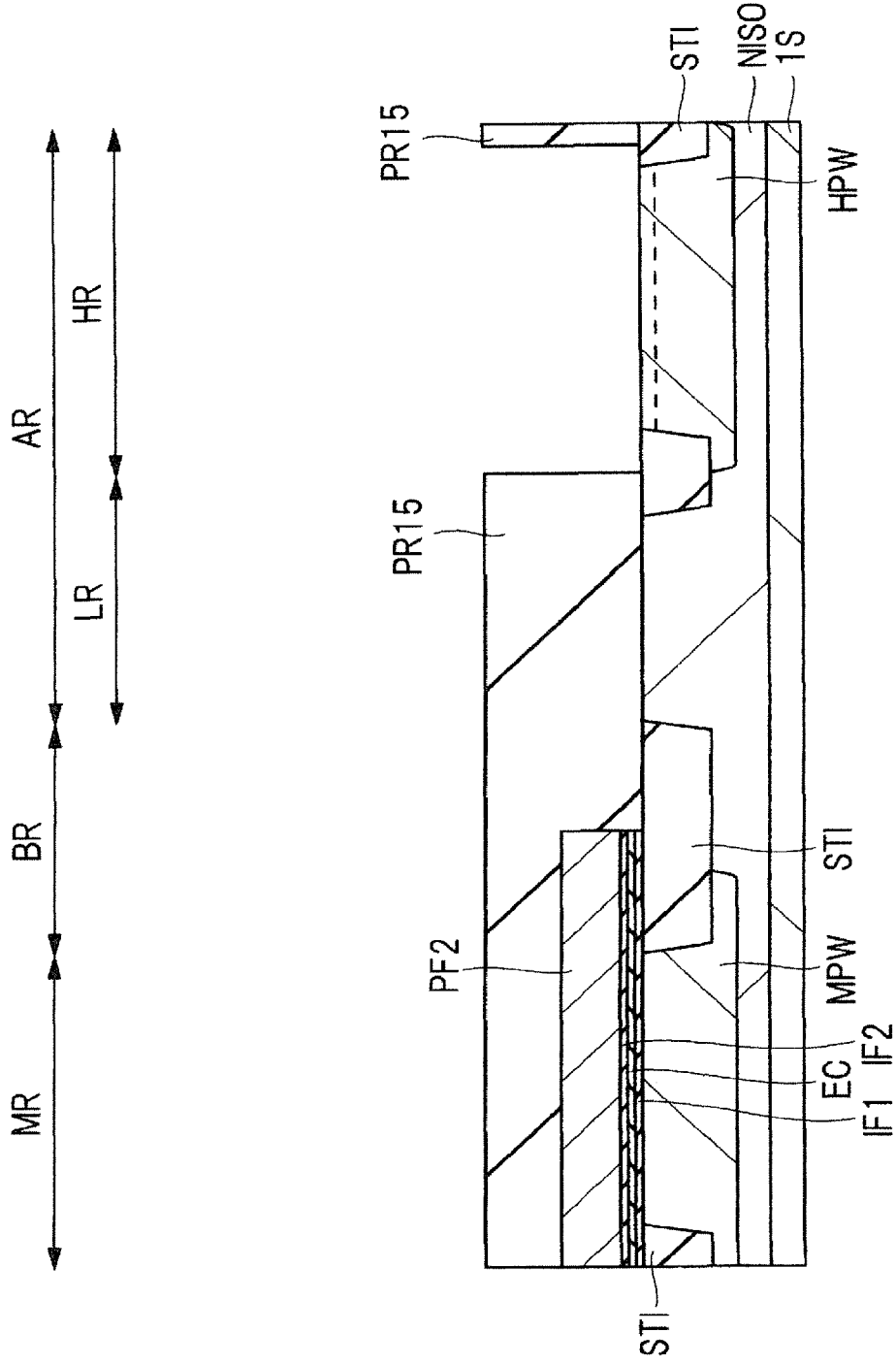
FIG. 54 is a cross-sectional view showing a manufacturing step of the semiconductor device following that of FIG. 53.
Figure 55:
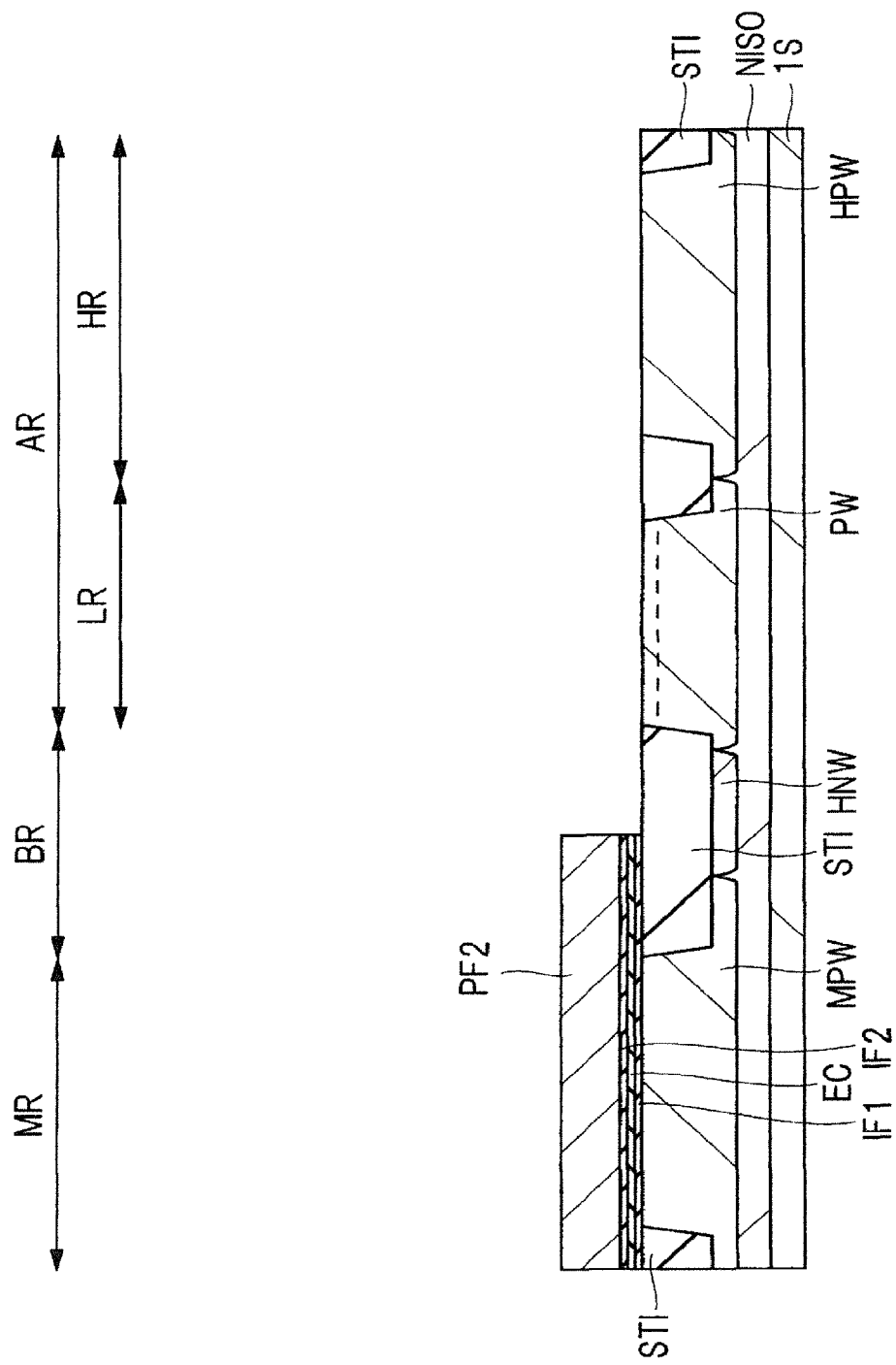
FIG. 55 is a cross-sectional view showing a manufacturing step of the semiconductor device following that of FIG. 54.

Next, as shown in FIG. 54, after removal of the patterned resist film PR14, a resist film PR15 is formed on the polysilicon film PF2 and the semiconductor substrate 1S by application. The resist film PR15 is then patterned by photolithography. Patterning of the resist film PR15 is performed so as to cover the memory formation region MR and the low breakdown voltage MISFET formation region LR and at the same time, expose the high breakdown voltage MISFET formation region HR. Next, by ion implantation with the patterned resist film PR15 as a mask, a p well HPW is formed in the semiconductor substrate 1S of the high breakdown voltage MISFET formation region HR. Although not described in detail, as shown in FIG. 55, a p well PW is formed in the semiconductor substrate 1S of the low breakdown voltage MISFET formation region LR and an isolation layer HNW is formed below the element isolation region STI formed in the boundary region BR by photolithography and ion implantation.

Figure 56:
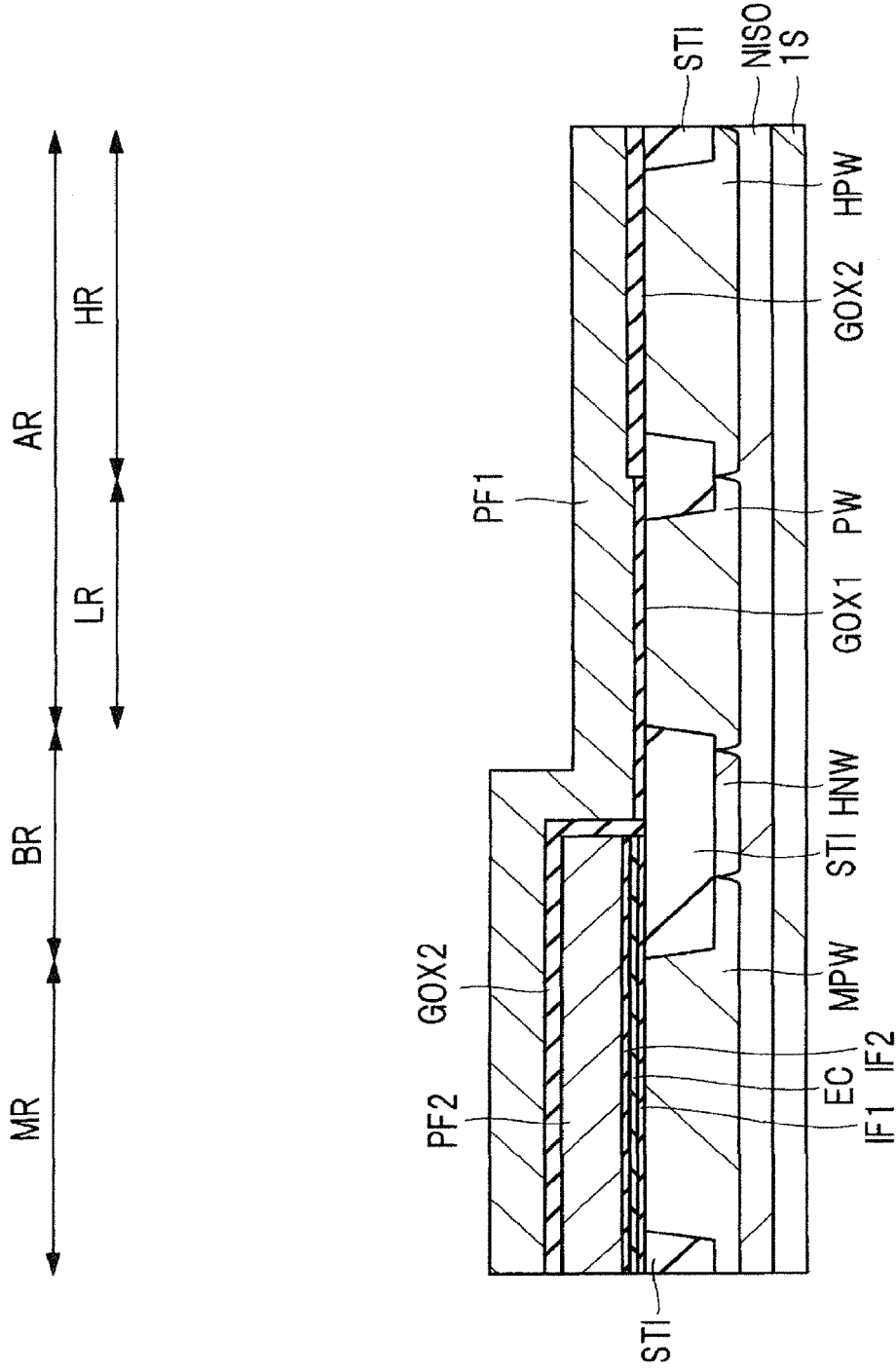
FIG. 56 is a cross-sectional view showing a manufacturing step of the semiconductor device following that of FIG. 55.

Next, as shown in FIG. 56, after washing the surface of the semiconductor substrate 1S with hydrofluoric acid or the like, a gate insulating film GOX1 is formed on the low breakdown voltage MISFET formation region LR of the semiconductor substrate 1S and a gate insulating film GOX2 is formed on the high breakdown voltage MISFET formation region HR of the semiconductor substrate 1S. The gate insulating film GOX1 and the gate insulating film GOX2 are each made of, for example, a silicon oxide film and the thickness of the gate insulating film GOX1 is smaller than that of the gate insulating film GOX2. In this step, the gate insulating film GOX2 is formed on the polysilicon film PF2 in the memory formation region MR. Then, a polysilicon film PF1 is formed on the gate insulating film GOX1 and the gate insulating film GOX2.

Figure 57:
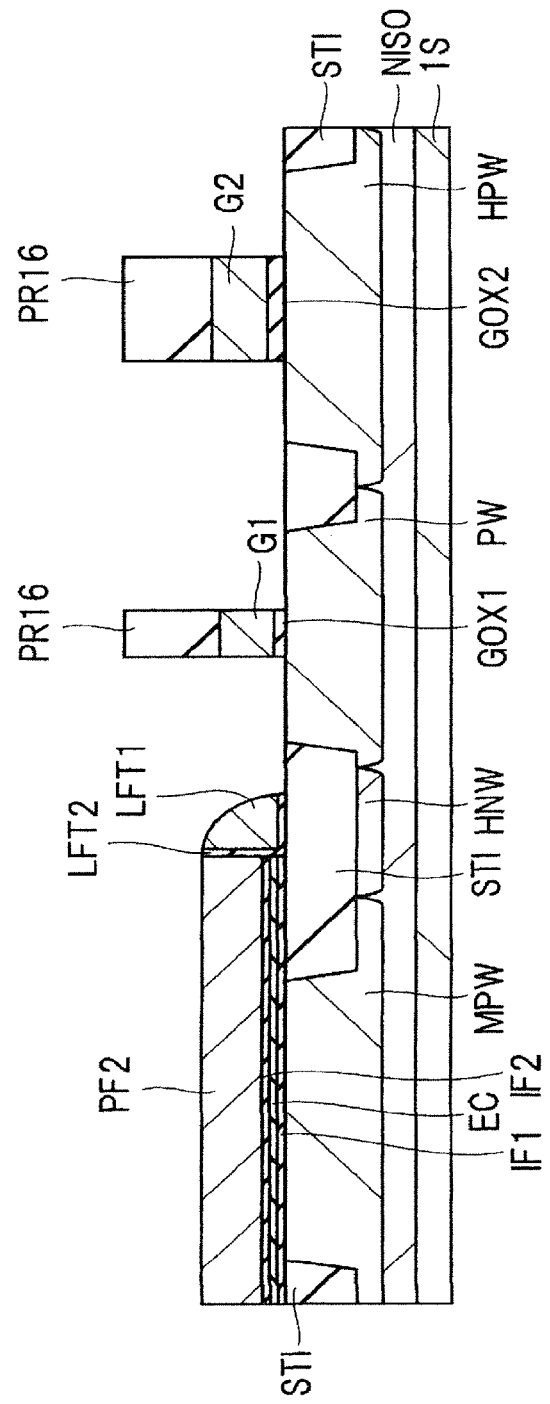
FIG. 57 is a cross-sectional view showing a manufacturing step of the semiconductor device following that of FIG. 56.

Next as shown in FIG. 57, after formation of a resist film PR16 on the polysilicon film PF1 by application, the resist film PR16 is patterned using photolithography. Patterning of the resist film PR16 is performed so as to cover the gate electrode formation region of the main circuit formation region AR and exposes the memory formation region MR. By patterning the polysilicon film PF1 by etching with the patterned resist film PR16 as a mask, a gate electrode G1 is formed in the low breakdown voltage MISFET formation region LR and a gate electrode G2 is formed in the high breakdown voltage MISFET formation region HR. At this time, as shown in FIG. 57, a residue portion LFT2 and a residue portion LFT1 in sidewall form are formed on the side wall of the polysilicon film PF2 in the boundary region BR.

Figure 58:
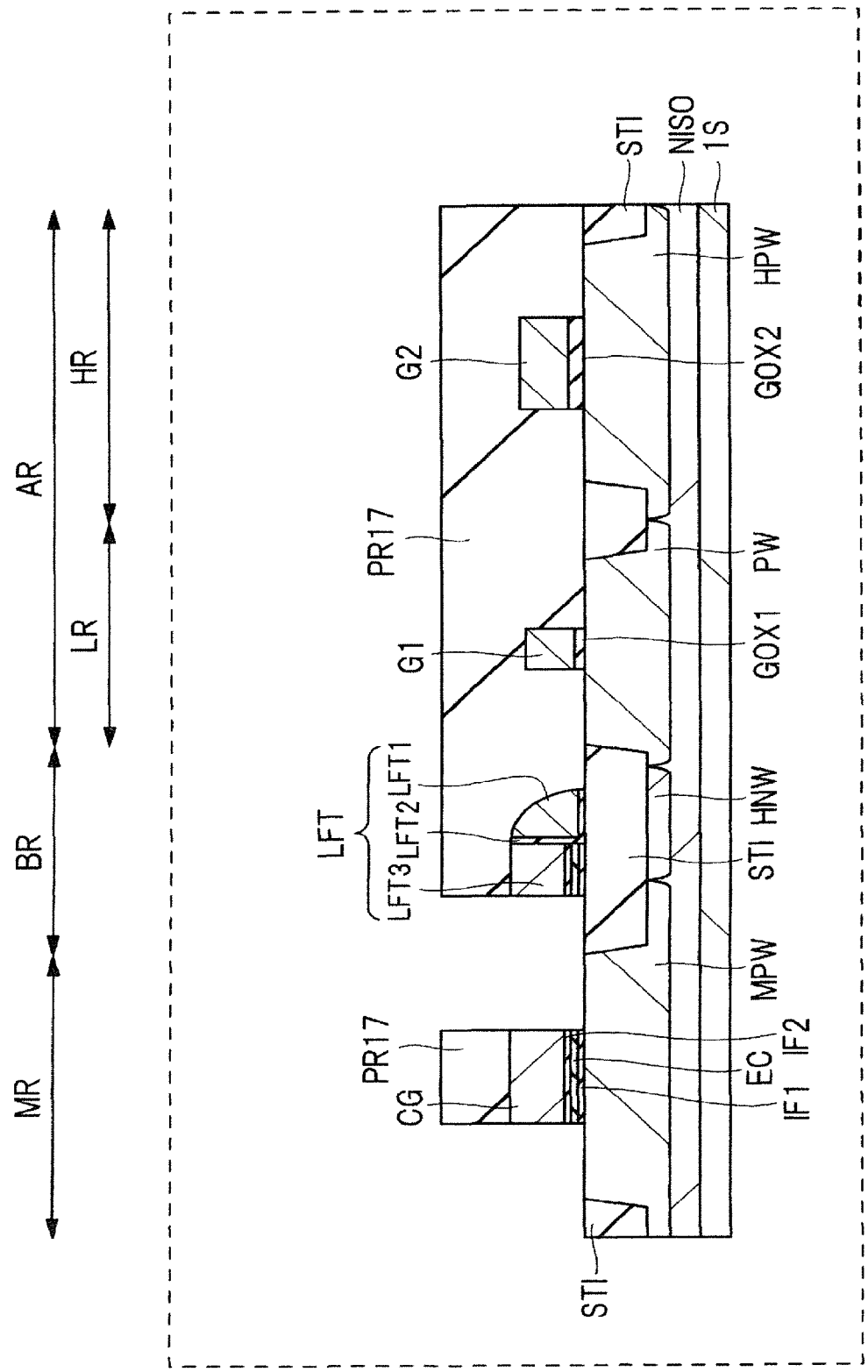
FIG. 58 is a cross-sectional view showing a manufacturing step of the semiconductor device following that of FIG. 57.

Next, as shown in FIG. 58, after removal of the patterned resist film PR16, a resist film PR17 extending from the memory formation region MR to the main circuit formation region AR is formed by application. More specifically, the resist film PR17 that covers the gate electrode G1 and the gate electrode G2 formed in the main circuit formation region AR and extends over the polysilicon film PF2 in the memory formation region MR is formed by application. Then, the resist film PR17 is patterned by photolithography. Patterning of the resist film PR17 is performed so as to cover the main circuit formation region AR and at the same time, cover the gate electrode formation region of the memory formation region MR. By etching with the patterned resist film PR17 as a mask, the polysilicon film PF2 is processed and a gate electrode CG is formed in the memory formation region MR. Then, the exposed insulating film IF2, charge storage film EC, and insulating film IF1 are removed, for example, by dry etching.

In the boundary region BR, a residue pattern LFT having a structure in which the residue portion LFT3 has, on the side wall thereof, the residue portion LFT1 via the residue portion LFT2 remains.

Figure 59:
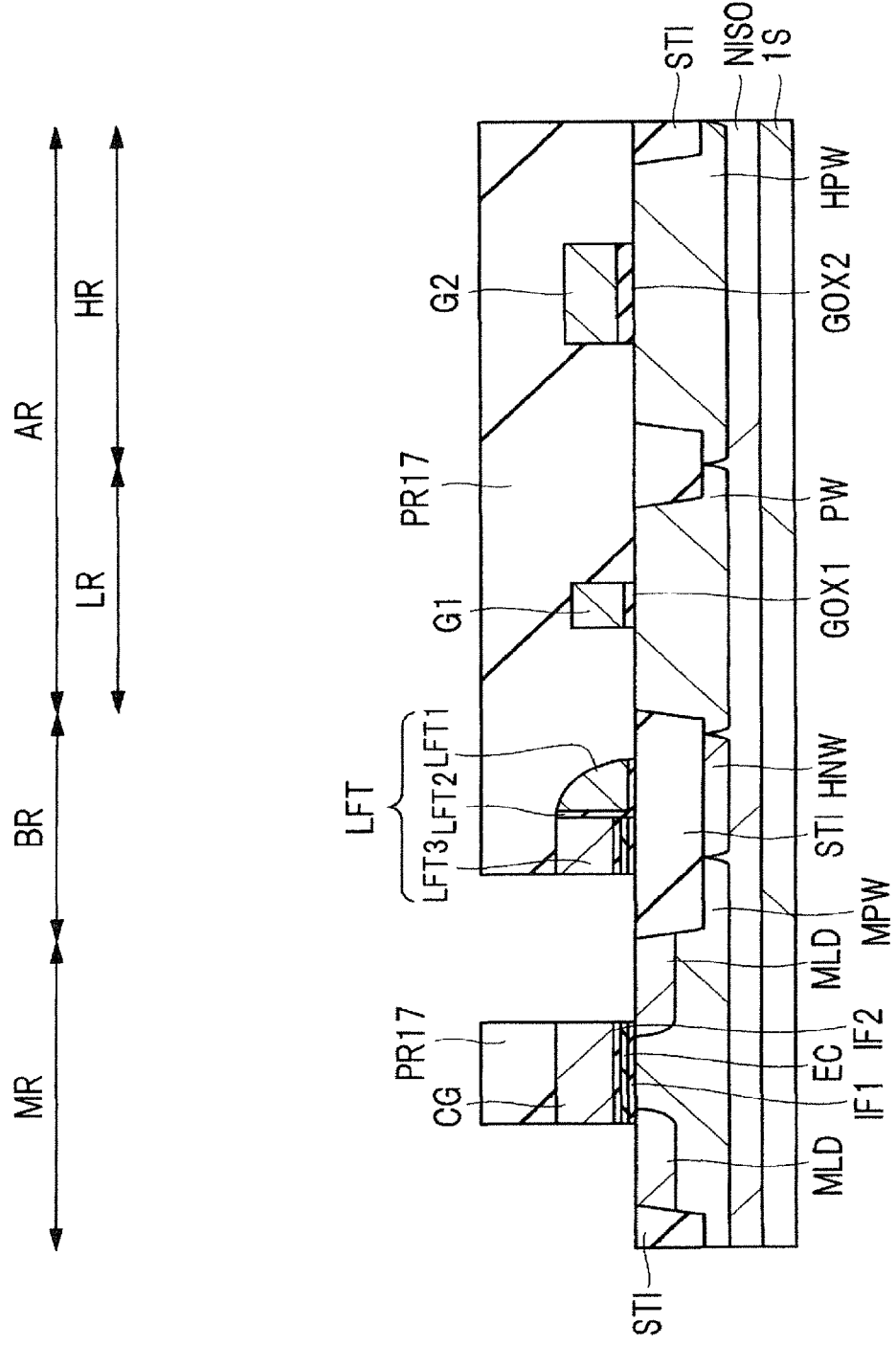
FIG. 59 is a cross-sectional view showing a manufacturing step of the semiconductor device following that of FIG. 58.

Next, as shown in FIG. 59, an $n^-$ type semiconductor region MLD is formed in the semiconductor substrate 1S of the memory formation region MR in alignment with the gate electrode CG by ion implantation using a mask made of the patterned resist film PR17 without changing it to another one. This means that in Third Embodiment, a mask is shared between processing for the formation of the gate electrode CG of the MONOS transistor and ion implantation for the formation of the $n^-$ type semiconductor region MLD in alignment with the gate electrode CG of the MONOS transistor. As a result, in Third Embodiment, the number of additional masks used for mix-loading of the MONOS transistor can be reduced.

Figure 60:
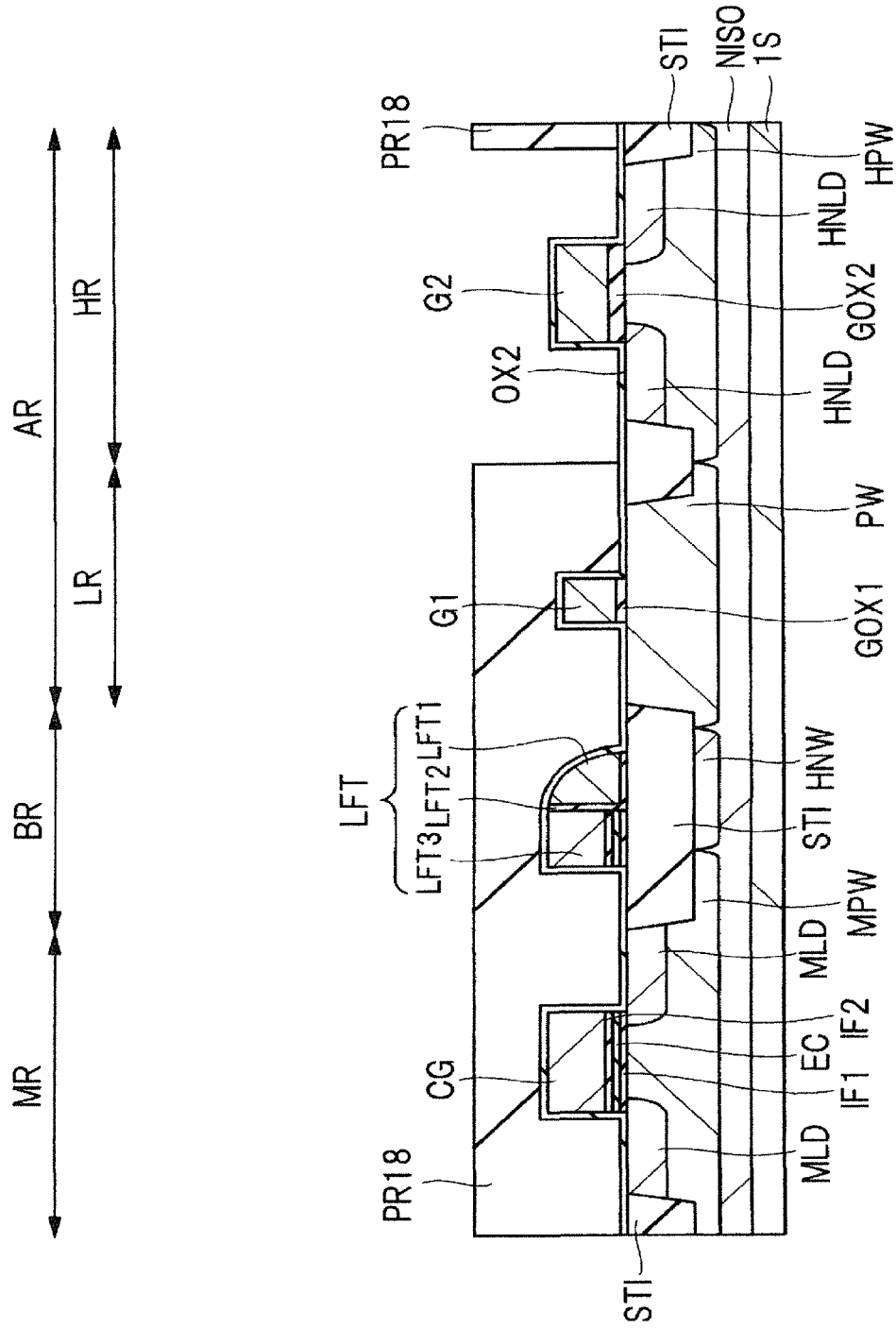
FIG. 60 is a cross-sectional view showing a manufacturing step of the semiconductor device following that of FIG. 59.

Next, as shown in FIG. 60, after removal of the patterned resist film PR17, a silicon oxide film OX2 is formed on the entire main surface of the semiconductor substrate 1S and a resist film PR18 is formed on the resulting silicon oxide film OX2 by application. The resist film PR18 is then patterned by photolithography. Patterning of the resist film PR18 is performed so as to cover the memory formation region MR, the boundary region BR, and the low breakdown voltage MISFET formation region LR, while exposing the high breakdown voltage MISFET formation region HR. Then, by ion implantation with the patterned resist film PR18 as a mask, an $n^-$ type semiconductor region HNLD is formed in the semiconductor substrate 1S of the high breakdown voltage MISFET formation region HR in alignment with the gate electrode G2.

Figure 61:
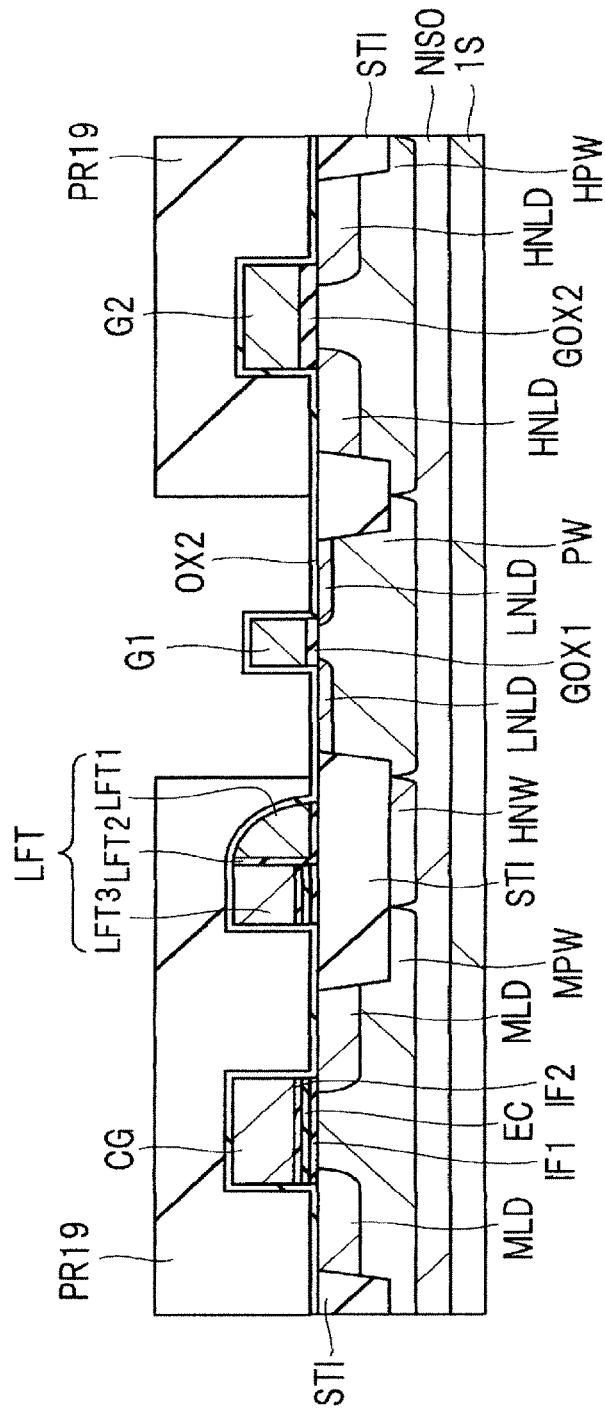
FIG. 61 is a cross-sectional view showing a manufacturing step of the semiconductor device following that of FIG. 60.

Next, as shown in FIG. 61, after removal of the patterned resist film PR18, a resist film PR19 is formed on the semiconductor substrate 1S by application. The resist film PR19 is then patterned by photolithography. Patterning of the resist film PR19 is performed so as to cover the memory formation region MR, the boundary region BR, and the high breakdown voltage MISFET formation region HR, while exposing the low breakdown voltage MISFET formation region LR. Then, by ion implantation with the patterned resist film PR19 as a mask, an $n^-$ type semiconductor region LNLD is formed in the semiconductor substrate 1S of the low breakdown voltage MISFET formation region LR in alignment with the gate electrode G1.

Figure 62:
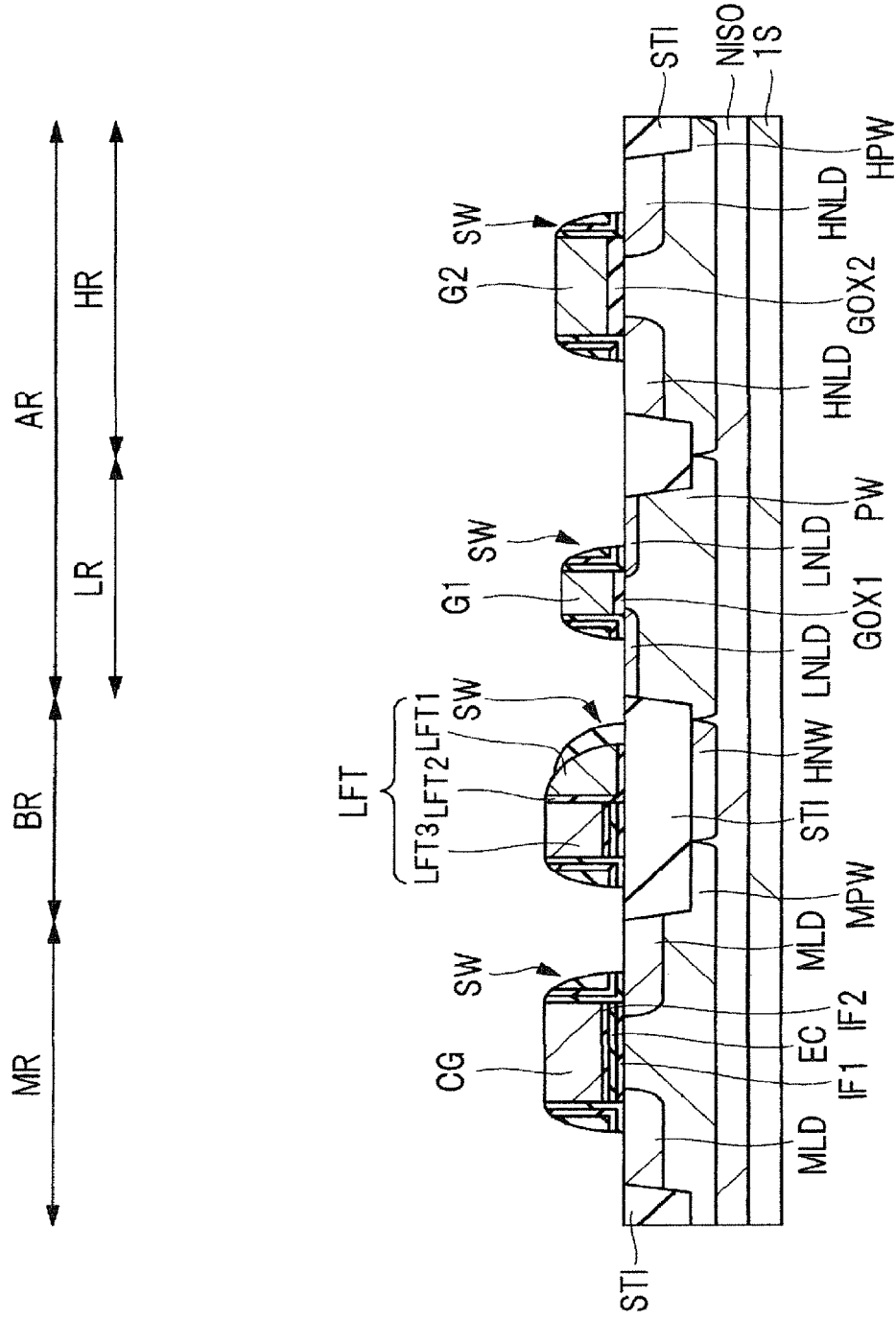
FIG. 62 is a cross-sectional view showing a manufacturing step of the semiconductor device following that of FIG. 61.

Next, after removal of the patterned resist film PR19, a stacked film of a silicon oxide film, a silicon nitride film, and a silicon oxide film is formed on the semiconductor substrate 1S as shown in FIG. 62. The silicon oxide film and the silicon nitride film can each be formed, for example, by CVD. The stacked film is then anisotropically etched to form a side wall SW. More specifically, a side wall SW is formed on both side walls of the gate electrode CG (stacked structure: gate electrode CG+ONO film) in the memory formation region MR. On the other hand, in the low breakdown voltage MISFET formation region LR of the main circuit formation region AR, a side wall SW is formed on both side walls of the gate electrode G1 and in the high breakdown voltage MISFET formation region HR of the main circuit formation region AR, a side wall SW is formed on both side walls of the gate electrode G2. Also in the boundary region BR, a side wall SW is formed on the side wall of the residue pattern LFT.

Figure 63:
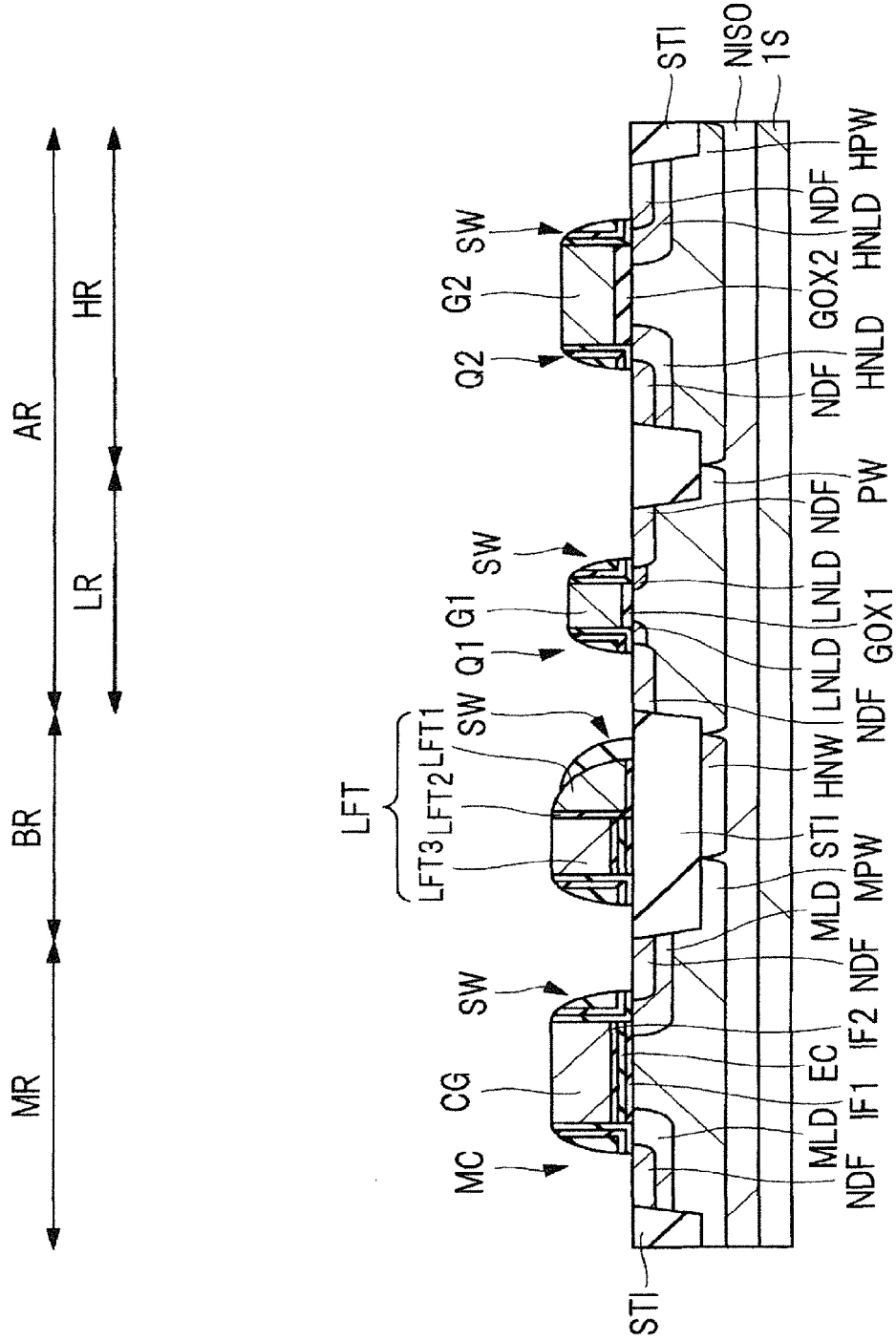
FIG. 63 is a cross-sectional view showing a manufacturing step of the semiconductor device following that of FIG. 62.

Next, as shown in FIG. 63, an $n^+$ type semiconductor region NDF is formed in the memory formation region MR in alignment with the side wall SW by photolithography and ion implantation. The $n^+$ type semiconductor region NDF is a semiconductor region implanted with an n type impurity such as phosphorus or arsenic. The source or drain region of the MONOS transistor is formed from the $n^+$ type semiconductor region NDF and the $n^-$ type semiconductor region MLD. The source region and the drain region of the MONOS transistor can have an LDD structure by forming each of the source region and the drain region of the MONOS transistor from the $n^+$ type semiconductor region NDF and the $n^-$ type semiconductor region MLD.

By a similar ion implantation step, an $n^+$ type semiconductor region NDF is formed also in the low breakdown voltage MISFET formation region LR of the main circuit formation region AR in alignment with the side wall SW. The source or drain region of the low breakdown voltage MISFET is formed from the $n^+$ type semiconductor region NDF and the $n^-$ type semiconductor region LNLD. Thus, also in the low breakdown voltage MISFET, the source region and the drain region of the low breakdown voltage MISFET can have an LDD structure by forming each of the source region and the drain region from the $n^+$ type semiconductor region NDF and the $n^-$ type semiconductor region LNLD.

By a similar ion implantation step, an $n^+$ type semiconductor region NDF is formed also in the high breakdown voltage MISFET formation region HR of the main circuit formation region AR in alignment with the side wall SW. The source or drain region of the high breakdown voltage MISFET is formed from the $n^+$ type semiconductor region NDF and the $n^-$ type semiconductor region HNLD. Thus, also in the high breakdown voltage MISFET, the source region and the drain region of the high breakdown voltage MISFET can have an LDD structure by forming each of the source region and the drain region from the $n^+$ type semiconductor region NDF and the $n^-$ type semiconductor region HNLD.

Thus, in Third Embodiment, the $n^+$ type semiconductor region NDF of the MONOS transistor, the $n^+$ type semiconductor region NDF of the low breakdown voltage MISFET, and the $n^+$ type semiconductor region NDF of the high breakdown voltage MISFET are formed simultaneously. This means that in Third Embodiment, the $n^+$ type semiconductor region NDF of the MONOS transistor, the $n^+$ type semiconductor region NDF of the low breakdown voltage MISFET, and the $n^+$ type semiconductor region NDF of the high breakdown voltage MISFET are formed simultaneously by ion implantation using a common mask. As a result, in Third Embodiment, an additional mask for the formation of the $n^+$ type semiconductor region NDF of the MONOS transistor becomes unnecessary. In Third Embodiment, therefore, the number of additional masks used for mix-loading of the MONOS transistor can be reduced.

Steps thereafter are similar to those of First Embodiment so that a description on them is omitted. The semiconductor device of Third Embodiment can be manufactured in the above-mentioned manner.

MODIFICATION EXAMPLE

A modification example will next be described. The method of manufacturing a semiconductor device of the present modification example is substantially similar to that of the semiconductor device of Third Embodiment so that a difference between them will be described mainly.

Figure 64:
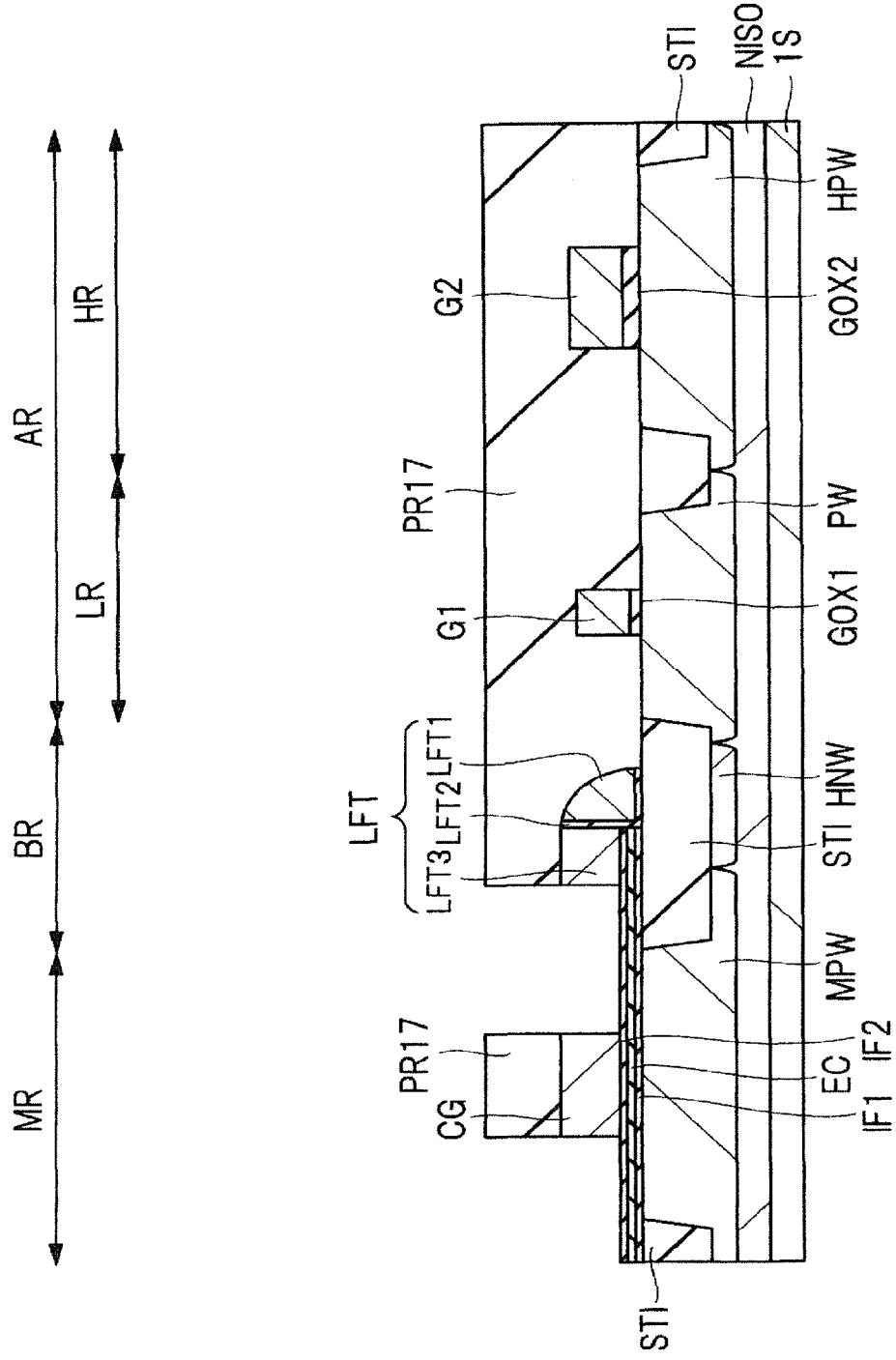
FIG. 64 is a cross-sectional view showing a manufacturing step of a semiconductor device of a modification example.

Similar to Third Embodiment, steps shown in FIGS. 51 to 57 are performed. Then, as shown in FIG. 64, after removal of the patterned resist film PR16, a resist film PR17 extending from the memory formation region MR to the main circuit formation region AR is formed by application. More specifically, the resist film PR17 covering the gate electrode G1 and the gate electrode G2 formed in the main circuit formation region AR and extending over the polysilicon film PF2 formed in the memory formation region MR is formed by application. The resist film PR17 thus obtained is then patterned by photolithography. Patterning of the resist film PR17 is performed so as to cover the main circuit formation region AR and cover the gate electrode formation region of the memory formation region MR. By etching with the patterned resist film PR17 as a mask, the polysilicon film PF2 is processed and a gate electrode CG is formed in the memory formation region MR.

Figure 65:
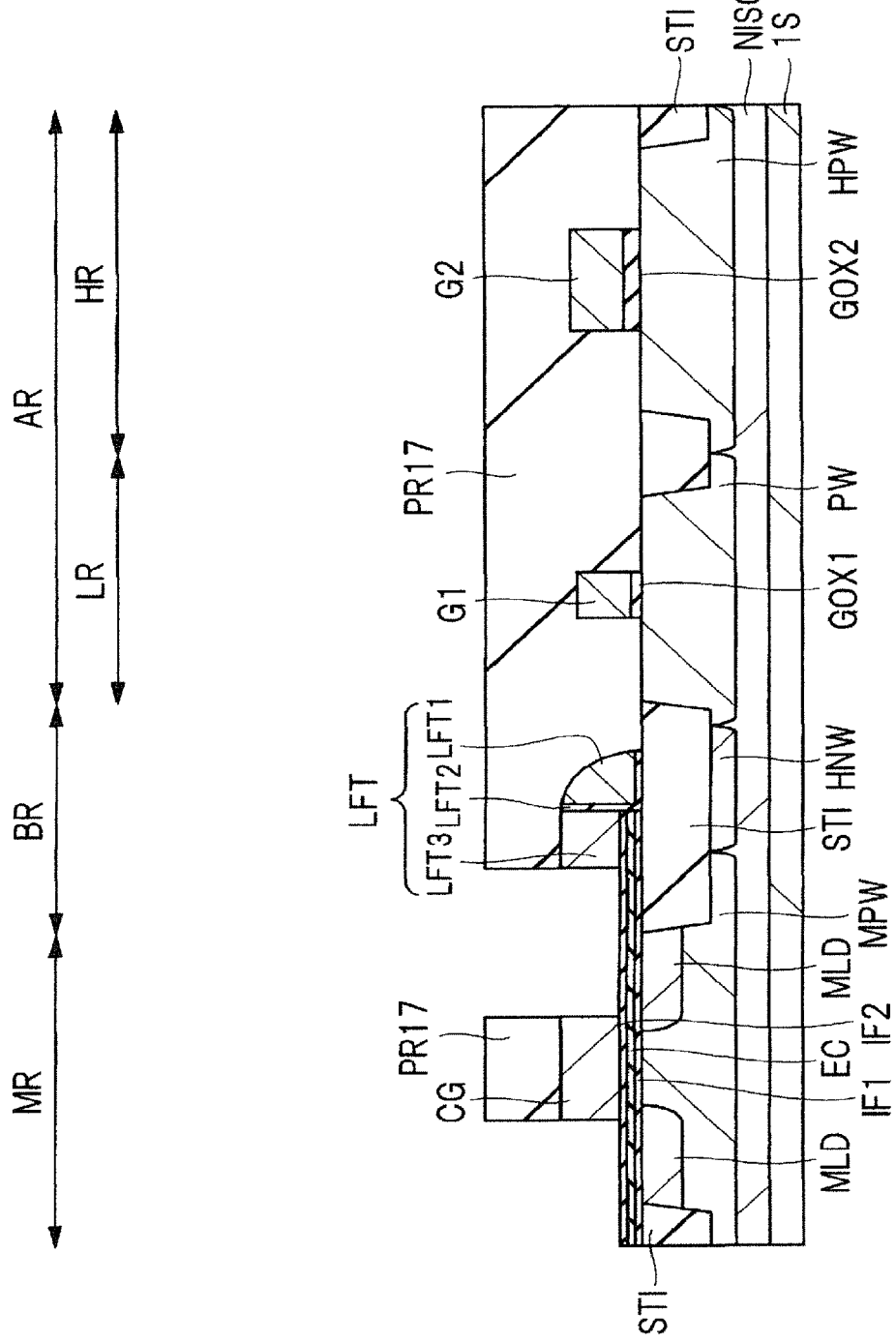
FIG. 65 is a cross-sectional view showing a manufacturing step of the semiconductor device following that of FIG. 64.

Next, as shown in FIG. 65, an $n^-$ type semiconductor region MLD is formed in the semiconductor substrate 1S of the memory formation region MR in alignment with the gate electrode CG by ion implantation using the patterned resist film PR17 as a mask without changing it to another one. Also in the present modification example, a mask is shared between processing for the formation of the gate electrode CG of the MONOS transistor and ion implantation for the formation of the $n^-$ type semiconductor region MLD in alignment with the gate electrode CG of the MONOS transistor. In the present modification example, therefore, a reduction in the number of additional masks used for mix-loading of the MONOS transistor can be achieved.

In the present modification example, as shown in FIG. 65, the $n^-$ type semiconductor region MLD is formed in the semiconductor substrate 1S via the stacked insulating film comprised of the insulating film IF1, the charge storage film EC, and the insulating film IF2 and exposed from the gate electrode CG. This means that the present modification example is characterized in that the $n^-$ type semiconductor region MLD is formed by ion implantation while leaving the stacked insulating film exposed from the gate electrode CG.

Figure 66:
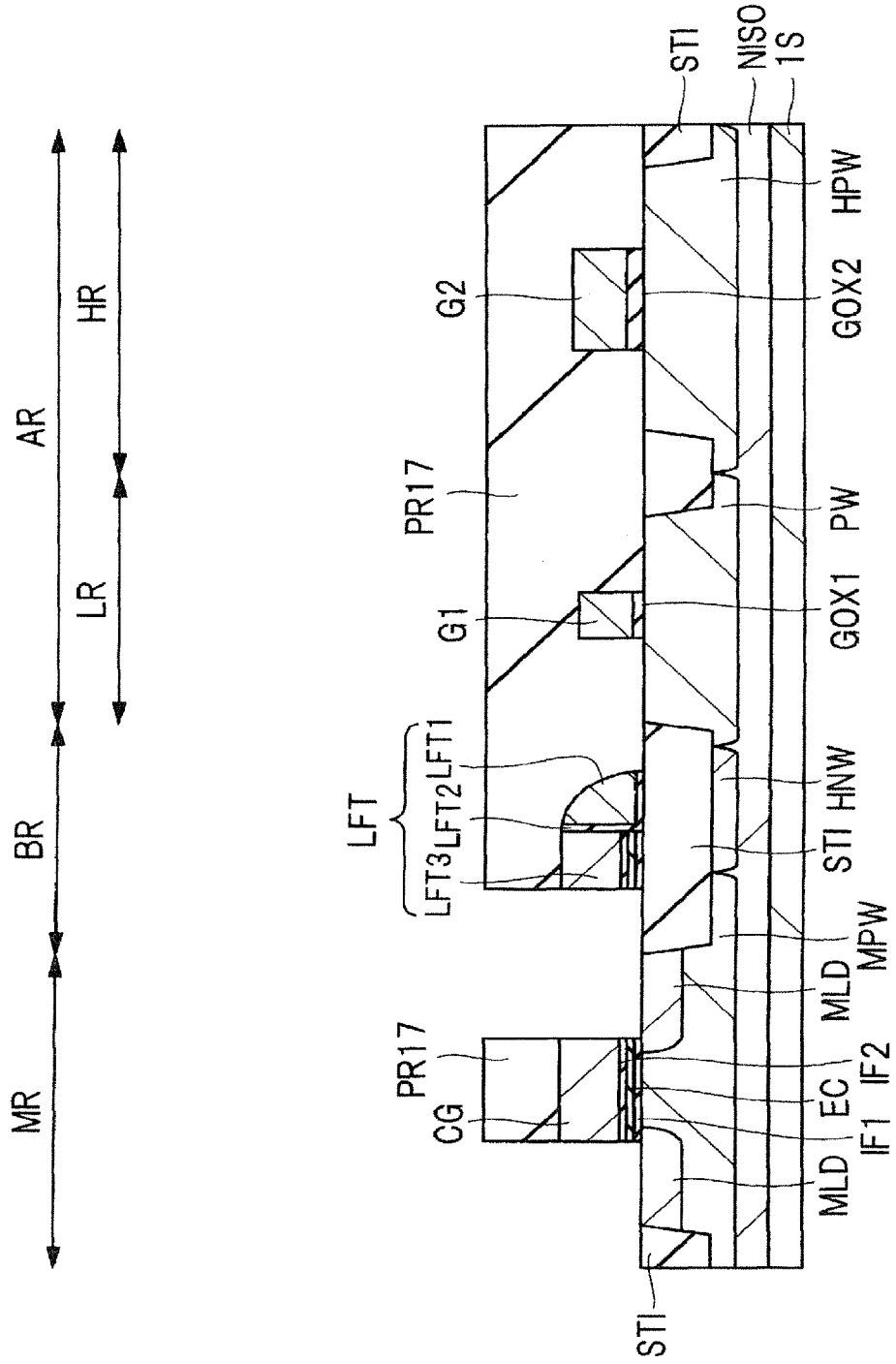
FIG. 66 is a cross-sectional view showing a manufacturing step of the semiconductor device following that of FIG. 65.

Next, as shown in FIG. 66, the exposed insulating film IF2, charge storage film EC, and insulating film IF1 are removed, for example, by dry etching. Steps thereafter are similar to those of Third Embodiment According to the manufacturing method of the semiconductor device of the present modification example, as shown in FIG. 65, the $n^-$ type semiconductor region MLD is formed via the stacked insulating film (the insulating film IF1, the charge storage film EC, and the insulating film IF2) so that the surface of the semiconductor substrate 1S can be protected from the damage during ion implantation. In other words, according to the present modification example, presence of the stacked insulating film can decrease the damage during ion implantation and at the same time, suppress contamination of the surface of the semiconductor substrate 1S due to ion implantation.

The invention made by the present inventors has been described specifically based on some embodiments. It is needless to say that the invention is not limited to or by these embodiments but can be changed variously without departing from the gist of the invention.

The above-described embodiments include the following modes.

APPENDIX 1 (MONOS FIRST)

A method of manufacturing a semiconductor device equipped with a nonvolatile memory cell formed in a first region of a semiconductor substrate and a field effect transistor formed in a second region of the semiconductor substrate; the nonvolatile memory cell having a well formed in the semiconductor substrate, a source region formed in the well, a drain region formed in the well, separated from the source region, a channel region sandwiched between the source region and the drain region, a first insulating film formed on the channel region, a charge storage film formed on the first insulating film, a second insulating film formed on the change storage film, and a first gate electrode formed on the second insulating film; and the source region and the drain region each containing a first region having a first impurity concentration and a second semiconductor region having a concentration higher than the first impurity concentration; including the steps of:

(a) forming the well in the first region by ion implantation using a first mask that exposes the first region and covers the second region;

(b) after the step (a), forming the first insulating film on the semiconductor substrate;

(c) forming the charge storage film on the first insulating film;

(d) forming the second insulating film on the charge storage film;

(e) forming a second conductor film on the second insulating film;

(f) patterning the second conductor film by using a second mask that covers the first region and exposes the second region and thereby removing the second conductor film formed in the second region;

(g) after the step (f), forming an insulating film on the second conductor film and the semiconductor substrate;

(h) forming a first conductor film on the insulating film;

(i) after the step (h), patterning the first conductor film by using a third mask that covers a second gate electrode formation region of the second region and exposes the first region to form a second gate electrode of the field effect transistor in the second region;

(j) after the step (i), patterning the second conductor film by using a fourth mask that covers a first gate electrode formation region of the first region and covers the second region to form the first gate electrode in the first region; and (k) after the step (j), forming the first semiconductor region in the semiconductor substrate by ion implantation using the fourth mask.

APPENDIX 2 (REMOVAL OF ONO FILM)

The manufacturing method of a semiconductor device according to Appendix 1, further including, between the step (j) and the step (k), the following steps:

(l) removing the second insulating film exposed from the first gate electrode, (m) after the step (l), removing the charge storage film exposed from the first gate electrode, and (n) after the step (m), removing the first insulating film exposed from the first gate electrode.

APPENDIX 3 (REMAINING OF ONO FILM)

The manufacturing method of a semiconductor device according to Appendix 1,
wherein in the step (k), the first semiconductor region is formed in the semiconductor substrate via the stacked insulating film comprised of the first insulating film, the charge storage film, and the second insulating film and exposed from the first gate electrode.

APPENDIX 4 (BOUNDARY REGION)

The manufacturing method of a semiconductor device according to Appendix 1,
wherein the first region and the second region have therebetween a boundary region.

APPENDIX 5 (RESIDUE PATTERN)

The manufacturing method of a semiconductor device according to Appendix 4,
wherein after the step (k), the boundary region has therein a residue pattern.

What is claimed is:
1. A method of manufacturing a semiconductor device comprising:
a semiconductor substrate having a main surface, the main surface including a first region and a second region in a plan view,
a nonvolatile memory cell formed in the first region; and
a field effect transistor formed in the second region,
the nonvolatile memory cell including:
a well formed in the semiconductor substrate;
a source region formed in the well;
a drain region formed in the well, separated from the source region;
a channel region sandwiched between the source region and the drain region;
a first insulating film formed over the channel region;
a charge storage film formed over the first insulating film;
a second insulating film formed over the change storage film; and
a first gate electrode formed over the second insulating film,
the source region and the drain region each including:
a first semiconductor region having a first impurity concentration,
the method comprising the steps of:
(a) forming an insulating film over the semiconductor substrate;
(b) forming a first conductor film over the insulating film;
(c) removing the first conductor film from the first region by using a first mask that exposes the first region and covers the second region;
(d) after the step (c), forming the first insulating film over the semiconductor substrate and the first conductor film;
(e) forming the charge storage film over the first insulating film;

(f) forming the second insulating film over the charge storage film;

(g) forming a second conductor film over the second insulating film;

(h) patterning the second conductor film by using a second mask that covers a first gate electrode formation portion of the first region and exposes the second region and thereby forming the first gate electrode in the first region;

(i) after the step (h), forming the first semiconductor region in the semiconductor substrate by ion implantation at both sides of the first gate electrode; and (j) after the step (i), patterning the first conductor film by using a third mask that covers a second gate electrode formation region of the second region and covers the first region and thereby forming a second gate electrode of the field effect transistor in the second region, the method further comprising, between the step (h) and the step (i), the steps of:

(k) removing the second mask;

(l) after the step (k), removing the second insulating film exposed from the first gate electrode;

(m) after the step (l), oxidizing an exposed surface of the first gate electrode; and (n) after the step (m), removing the charge storage film exposed from the first gate electrode.

2. The method of manufacturing a semiconductor device according to claim 1,
wherein the step (1) and the step (n) are performed using wet etching.

3. The method of manufacturing a semiconductor device according to claim 2,
wherein the charge storage film is a silicon nitride film, and
wherein the step (n) is performed using hot phosphoric acid.

4. The method of manufacturing a semiconductor device according to claim 1, further comprising, between the step (n) and the step (i), the step of:
(o) removing the first insulating film exposed from the first gate electrode by wet etching.

5. The method of manufacturing a semiconductor device according to claim 1,
wherein in the step (i), the first semiconductor region is formed in the semiconductor substrate via a stacked insulating film having the first insulating film, the charge storage film, and the second insulating film and exposed from the first gate electrode.

6. The method of manufacturing a semiconductor device according to claim 1,
wherein the second conductor film is a polysilicon film,
wherein in the step (m), a silicon oxide film is formed over the exposed surface of the first gate electrode, and
wherein the silicon oxide film formed over the exposed surface of the first gate electrode functions as an offset spacer when the step (i) is performed.

7. The method of manufacturing a semiconductor device according to claim 1,
wherein the first region and the second region have a boundary region therebetween.

8. The method of manufacturing a semiconductor device according to claim 7,
wherein after the step (j), the boundary region has a residue pattern therein.

9. The method of manufacturing a semiconductor device according to claim 8, wherein the residue pattern has a first residue portion which is a residue of the first conductor film, a second residue portion which is a residue of a stacked insulating film having the first insulating film, the charge storage film, and the second insulating film, and a third residue portion which is a residue of the second conductor film, and
wherein the first residue portion has, on a side wall thereof, the third residue portion in sidewall form via the second residue portion.

10. The method of manufacturing a semiconductor device according to claim 9,
wherein the residue pattern has a height not greater than the height of the second gate electrode of the field effect transistor.

11. The method of manufacturing a semiconductor device according to claim 1,
wherein the nonvolatile memory cell functions as an electronic fuse.

12. The method of manufacturing a semiconductor device according to claim 1,
wherein the nonvolatile memory cell functions as a memory portion for storing trimming information of the semiconductor device.

13. The method of manufacturing a semiconductor device according to claim 1,
wherein the field effect transistor is a power transistor.

14. The method of manufacturing a semiconductor device according to claim 1,
wherein the first insulating film is a silicon oxide film,
wherein the charge storage film is a silicon nitride film,
wherein the second insulating film is a silicon oxide film,
wherein the first conductor film is a polysilicon film, and
wherein the second conductor film is a polysilicon film.

15. The method of manufacturing a semiconductor device according to claim 1, further comprising, between the step (c) and the step (d), the step of:
(p) forming the well in the first region by ion implantation.

16. The method of manufacturing a semiconductor device according to claim 1, further comprising, after the step (j), the step of:
(q) forming a second semiconductor region having a concentration higher than the first impurity concentration in the semiconductor substrate by ion implantation at both sides of the first gate electrode and the second gate electrode.

17. A method of manufacturing a semiconductor device comprising:
a semiconductor substrate having a main surface, the main surface including a first region and a second region in a plan view,
a nonvolatile memory cell formed in the first region; and
a field effect transistor formed in the second region,
the nonvolatile memory cell including:
a well formed in the semiconductor substrate;
a source region formed in the well;
a drain region formed in the well, separated from the source region;
a channel region sandwiched between the source region and the drain region;
a first insulating film formed over the channel region;
a charge storage film formed over the first insulating film;
a second insulating film formed over the change storage film; and
a first gate electrode formed over the second insulating film, the source region and the drain region each including:

a first semiconductor region having a first impurity concentration, the method comprising the steps of:

(a) forming an insulating film over the semiconductor substrate;

(b) forming a first conductor film over the insulating film;

(c) removing the first conductor film from the first region by using a first mask that exposes the first region and covers the second region;

(d) after the step (c), forming the first insulating film over the semiconductor substrate and the first conductor film;

(e) forming the charge storage film over the first insulating film;

(f) forming the second insulating film over the charge storage film;

(g) forming a second conductor film over the second insulating film;

(h) patterning the second conductor film by using a second mask that covers a first gate electrode formation portion of the first region and exposes the second region and thereby forming the first gate electrode in the first region;

(i) after the step (h), forming the first semiconductor region in the semiconductor substrate by ion implantation at both sides of the first gate electrode; and (j) after the step (i), patterning the first conductor film by using a third mask that covers a second gate electrode formation region of the second region and covers the first region and thereby forming a second gate electrode of the field effect transistor in the second region, wherein the first region and the second region have a boundary region therebetween, wherein after the step (j), the boundary region has a residue pattern therein, wherein the residue pattern has a first residue portion which is a residue of the first conductor film, a second residue portion which is a residue of a stacked insulating film having the first insulating film, the charge storage film, and the second insulating film, and a third residue portion which is a residue of the second conductor film, wherein the first residue portion has, on a side wall thereof, the third residue portion in sidewall form via the second residue portion and wherein the residue pattern has a height not greater than the height of the second gate electrode of the field effect transistor.

* * * * *